(12) United States Patent  (10) Patent No.: US 7,412,560 B2
Smith et al.  (45) Date of Patent: Aug. 12, 2008

(54) NON-VOLATILE MEMORY AND METHOD WITH MULTI-STREAM UPDATING

(75) Inventors: Peter John Smith, Eskbank (GB); Sergey Anatolievich Gorobets, Edinburgh (GB); Alan David Bennett, Edinburgh (GB)

(73) Assignee: Sandisk Corporation, Milpitas, CA (US)

( * ) Notice: Subject to any disclaimer, the term of this patent is extended or adjusted under 35 U.S.C. 154(b) by 281 days.

(21) Appl. No.: 11/191,686

(22) Filed: Jul. 27, 2005

(65) Prior Publication Data

US 2006/0155920 A1 Jul. 13, 2006

Related U.S. Application Data

(63) Continuation-in-part of application No. 11/016,285, filed on Dec. 16, 2004, now Pat. No. 7,315,916.

(51) Int. Cl.
*G06F 12/00* (2006.01)
(52) U.S. Cl. ...................................................... 711/103
(58) Field of Classification Search ........................ None
See application file for complete search history.

(56) References Cited

U.S. PATENT DOCUMENTS

| | | | |
|---|---|---|---|
| 4,694,454 A | 9/1987 | Matsuura |
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,263,032 A | 11/1993 | Porter et al. |
| 5,270,979 A | 12/1993 | Harari et al. |
| 5,313,421 A | 5/1994 | Guterman et al. |
| 5,315,541 A | 5/1994 | Harari et al. |

(Continued)

FOREIGN PATENT DOCUMENTS

GB 2289779 A 11/1995

(Continued)

OTHER PUBLICATIONS

ISA/EPO, "Invitation to Pay Additional Fees (including Partial International Search Report)", mailed on Feb. 21, 2005 in corresponding PCT/US2004/031788, 5 pages.

(Continued)

*Primary Examiner*—Hiep T. Nguyen
(74) *Attorney, Agent, or Firm*—Davis Wright Tremaine LLP

(57) ABSTRACT

In a memory that is programmable page by page and each page having multiple sectors that are once-programmable, even if successive writes are sequential, the data recorded to an update block may be fragmented and non-sequential. Instead of recording update data to an update block, the data is being recorded in at least two interleaving streams. When a full page of data is available, it is recorded to the update block. Otherwise, it is temporarily recorded to the scratch pad block until a full page of data becomes available to be transferred to the update block. Preferably, a pipeline operation allows the recording to the update block to be set up as soon as the host write command indicates a full page could be written. If the actual write data is incomplete due to interruptions, the setup will be canceled and recording is made to the scratch pad block instead.

61 Claims, 43 Drawing Sheets

Updating Using Two Streams With Index Stored In One Stream

U.S. PATENT DOCUMENTS

| | | | |
|---|---|---|---|
| 5,343,063 A | 8/1994 | Yuan et al. |
| 5,404,485 A | 4/1995 | Ban |
| 5,475,693 A | 12/1995 | Christopherson et al. |
| 5,504,760 A | 4/1996 | Harari et al. |
| 5,532,962 A | 7/1996 | Auclair et al. |
| 5,570,315 A | 10/1996 | Tanaka et al. |
| 5,598,370 A | 1/1997 | Niijima et al. |
| 5,652,720 A | 7/1997 | Aulas et al. |
| 5,657,332 A | 8/1997 | Auclair et al. |
| 5,661,053 A | 8/1997 | Yuan |
| 5,696,929 A | 12/1997 | Hasbun et al. |
| 5,699,297 A | 12/1997 | Yamazaki et al. |
| 5,774,397 A | 6/1998 | Endoh et al. |
| 5,798,968 A | 8/1998 | Lee et al. |
| 5,835,413 A | 11/1998 | Hurter et al. |
| 5,835,927 A | 11/1998 | Sunakawa et al. |
| 5,890,192 A | 3/1999 | Lee et al. |
| 5,909,449 A | 6/1999 | So et al. |
| 5,930,167 A | 7/1999 | Lee et al. |
| 5,933,368 A | 8/1999 | Ma et al. |
| 5,937,425 A | 8/1999 | Ban |
| 5,963,473 A | 10/1999 | Norman |
| 6,046,935 A | 4/2000 | Takeuchi et al. |
| 6,049,899 A | 4/2000 | Auclair et al. |
| 6,125,435 A | 9/2000 | Estakhri et al. |
| 6,145,051 A | 11/2000 | Estakhri et al. |
| 6,151,246 A | 11/2000 | So et al. |
| 6,189,081 B1 | 2/2001 | Fujio |
| 6,199,139 B1 | 3/2001 | Katayama et al. |
| 6,222,762 B1 | 4/2001 | Guterman et al. |
| 6,307,776 B1 | 10/2001 | So et al. |
| 6,345,001 B1 | 2/2002 | Mokhlesi |
| 6,415,352 B1 | 7/2002 | Asami et al. |
| 6,426,893 B1 | 7/2002 | Conley et al. |
| 6,434,658 B1 | 8/2002 | Fukuzumi |
| 6,456,528 B1 | 9/2002 | Chen |
| 6,459,644 B2 | 10/2002 | Mizushima et al. |
| 6,522,580 B2 | 2/2003 | Chen et al. |
| 6,560,152 B1 | 5/2003 | Cernea |
| 6,567,307 B1 | 5/2003 | Estakhri |
| 6,678,785 B2 | 1/2004 | Lasser |
| 6,725,321 B1 | 4/2004 | Sinclair et al. |
| 6,725,322 B1 | 4/2004 | Shirasishi et al. |
| 6,760,255 B2 | 7/2004 | Conley et al. |
| 6,763,424 B2 | 7/2004 | Conley |
| 6,772,274 B1 | 8/2004 | Estakhri |
| 6,829,167 B2 | 12/2004 | Tu et al. |
| 6,898,662 B2 | 5/2005 | Gorobets |
| 6,925,007 B2 | 8/2005 | Harari et al. |
| 6,928,511 B2 | 8/2005 | Chiu |
| 7,076,598 B2 * | 7/2006 | Wang | 711/103 |
| 7,185,154 B2 | 2/2007 | Wong et al. |
| 7,233,336 B2 | 6/2007 | Mondal |
| 2002/0083262 A1 | 6/2002 | Fukuzumi |
| 2002/0085416 A1 | 7/2002 | Yamagami et al. |
| 2002/0099904 A1 | 7/2002 | Conley |
| 2003/0065699 A1 | 4/2003 | Burns |
| 2003/0109093 A1 | 6/2003 | Harari et al. |
| 2003/0206449 A1 | 11/2003 | Harari et al. |
| 2004/0083335 A1 | 4/2004 | Gonzalez et al. |
| 2004/0109357 A1 | 6/2004 | Cernea et al. |
| 2004/0177214 A1 | 9/2004 | Chiu |
| 2004/0255076 A1 * | 12/2004 | Oyaizu et al. | 711/103 |
| 2005/0144357 A1 | 6/2005 | Sinclair |
| 2005/0144358 A1 | 6/2005 | Conley et al. |
| 2005/0144360 A1 | 6/2005 | Bennett et al. |
| 2005/0144363 A1 | 6/2005 | Sinclair |
| 2005/0144365 A1 | 6/2005 | Gorobets et al. |
| 2005/0169259 A1 | 8/2005 | Su |
| 2005/0235098 A1 | 10/2005 | Tamura et al. |
| 2006/0133141 A1 | 6/2006 | Gorobets |
| 2006/0161722 A1 | 7/2006 | Bennett et al. |
| 2007/0005829 A1 | 1/2007 | Fujimoto |

FOREIGN PATENT DOCUMENTS

| | | |
|---|---|---|
| JP | 8-147988 | 6/1996 |
| JP | 8-279295 | 10/1996 |
| JP | 2000-187992 | 7/2000 |
| WO | WO 02/058074 | 7/2002 |

OTHER PUBLICATIONS

ISA/EPO, "Notification of Transmittal of the International Search Report and the Written Opinion of the International Searching Authority, or the Declaration", mailed on May 31, 2005 in corresponding PCT/US2004/031788, 21 pages.

Notification of Transmittal of the International Search Report and the Written Opinion of the International Searching Authority, or the Declaration, for corresponding Patent Application No. PCT/US2005/044001, mailed May 17, 2006, 9 pages.

Notification of Transmittal of the International Search Report and the Written Opinion of the International Searching Authority, or the Declaration, for corresponding Patent Application No. PCT/US2005/043811, mailed May 19, 2006, 10 pages.

International Search Report and Written Opinion for related International Application No. PCT/US2005/043285, mailed May 8, 2006, 13 pages.

International Search Report and Written Opinion for related International Application No. PCT/US2005/044649, mailed May 4, 2006, 10 pages.

Imamiya et al., "A 125-mm$^2$ 1-Gb NAND Flash Memory With 10-Mbyte/s Program Speed", IEEE Journal of Solid State Circuits, vol. 37, No. 11, Nov. 2002, 10 pages.

Notification of Transmittal of the International Search Report and the Written Opinion of the International Searching Authority, or the Declaration, for corresponding Patent Application No. PCT/US2005/044720, mailed Oct. 10, 2006, 10 pages.

USPTO, "Office Action," mailed in related U.S. Appl. No. 11/192,220, filed Jul. 27, 2007, 13 pages.

USPTO, "Office Action," mailed in related U.S. Appl. No. 11/192,386, filed Jul. 27, 2007, 14 pages.

* cited by examiner

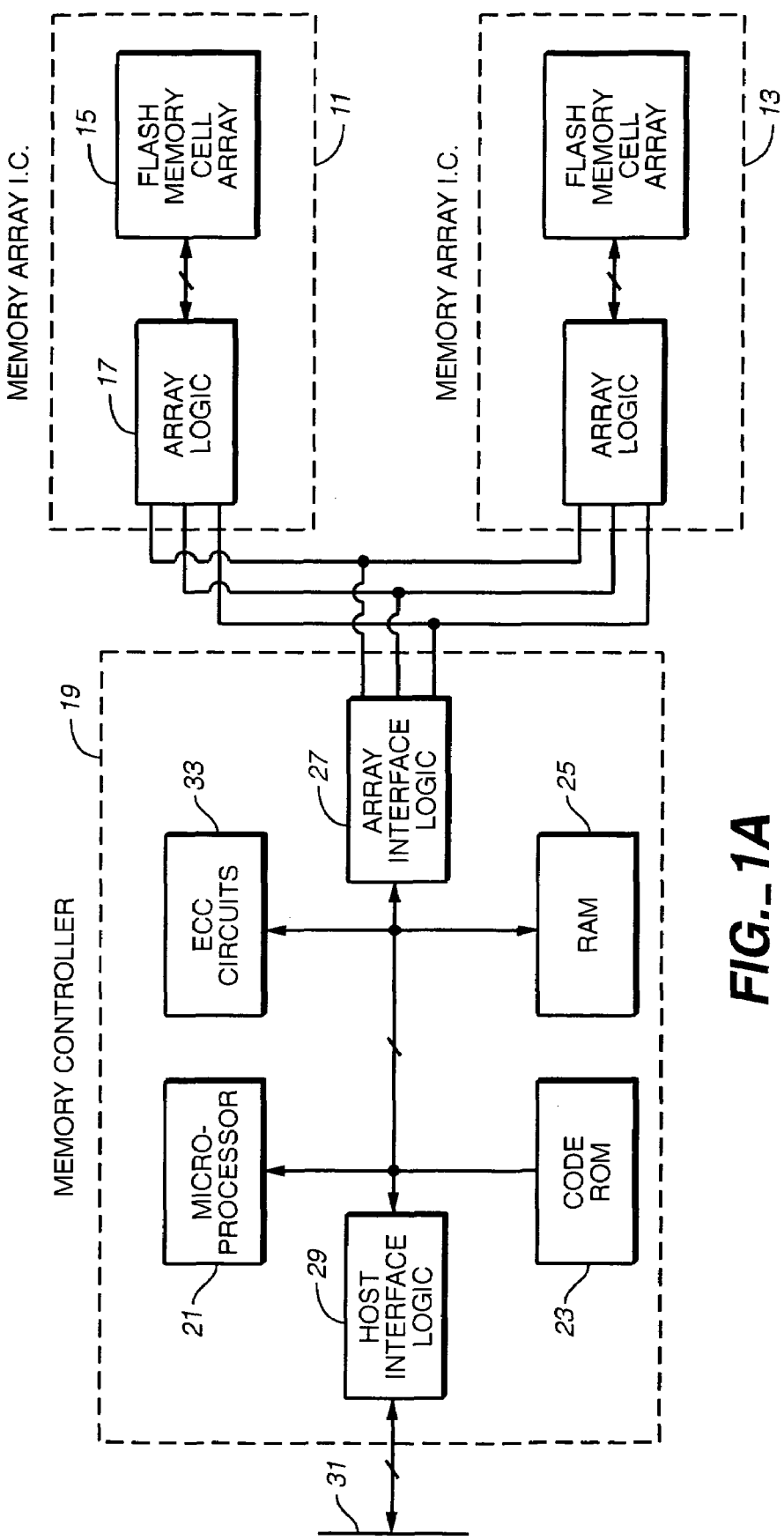
FIG._1A

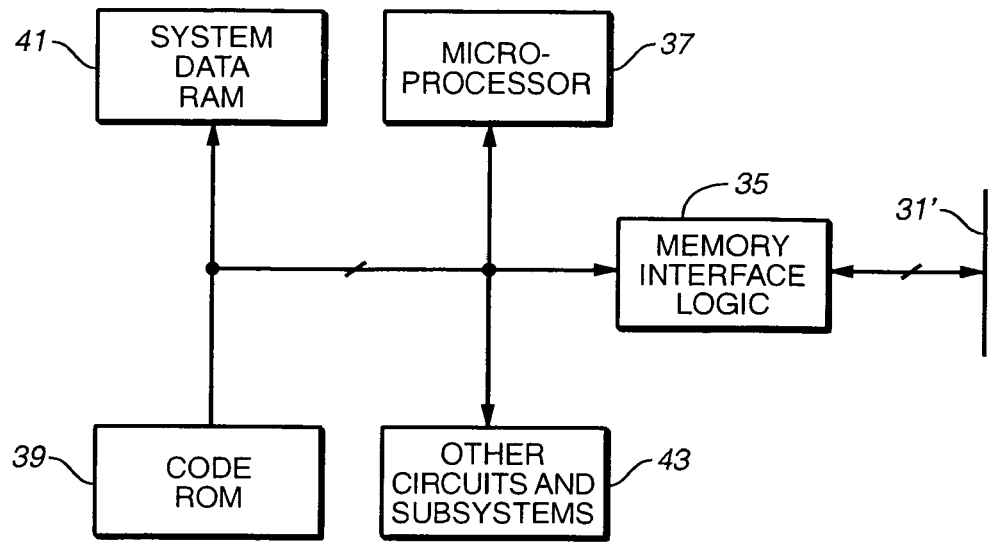
FIG._1B
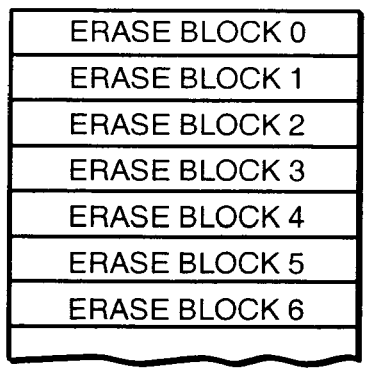
FIG._2
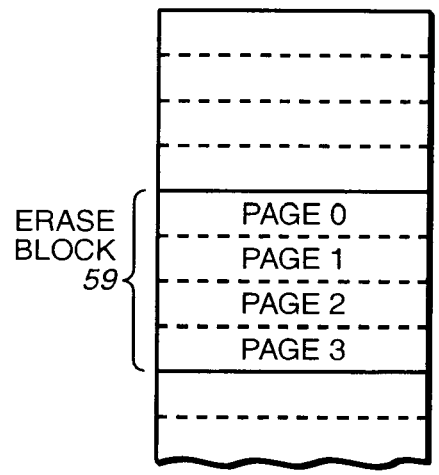
FIG._4
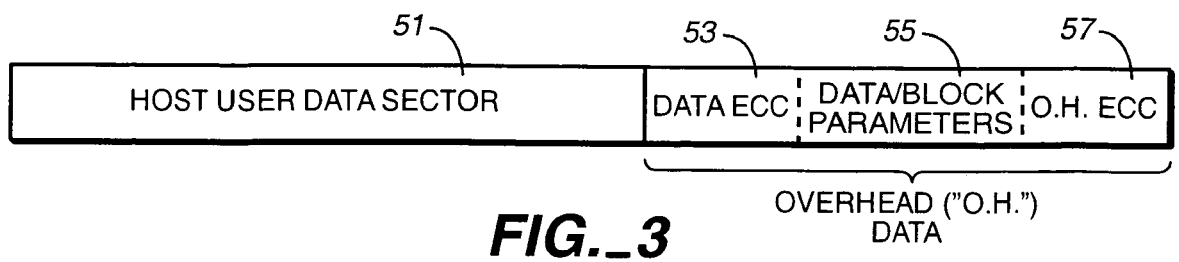
FIG._3

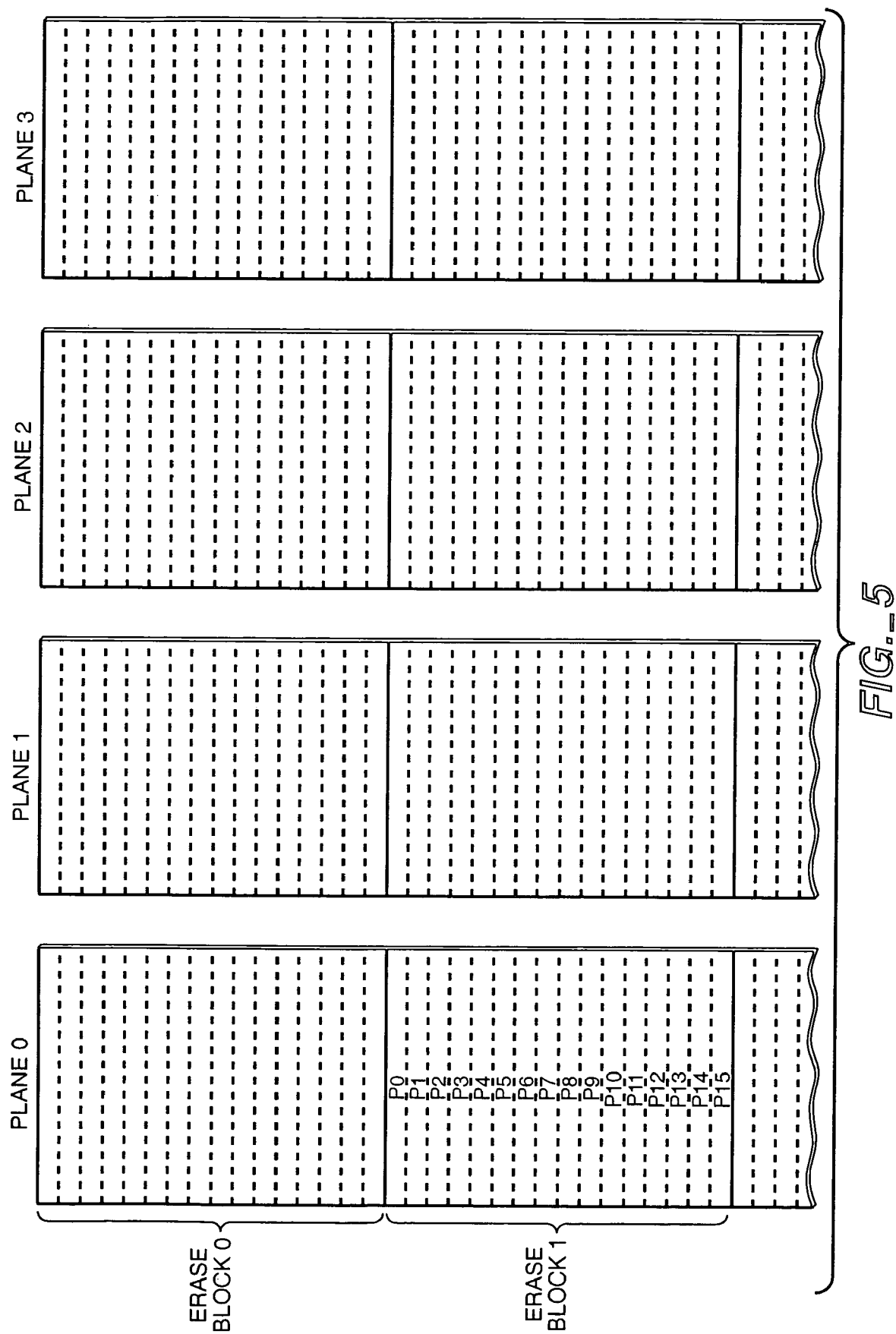
FIG._5

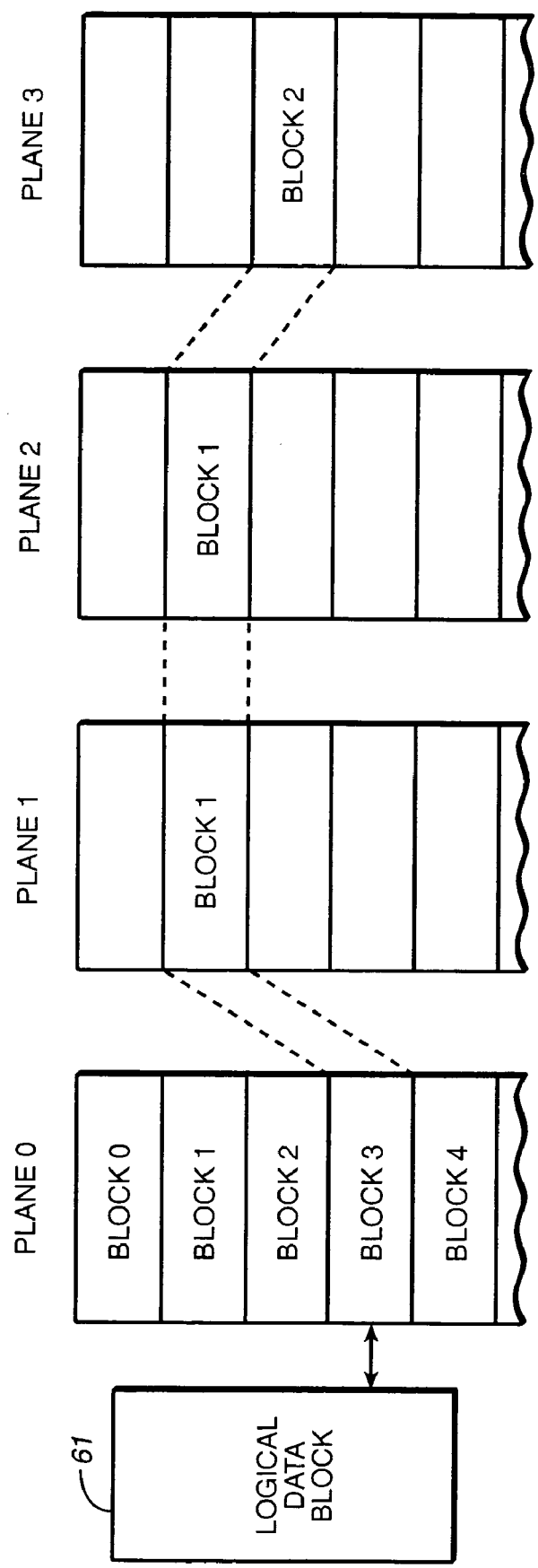
FIG._6

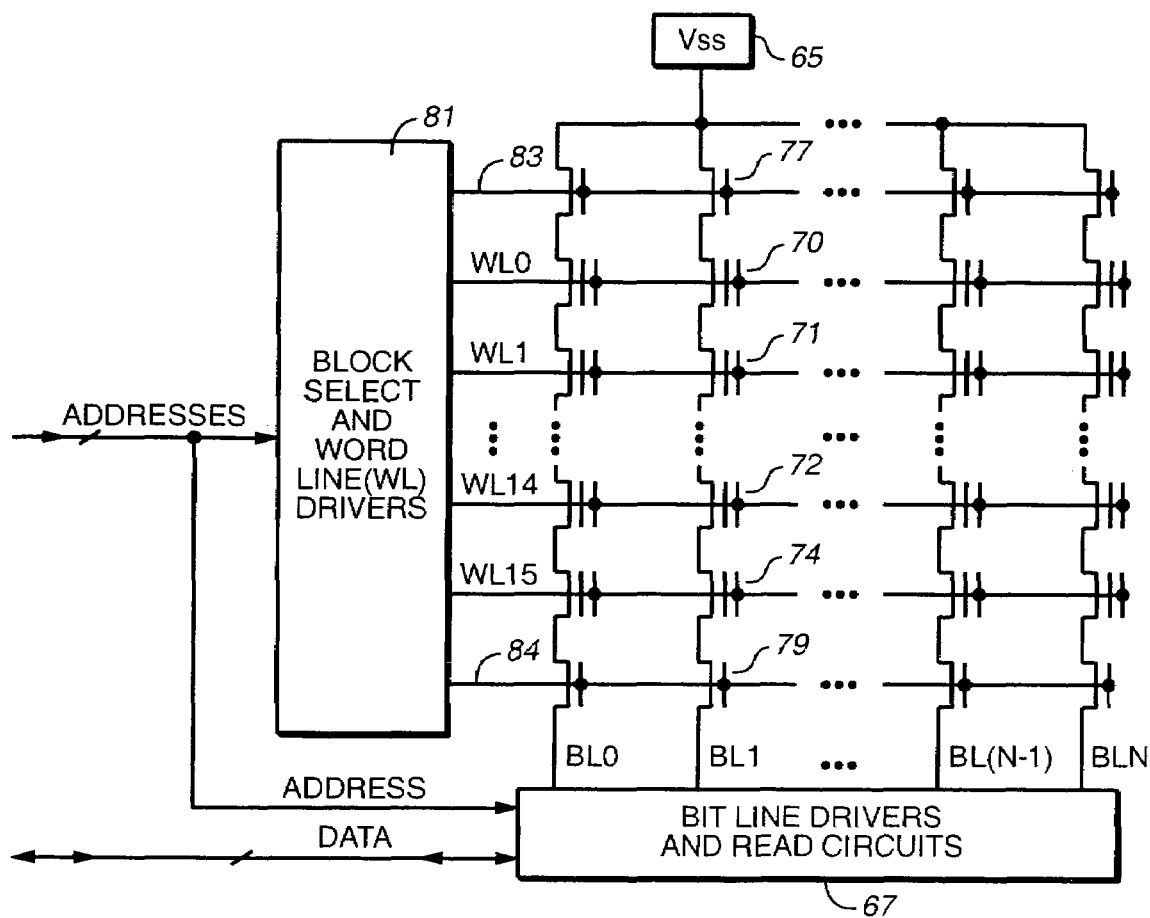
FIG._7

Active Block 800

| Sector 0 | Sector 1 | Sector 2 | Sector 3 | |
|---|---|---|---|---|
| X | Erased | Erased | Erased | Page 0 |
| X+1 | Erased | Erased | Erased | Page 1 |
| X+2 | Erased | Erased | Erased | Page 2 |
| X+3 | Erased | Erased | Erased | Page 3 |
| Erased | Erased | Erased | Erased | Page 4 |
| Erased | Erased | Erased | Erased | Page 5 |

FIG._8

Active Block 900

| Sector 0 | Sector 1 | Sector 2 | Sector 3 | |
|---|---|---|---|---|
| X | Erased | Erased | Erased | Page 0 |
| X | X+1 | Erased | Erased | Page 1 |
| X | X+1 | X+2 | Erased | Page 2 |
| X | X+1 | X+2 | X+3 | Page 3 |
| Erased | Erased | Erased | Erased | Page 4 |
| Erased | Erased | Erased | Erased | Page 5 |

FIG._9

Active Block 1000 (After First Garbage Collection)

| Sector 0 | Sector 1 | Sector 2 | Sector 3 | |
|---|---|---|---|---|
| X | X+1 | X+2 | X+3 | Page 0 |
| X+4 | Erased | Erased | Erased | Page 1 |
| X+5 | Erased | Erased | Erased | Page 2 |
| X+6 | Erased | Erased | Erased | Page 3 |
| X+7 | Erased | Erased | Erased | Page 4 |
| Erased | Erased | Erased | Erased | Page 5 |

FIG._10A

Active Block 1010 (After Second Garbage collection)

| Sector 0 | Sector 1 | Sector 2 | Sector 3 | |
|---|---|---|---|---|
| X | X+1 | X+2 | X+3 | Page 0 |
| X+4 | X+5 | X+6 | X+7 | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |

FIG._10B

Active Block 1010 (After Receipt of Additional Sectors)

| Sector 0 | Sector 1 | Sector 2 | Sector 3 | |
|---|---|---|---|---|
| X | X+1 | X+2 | X+3 | Page 0 |
| X+4 | X+5 | X+6 | X+7 | Page 1 |
| X+8 | Erased | Erased | Erased | Page 2 |
| X+9 | Erased | Erased | Erased | Page 3 |
| X+10 | Erased | Erased | Erased | Page 4 |
| X+11 | Erased | Erased | Erased | Page 5 |

FIG._10C

Active Block 1110

| Sector 0 | Sector 1 | Sector 2 | Sector 3 | |
|---|---|---|---|---|
| X | X+1 | X+2 | X+3 | Page 0 |
| X+4 | X+5 | X+6 | X+7 | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |

Scratch Pad Block 1120

| Sector 0 | Sector 1 | Sector 2 | Sector 3 | |
|---|---|---|---|---|
| X | Erased | Erased | Erased | Page 0 |
| X | X+1 | Erased | Erased | Page 1 |
| X | X+1 | X+2 | Erased | Page 2 |
| X+4 | Erased | Erased | Erased | Page 3 |
| X+4 | X+5 | Erased | Erased | Page 4 |
| X+4 | X+5 | X+6 | Erased | Page 5 |

*FIG._11A*

Active Block 1130

| Sector 0 | Sector 1 | Sector 2 | Sector 3 | |
|---|---|---|---|---|
| X | X+1 | X+2 | X+3 | Metapage 0 |
| X+4 | X+5 | X+6 | X+7 | Metapage 1 |
| Erased | Erased | Erased | Erased | Metapage 2 |
| Erased | Erased | Erased | Erased | Metapage 3 |
| Erased | Erased | Erased | Erased | Metapage 4 |
| Erased | Erased | Erased | Erased | Metapage 5 |
| Plane 0 | Plane 1 | Plane 2 | Plane 3 | |

Scratch Pad Block 1140

| Sector 0 | Sector 1 | Sector 2 | Sector 3 | |
|---|---|---|---|---|
| X | Erased | Erased | Erased | Metapage 0 |
| X | X+1 | Erased | Erased | Metapage 1 |
| X | X+1 | X+2 | Erased | Metapage 2 |
| X+4 | Erased | Erased | Erased | Metapage 3 |
| X+4 | X+5 | Erased | Erased | Metapage 4 |
| X+4 | X+5 | X+6 | Erased | Metapage 5 |
| Plane 0 | Plane 1 | Plane 2 | Plane 3 | |

FIG._11B

Active Block 1252

| Sector 0 | Sector 1 | Sector 2 | Sector 3 | |
|---|---|---|---|---|
| $X_1$ | $(X+1)_1$ | $(X+2)_1$ | $(X+3)_0$ | Page 0 |
| Erased | Erased | Erased | Erased | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |
| Erased | Erased | Erased | Erased | Page 6 |
| Erased | Erased | Erased | Erased | Page 7 |
| Erased | Erased | Erased | Erased | Page 8 |
| Erased | Erased | Erased | Erased | Page 9 |
| Erased | Erased | Erased | Erased | ... |
| Erased | Erased | Erased | Erased | Page N-1 |

Scratch Pad Block 1250

| Sector 0 | Sector 1 | Sector 2 | Sector 3 | |
|---|---|---|---|---|
| $X_0$ | Erased | Erased | Erased | Page 0 |
| $X_1$ | Erased | Erased | Erased | Page 1 |
| $X_1$ | $(X+1)_0$ | Erased | Erased | Page 2 |
| $X_1$ | $(X+1)_1$ | Erased | Erased | Page 3 |
| $X_1$ | $(X+1)_1$ | $(X+2)_0$ | Erased | Page 4 |
| $X_1$ | $(X+1)_1$ | $(X+2)_1$ | Erased | Page 5 |
| Erased | Erased | Erased | Erased | Page 6 |
| Erased | Erased | Erased | Erased | Page 7 |
| Erased | Erased | Erased | Erased | Page 8 |
| Erased | Erased | Erased | Erased | Page 9 |
| Erased | Erased | Erased | Erased | ... |
| Erased | Erased | Erased | Erased | Page N-1 |

*FIG._12A*

Active Block 1252

| Sector 0 | Sector 1 | Sector 2 | Sector 3 | |
|---|---|---|---|---|
| $X_1$ | $(X+1)_1$ | $(X+2)_1$ | $(X+3)_1$ | Page 0 |
| Erased | Erased | Erased | Erased | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |
| Erased | Erased | Erased | Erased | Page 6 |
| Erased | Erased | Erased | Erased | Page 7 |
| Erased | Erased | Erased | Erased | Page 8 |
| Erased | Erased | Erased | Erased | Page 9 |
| Erased | Erased | Erased | Erased | ... |
| Erased | Erased | Erased | Erased | Page N-1 |

Scratch Pad Block 1250

| Sector 0 | Sector 1 | Sector 2 | Sector 3 | |
|---|---|---|---|---|
| $X_0$ | Erased | Erased | Erased | Page 0 |
| $X_1$ | Erased | Erased | Erased | Page 1 |
| $X_1$ | $(X+1)_0$ | Erased | Erased | Page 2 |
| $X_1$ | $(X+1)_1$ | Erased | Erased | Page 3 |
| $X_1$ | $(X+1)_1$ | $(X+2)_0$ | Erased | Page 4 |
| $X_1$ | $(X+1)_1$ | $(X+2)_1$ | Erased | Page 5 |
| $X_1$ | $(X+1)_1$ | $(X+2)_1$ | $(X+3)_0$ | Page 6 |
| $X_1$ | $(X+1)_1$ | $(X+2)_1$ | $(X+3)_1$ | Page 7 |
| $(X+4)_0$ | Erased | Erased | Erased | Page 8 |
| Erased | Erased | Erased | Erased | Page 9 |
| Erased | Erased | Erased | Erased | ... |
| Erased | Erased | Erased | Erased | Page N-1 |

FIG._12B

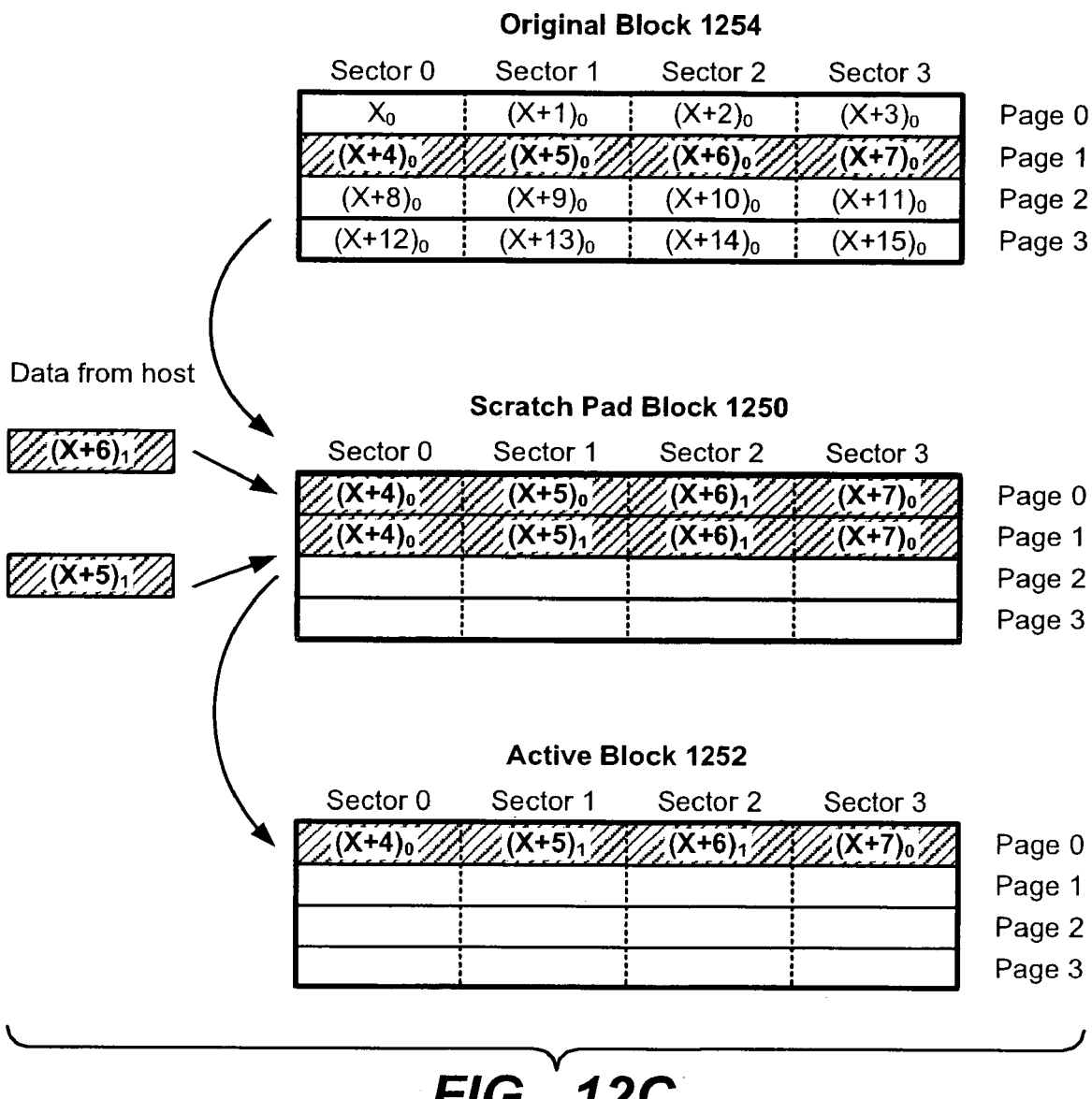
FIG._12C
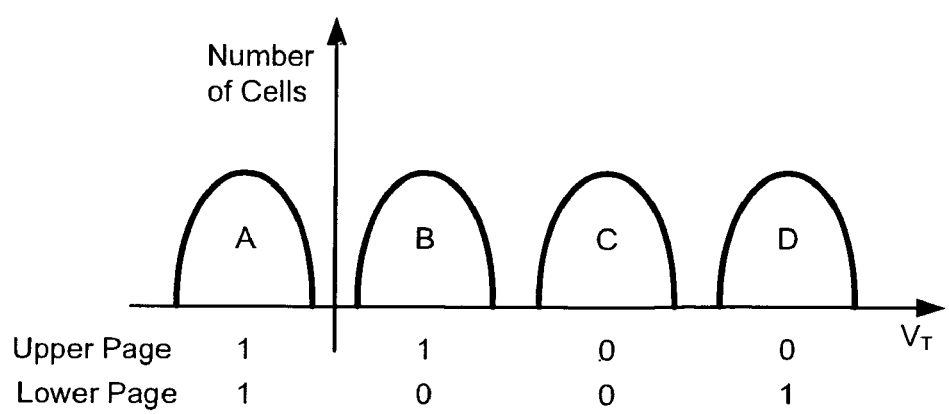
FIG._13

Scratch Pad Block 1460

| Sector 0 | Sector 1 | Sector 2 | Sector 3 | |
|---|---|---|---|---|
| X | X+1 | X+2 | X+3 | Page 0 - Lower |
| X+8 | X+9 | X+10 | X+11 | Page 0 - Upper |
| X+16 | X+17 | X+18 | X+19 | Page 1 - Lower |
| X+24 | X+25 | X+26 | X+27 | Page 1 - Upper |
| Erased | Erased | Erased | Erased | Page 2 - Lower |
| Erased | Erased | Erased | Erased | Page 2 - Upper |
| Erased | Erased | Erased | Erased | Page 3 - Lower |
| Erased | Erased | Erased | Erased | Page 3 - Upper |

Active Block 1462

| Sector 0 | Sector 1 | Sector 2 | Sector 3 | |
|---|---|---|---|---|
| X | X+1 | X+2 | X+3 | Page 0 - Lower |
| X+4 | X+5 | X+6 | X+7 | Page 0 - Upper |
| X+8 | X+9 | X+10 | X+11 | Page 1 - Lower |
| X+12 | X+13 | X+14 | X+15 | Page 1 - Upper |
| X+16 | X+17 | X+18 | X+19 | Page 2 - Lower |
| X+20 | X+21 | X+22 | X+23 | Page 2 - Upper |
| X+24 | X+25 | X+26 | X+27 | Page 3 - Lower |
| X+28 | X+29 | X+30 | X+31 | Page 3 - Upper |

FIG._14

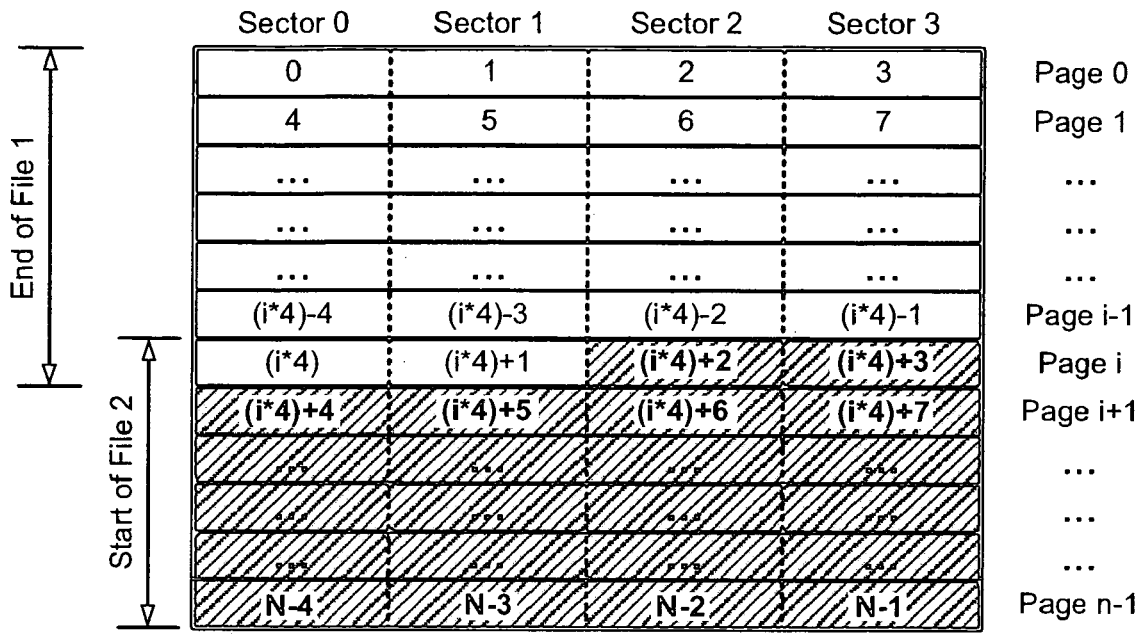
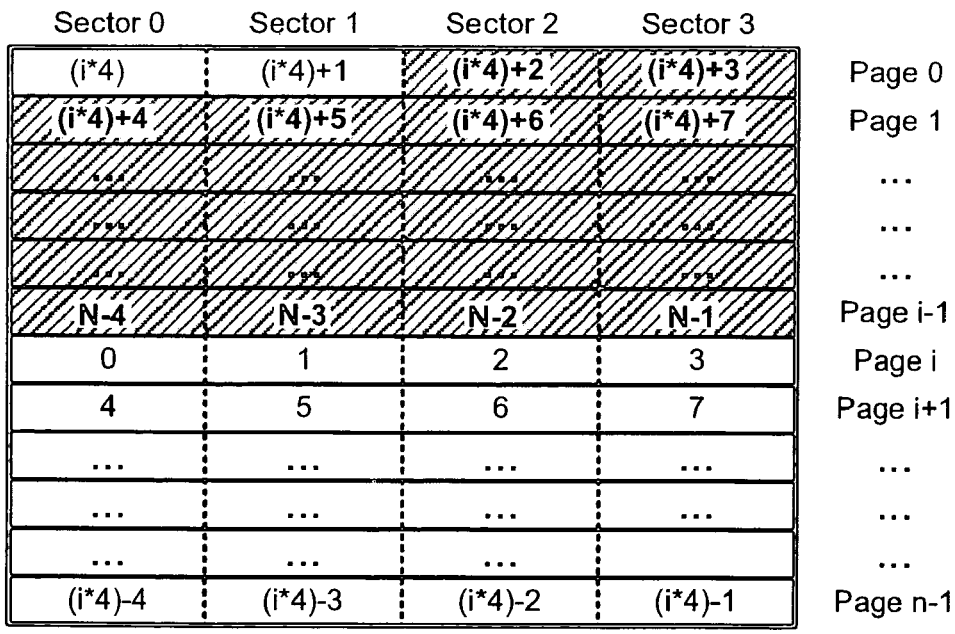
FIG._15

Scratch Pad Block 1674
| Sector 0 | Sector 1 | Sector 2 | Sector 3 | |
|---|---|---|---|---|
| (i*4)+2 | (i*4)+3 | Erased | Erased | Page 0 |
| Erased | Erased | Erased | Erased | Page 1 |
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |
| ... | ... | ... | ... | ... |
| Erased | Erased | Erased | Erased | Page n-1 |
New Block 1676
| Sector 0 | Sector 1 | Sector 2 | Sector 3 | |
|---|---|---|---|---|
| (i*4)+4 | (i*4)+5 | (i*4)+6 | (i*4)+7 | Page 0 |
| | | | | ... |
| | | | | ... |
| | | | | ... |
| N-4 | N-3 | N-2 | N-1 | Page n-i |
| 0 | 1 | 2 | 3 | Page n-i+1 |
| 7 | 6 | 5 | 4 | Page n-i+2 |
| ... | ... | ... | ... | ... |
| ... | ... | ... | ... | ... |
| ... | ... | ... | ... | ... |
| (i*4)-4 | (i*4)-3 | (i*4)-2 | (i*4)-1 | Page n-2 |
| (i*4) | (i*4)+1 | (i*4)+2 | (i*4)+3 | Page n-1 |
FIG._16

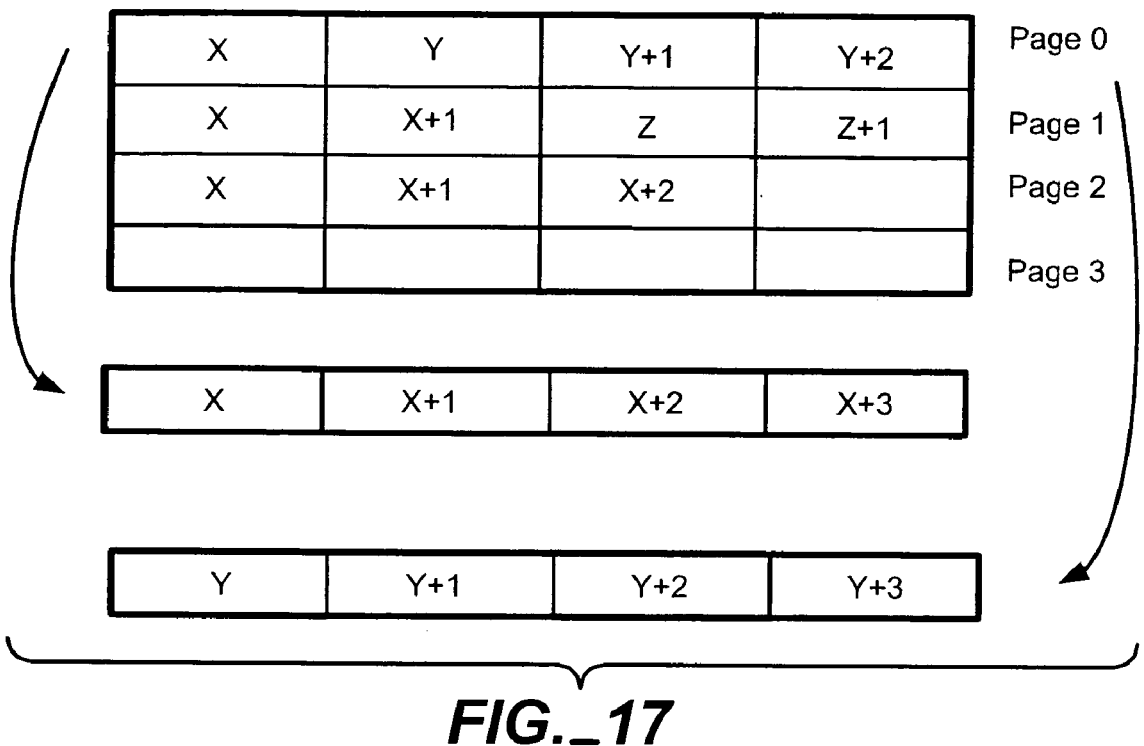
FIG._17
FIG._18

Scratch Pad Block 2100

| Sector 0 | Sector 1 | Sector 2 | Sector 3 | |
|---|---|---|---|---|
| Marking Sector | Erased | Erased | Erased | Page 0 |
| Erased | Erased | Erased | Erased | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |

Scratch Pad Block 2100

| Sector 0 | Sector 1 | Sector 2 | Sector 3 | |
|---|---|---|---|---|
| Marking Sector | Group 1 Sec 1 2220 | Group 1 Sec 2 2221 | Index Sector 2230 | Page 0 |
| Erased | Erased | Erased | Erased | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |

Scratch Pad Block 2100

| Sector 0 | Sector 1 | Sector 2 | Sector 3 | |
|---|---|---|---|---|
| Marking Sector | Group 1 Sec 1 | Group 1 Sec 2 | Index Sector 2230 | Page 0 |
| Group 2 Sec 1 2340 | Group 2 Sec 2 2341 | Index Sector 2350 | Erased | Page 1 |
| Erased | Erased | Erased | Erased | Page 2 |
| Erased | Erased | Erased | Erased | Page 3 |
| Erased | Erased | Erased | Erased | Page 4 |
| Erased | Erased | Erased | Erased | Page 5 |

*FIG._21*

Scratch Pad Block 2100

| | Sector 0 | Sector 1 | Sector 2 | Sector 3 | |
|---|---|---|---|---|---|
| | Marking Sector | Group 1 Sec 1 | Group 1 Sec 2 | Index Sector | Page 0 |
| | Group 2 Sec 1 | Group 2 Sec 2 | Index Sector 2350 | Group 3 Sec 1 2460 | Page 1 |
| | Group 3 Sec 2 2461 | Group 3 Sec 3 2462 | Index Sector 2470 | Erased | Page 2 |
| | Erased | Erased | Erased | Erased | Page 3 |
| | Erased | Erased | Erased | Erased | Page 4 |
| | Erased | Erased | Erased | Erased | Page 5 |

FIG._22

Scratch Pad Block 2100

| | Sector 0 | Sector 1 | Sector 2 | Sector 3 | |
|---|---|---|---|---|---|
| | Marking Sector | Group 1 Sec 1 | Group 1 Sec 2 | Index Sector | Page 0 |
| | Group 2 Sec 1 | Group 2 Sec 2 | Index Sector | Group 3 Sec 1 | Page 1 |
| | Group 3 Sec 2 | Group 3 Sec 3 | Index Sector | Index Sector 2560 | Page 2 |
| | Erased | Erased | Erased | Erased | Page 3 |
| | Erased | Erased | Erased | Erased | Page 4 |
| | Erased | Erased | Erased | Erased | Page 5 |

FIG._23

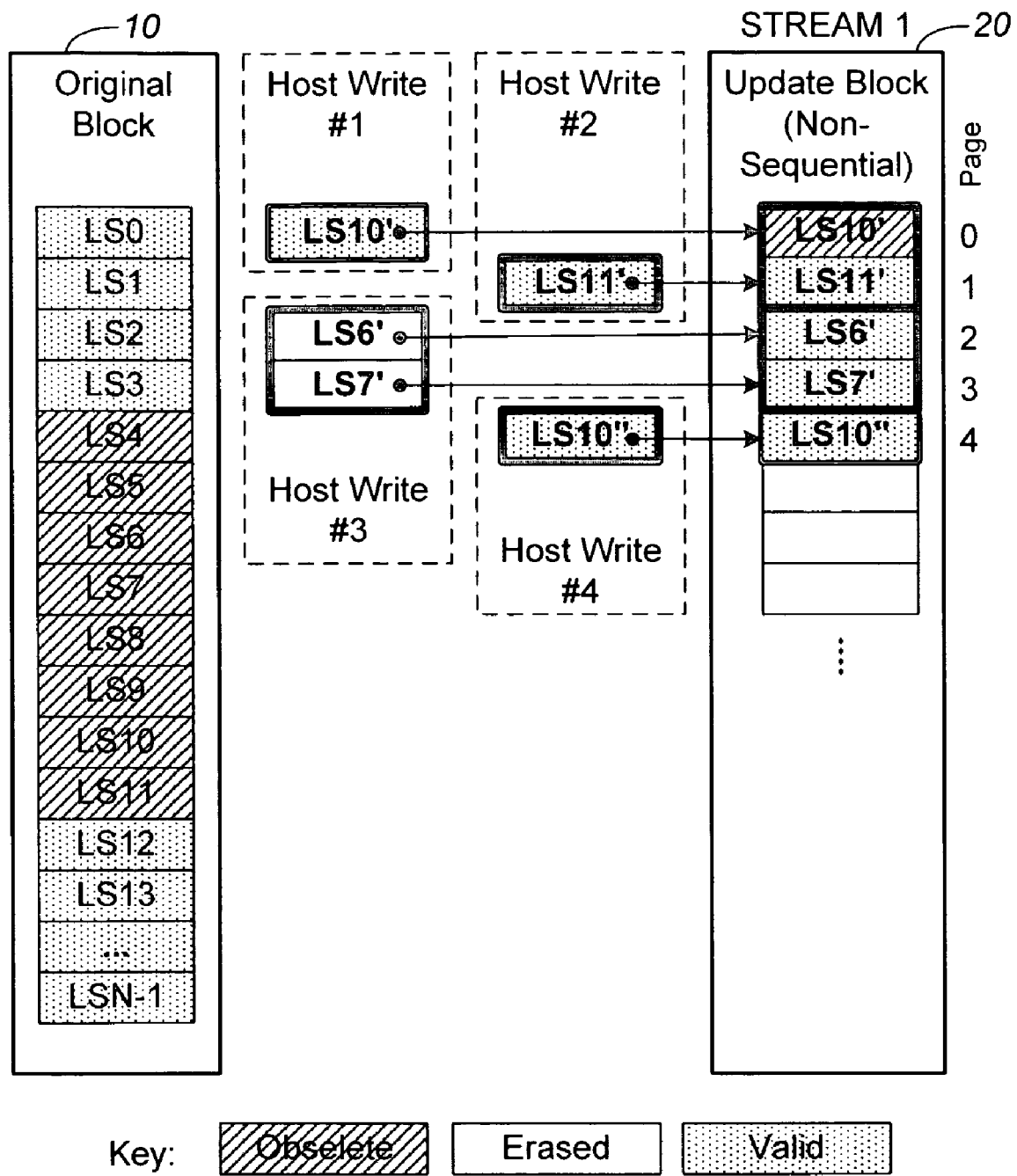
SINGLE-SECTOR PAGE UPDATE EXAMPLE
*FIG. 24*   *(PRIOR ART)*

WRITE-ONCE, MULTIPLE-SECTOR PAGE UPDATE EXAMPLE

Updating Using Two Streams With Index Stored In One Stream

**WRITE-ONCE, MULTIPLE-SECTOR PAGE UPDATE
WITH SPBI INDEX EXAMPLE**

**WRITE-ONCE, MULTIPLE-SECTOR PAGE
SEQUENTIAL UPDATE
WITH SPBI INDEX EXAMPLE**

Updating Using One Stream With Index Stored In Partial Page

MULTIPLE-SECTOR PAGE UPDATE USING SCRATCH PAD

Synchronizing Two Update Streams

Synchronizing Two Update Streams Using Write Pointers (Valid LS10" in Full Page of Update Block)

(Valid LS10" in Partial Page of Scratch Pad Block)

← 50

| Logical Group# | Page Starting Sector | Sector Run Length | Valid Page# | Update Block Write Pointer |
|---|---|---|---|---|

Scratch Pad Block (SPB) Index   40

Index entry for host write #1 in STREAM 1

| 1 | 8 | 3 | 0 | 0 |
|---|---|---|---|---|

Index entry for STREAM k

| ... | ... | ... | ... | ... |
|---|---|---|---|---|

FIG. 34B (Valid LS10' in Scratch Pad Block)

(Valid LS10' in Update Block)

LOGICAL SECTOR

NON-VOLATILE MEMORY AND METHOD WITH MULTI-STREAM UPDATING

CROSS REFERENCE TO RELATED APPLICATIONS

This application is a continuation-in-part of U.S. patent application Ser. No. 11/016,285, filed on Dec. 16, 2004.

BACKGROUND OF THE INVENTION

This invention relates generally to the operation of non-volatile flash memory systems, and, more specifically, to more efficient methods of programming data within a non-volatile flash memory.

There are many commercially successful non-volatile memory products being used today, particularly in the form of small form factor cards, which employ an array of flash EEPROM (Electrically Erasable and Programmable Read Only Memory) cells formed on one or more integrated circuit chips. A memory controller, usually but not necessarily on a separate integrated circuit chip, interfaces with a host to which the card is removably connected and controls operation of the memory array within the card. Such a controller typically includes a microprocessor, some non-volatile read-only-memory (ROM), a volatile random-access-memory (RAM) and one or more special circuits such as one that calculates an error-correction-code (ECC) from data as they pass through the controller during the programming and reading of data. Some of the commercially available cards are CompactFlash™ (CF) cards, MultiMedia cards (MMC), Secure Digital (SD) cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. In some systems, a removable card does not include a controller and the host controls operation of the memory array in the card. Examples of this type of memory system include Smart Media cards and xD cards. Thus, control of the memory array may be achieved by software on a controller in the card or by control software in the host. Besides the memory card implementation, this type of memory can alternatively be embedded into the memory card implementation, this type of memory can alternatively be embedded into various types of host systems. In both removable and embedded applications, host data may be stored in the memory array according to a storage scheme implemented by memory control software.

Two general memory cell array architectures have found commercial application, NOR and NAND. In a typical NOR array, memory cells are connected between adjacent bit line source and drain diffusions that extend in a column direction with control gates connected to word lines extending along rows of cells. A memory cell includes at least one storage element positioned over at least a portion of the cell channel region between the source and drain. A programmed level of charge on the storage elements thus controls an operating characteristic of the cells, which can then be read by applying appropriate voltages to the addressed memory cells. Examples of such cells, their uses in memory systems and methods of manufacturing them are given in U.S. Pat. Nos. 5,070,032, 5,095,344, 5,313,421, 5,315,541, 5,343,063, 5,661,053 and 6,222,762. These patents, along with all other patents and patent applications referenced in this application are hereby incorporated by reference in their entirety.

The NAND array utilizes series strings of more than two memory cells, such as 16 or 32, connected along with one or more select transistors between individual bit lines and a reference potential to form columns of cells. Word lines extend across cells within a large number of these columns. An individual cell within a column is read and verified during programming by causing the remaining cells in the string to be turned on hard so that the current flowing through a string is dependent upon the level of charge stored in the addressed cell. Examples of NAND architecture arrays and their operation as part of a memory system are found in U.S. Pat. Nos. 5,570,315, 5,774,397, 6,046,935, and 6,522,580.

The charge storage elements of current flash EEPROM arrays, as discussed in the foregoing referenced patents, are most commonly electrically conductive floating gates, typically formed from conductively doped polysilicon material. An alternate type of memory cell useful in flash EEPROM systems utilizes a non-conductive dielectric material in place of the conductive floating gate to store charge in a non-volatile manner. A triple layer dielectric formed of silicon oxide, silicon nitride and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region, and erased by injecting hot holes into the nitride. Several specific cell structures and arrays employing dielectric storage elements and are described in United States patent application publication no. 2003/0109093 of Harari et al.

As in most all integrated circuit applications, the pressure to shrink the silicon substrate area required to implement some integrated circuit function also exists with flash EEPROM memory cell arrays. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell and/or per storage unit or element. This is accomplished by dividing a window of a storage element charge level voltage range into more than two states. The use of four such states allows each cell to store two bits of data, eight states stores three bits of data per storage element, and so on. Multiple state flash EEPROM structures using floating gates and their operation are described in U.S. Pat. Nos. 5,043,940 and 5,172,338, and for structures using dielectric floating gates in aforementioned United States patent application publication no. 2003/0109093. Selected portions of a multi-state memory cell array may also be operated in two states (binary) for various reasons, in a manner described in U.S. Pat. Nos. 5,930,167 and 6,456,528, which patents, along with all patents and patent applications cited in this application, are hereby incorporated by reference in their entirety.

Memory cells of a typical flash EEPROM array are divided into discrete blocks of cells that are erased together (an erase block). That is, the erase block is the erase unit, a minimum number of cells that are simultaneously erasable. Each erase block typically stores one or more pages of data, the page being the minimum unit of programming and reading, although more than one page may be programmed or read in parallel in different sub-arrays or planes. Each page typically stores one or more sectors of data, the size of the sector being defined by the host system. An example sector includes 512 bytes of user data, following a standard established with magnetic disk drives, plus some number of bytes of overhead information about the user data and/or the erase block in which they are stored. Such memories are typically configured with 16, 32 or more pages within each erase block, and each page stores one or just a few host sectors of data.

In order to increase the degree of parallelism during programming user data into the memory array and read user data from it, the array is typically divided into sub-arrays, commonly referred to as planes, which contain their own data registers and other circuits to allow parallel operation such that sectors of data may be programmed to or read from each of several or all the planes simultaneously. An array on a single integrated circuit may be physically divided into planes, or each plane may be formed from a separate one or more integrated circuit chips. Examples of such a memory implementation are described in U.S. Pat. Nos. 5,798,968 and 5,890,192.

To further efficiently manage the memory, erase blocks may be linked together to form virtual blocks or metablocks. That is, each metablock is defined to include one erase block from each plane. Use of the metablock is described in U.S. Pat. No. 6,763,424. The metablock is identified by a host logical block address as a destination for programming and reading data. Similarly, all erase blocks of a metablock are erased together. A metablock may be programmed in a unit of a metapage that comprises one page from each erase block in a metablock. The controller in a memory system operated with such large blocks and/or metablocks performs a number of functions including the translation between logical block addresses (LBAs) received from a host, and physical block numbers (PBNs) within the memory cell array. Individual pages within erase blocks are typically identified by offsets within the block address. Address translation often involves use of intermediate terms of a logical block number (LBN) and logical page. In a memory system using metablocks, the metablock may be the effective minimum unit of erase of the memory array. Thus, the minimum unit of erase (a block) may be either an erase block or a metablock depending on the memory architecture. The term "block" may refer to either an erase block or a metablock depending on the architecture. Similarly, the term "page" may refer to the minimum unit of programming of the memory system. This may be a page within a single erase block or may be a metapage that extends across several erase blocks depending on the architecture of the memory system.

Data stored in a metablock are often updated, the likelihood of updates increases as the data capacity of the metablock increases. Updated sectors of one metablock are normally written to another metablock. The unchanged sectors are usually also copied from the original to the new metablock, as part of the same programming operation, to consolidate the data. Alternatively, the unchanged data may remain in the original metablock until later consolidation with the updated data into a single metablock again. Operations to consolidate current data to a new block and erase a block containing only obsolete data are generally referred to as "garbage collection" operations.

It is common to operate large block or metablock systems with some extra blocks maintained in an erased block pool. When one or more pages of data less than the capacity of a block are being updated, it is typical to write the updated pages to an erased block from the pool and then copy data of the unchanged pages from the original block to erase pool block. Variations of this technique are described in aforementioned U.S. Pat. No. 6,763,424. Over time, as a result of host data files being re-written and updated, many blocks can end up with a relatively few number of its pages containing valid data and remaining pages containing data that is no longer current. In order to be able to efficiently use the data storage capacity of the array, logically related data pages of valid data are from time-to-time gathered together from fragments among multiple blocks and consolidated together into a fewer number of blocks. This process is commonly termed "garbage collection."

In some memory systems, the physical memory cells are also grouped into two or more zones. A zone may be any partitioned subset of the physical memory or memory system into which a specified range of logical block addresses is mapped. For example, a memory system capable of storing 64 Megabytes of data may be partitioned into four zones that store 16 Megabytes of data per zone. The range of logical block addresses is then also divided into four groups, one group being assigned to the physical blocks of each of the four zones. Logical block addresses are constrained, in a typical implementation, such that the data of each are never written outside of a single physical zone into which the logical block addresses are mapped. In a memory cell array divided into planes (sub-arrays), which each have their own addressing, programming and reading circuits, each zone preferably includes blocks from multiple planes, typically the same number of blocks from each of the planes. Zones are primarily used to simplify address management such as logical to physical translation, resulting in smaller translation tables, less RAM memory needed to hold these tables, and faster access times to address the currently active region of memory, but because of their restrictive nature can result in less than optimum wear leveling.

Individual flash EEPROM cells store an amount of charge in a charge storage element or unit that is representative of one or more bits of data. The charge level of a storage element controls the threshold voltage (commonly referenced as $V_T$) of its memory cell, which is used as a basis of reading the storage state of the cell. A threshold voltage window is commonly divided into a number of ranges, one for each of the two or more storage states of the memory cell. These ranges are separated by guardbands that include a nominal sensing level that allows determining the storage states of the individual cells. These storage levels do shift as a result of charge disturbing programming, reading or erasing operations performed in neighboring or other related memory cells, pages or blocks. Error correcting codes (ECCs) are therefore typically calculated by the controller and stored along with the host data being programmed and used during reading to verify the data and perform some level of data correction if necessary. Also, shifting charge levels can be restored back to the centers of their state ranges from time-to-time, before disturbing operations cause them to shift completely out of their defined ranges and thus cause erroneous data to be read. This process, termed data refresh or scrub, is described in U.S. Pat. Nos. 5,532,962 and 5,909,449.

In some memory arrays, a page may consist of a portion of an erase block that can hold multiple sectors of data. Once the page has been written, no further writing may be possible without corrupting the data that is already written. For memory arrays using such a system, a page may be defined by a set of memory cells that are connected to the same word line. Such memory arrays may be inefficiently programmed where data is received in amounts that are less than the size of a page. For example, where data is received one sector at a time, just one sector may be programmed to a page. No additional data may be programmed to the page without risk of corrupting the sector of data that is already saved there. Sometimes a series of single sectors may be received with some delay between them. In this case, each sector is written to a separate page of the memory array. Thus, the sectors are stored in a way that is inefficient in how it uses space in the memory array. Where multi-level logic is used, memory cells are particularly sensitive to the effects of later programming of nearby cells. In addition, programming of multi-level cells is generally done by programming a group of cells with a first page of data and later programming the cells with a second page of data. The programming of the second page of data may cause corruption of the first page of data in some cases. Hence, there is a need for a more efficient way to store data in a memory array that has a multi-sector page when the memory array receives data in amounts that are less than a page. There is also a need for a way to prevent corruption of data of a first page during programming of a subsequent page when programming a group of multi-level cells.

SUMMARY

In a memory array having a block as the unit of erase, one or more blocks may be designated as scratch pad blocks and may be used to improve performance of the memory system. A scratch pad block may operate as a buffer so that data is written to the scratch pad block with a low degree of parallelism and then copied to another location within the memory array with a high degree of parallelism. Data may be accumulated in the scratch pad block until it may be more efficiently written to another location. In memories having multi-sector pages, sectors may be accumulated until a full page may be written using the maximum parallelism of the system. In multi-level cell memories, a lower page may be stored in a scratch pad block until the upper page is available so that the upper and lower pages are stored together.

The degree of parallelism of a particular program operation is proportional to the number of bits of data that are programmed together. Thus, programming a large amount of data together is considered a write with high parallelism, while programming a small amount of data together is considered low parallelism. Where parallelism of less than a page is used, space in the memory array may be wasted and this wasted space means that garbage collection must be performed more often thus adversely affecting the efficiency of the memory system. Sometimes, small amounts of data must be stored in the memory system. By writing these small writes in one location, a scratch pad block, and later writing them together with higher parallelism to another location, the efficiency of the memory system may be improved.

In a memory system having a minimum unit of program of a page that consists of multiple sectors of data, a method of storing data that are received in amounts that are less than one page is disclosed. A block designated as a scratch pad block is used to store received sectors until a complete page may be written to the flash memory array. A first sector is stored in a first page of the scratch pad block. Subsequently received sectors may be stored in additional pages of the scratch pad block. Individually received sectors or groups of sectors are saved in a new page of the scratch pad block when they are received. Previously stored sectors from other pages in the scratch pad block may be copied to the latest page along with the new data. Thus, sectors of data are accumulated in the scratch pad block as long as there is less than a full page of new data in a page of the scratch pad block. Sectors are written to the scratch pad block with a lower degree of parallelism than the maximum available parallelism for the block. Sectors may be updated while stored in the scratch pad block. When a new sector of data is received that results in a full page of data being available for programming, the new sector and the sectors previously stored in the scratch pad block may be programmed together to the same page in another block of the memory array. This page is fully populated with data and is written with the maximum available parallelism. The data stored in the scratch pad block may then be marked as obsolete and may be erased at a convenient time. Thus, space in the flash memory is more efficiently used and the frequency of garbage collection operations is reduced.

In memories having multi-level cells, a scratch pad block may store a page of data that is also written to an active block. The stored page may be kept in the scratch pad block until another page of data is received so that the two pages of data may be written together to their destination in an active block. They may be written as an upper and lower page together using a high degree of parallelism and with a lower risk of corrupting data than if they were written separately. The scratch pad block may also be used to retain a copy of a previously programmed lower page during programming of the associated upper page so that if there is a loss of power, the data in the lower page may be recovered from the scratch pad block.

A scratch pad block may allow temporary storage of data that is to be written to another location. Data may be stored in a scratch pad block during updating of sectors of data of a block. Where a page within a block contains sectors of data from different files, the page is updated when either block is updated. It may require more than one block to store the updated data from the two files using conventional methods because two copies of the multi-file page may be needed. Using a scratch pad block allows part of the page from one file to be stored until the remainder of the page (from the other file) is available. Then, the complete updated page is programmed to its destination using maximum parallelism.

A scratch pad block may contain sectors of unrelated data. Both host data sectors and control data sectors may be stored in a scratch pad block. Both host data sectors and control data sectors may be stored in the same page within a scratch pad block. Sectors from two different files or from logically remote portions of the same file may be stored in the same page of a scratch pad block. This may allow programming of the scratch pad block with maximum parallelism so that high speed is maintained as data is received. Where data is received at a low speed, the additional space in a page may be occupied by sectors containing control data. This may allow control data structures to be updated less frequently thus reducing the frequency of garbage collection.

Generally, the sectors stored in the same page of a scratch pad block need not belong to different files. As independent data objects, they just need to be, for example, two logical sectors of the same page, but written by different write commands.

A scratch pad may be identified by a marking sector so that a controller may easily identify it. An index of data stored in a scratch pad block may be maintained in an index sector which itself is stored in the scratch pad block. As new sectors are stored in the scratch pad block the index sector is updated by replacing the old index sector with a new index sector. Similarly, as sectors in the scratch pad block are copied to other locations, the index sector may be updated to indicate that these sectors in the scratch pad block are obsolete.

Improved Indexing for Scratch Pad and Update Blocks—SPBI/CBI Indices Maintained in Scratch Pad Blocks According to another aspect of the invention, when a scratch pad block is employed in addition to an update block, an associated scratch pad block index ("SPBI") is used to keep track of the update sectors recorded in the scratch pad block. This is in addition to an index (e.g., "CBI") used to keep track of the logical sectors recorded in the update block. Whenever user data is stored in a partial page of the scratch pad block, it means that at least the last slot of the page is unfilled. In one embodiment, the SPBI can be stored in the last slot of the partial page in the scratch pad block. In a preferred embodiment, the SPBI and the CBI can be packaged within a SPBI/CBI sector and stored at the last slot of a partial page in the scratch pad block which is unused anyway. Every time a new partial page is written, an updated SPBI/CBI sector is written at the end slot, rendering all previous versions obsolete.

At the same time, the indexing scheme takes advantage of the unused storage in the scratch pad block to store an index in nonvolatile memory.

According to yet another aspect of the invention, data stored in a memory block has its index stored in a portion of a partial page unoccupied by data. Thus, in a memory organized into memory units where a page of memory units is programmable together and a block of memory pages is erasable together, partially filled pages will exist when data units stored in the memory units are aligned in the page according to a predetermined order, and especially if the page is once-programmable after each erase. The index for the block is then stored in a partial page not filled with update data. The partial page may be in the current block or in another block.

Multi-Stream Update Tracking—Synchronization between Two or More Streams

According to another aspect of the invention, a method is provided to write update data to a non-volatile memory with synchronization information that allows identifying the most recently written version of data that may exist on multiple memory blocks. Update data from a host may be directed to multiple blocks via multiple streams. The maintenance of the synchronization information is accomplished by storing information about how full the stream/blocks are at the time of every update of at least one of the streams.

In a preferred embodiment, a write pointer that points to the first empty location in a block will indicate how full the block is. For example, between two streams, the value of a write pointer for a second block indicates how full the second block is at the time the write pointer is written to a first block. Furthermore, the position where the write pointer is saved in the first block also indicates how full the first block is at the time.

The invention is particular applicable to a nonvolatile memory that is organized into erasable blocks of memory units, each memory unit for storing a logical unit of data, and each block also organized into one or more pages. Furthermore, each page is once programmable after an erase with multiple logical units, each logical unit in a predetermined order with a given page offset. The method essentially provides two blocks (e.g., an update block and a scratch pad block) for storing or buffering update data of a group of logical units, and maintains synchronization information for helping to identify whether the most recently written version of a logical unit is located in the first or second block.

Accordingly to a preferred embodiment, the synchronization information in the form of a write pointer is saved together with host data every time it is being buffered in a scratch pad block. The write pointer is an update-block write pointer that gives the address of the location for the next write in the update block at the time the write pointer is saved in the scratch pad block. In particular, it is saved in a portion of the scratch pad block not utilized for storing host data anyway. Preferably, the update-block write pointer is included in the index SPBI/CBI stored in a partial page of the scratch pad block. The update-block write pointer would allow determination of whether a given logical sector buffered in the scratch pad block has been rendered obsolete by subsequent writes to the update block.

According to another embodiment of the invention, synchronization information is maintained that would allow determination of whether a given logical sector buffered in the scratch pad block has been rendered obsolete by subsequent writes to the update block. This is accomplished by including a scratch-pad write pointer that gives the address of the location for the next write in the scratch pad block at the time the synchronization information is stored in a page of the update block.

In yet another embodiment, the synchronization information can be encoded as time stamps for data sectors written to multiple streams so that the latest version can be correctly found.

In the preferred embodiment, the time stamp information is stored in an overhead portion of at least one of the sectors in the page being written.

Multi-stream Updating with Pipelined Operation

According to another aspect of the invention, a method of updating a nonvolatile memory includes using a first block (update block) for recording update data and a second block (scratch pad block) for temporary saving some of the update data before recording to the update block. The nonvolatile memory is organized into erasable blocks of memory units, each memory units for storing a logical unit of data, and each block also organized into one or more pages, with each page capable of storing multiple logical units having definite page offsets, and being once programmable together after an erase. The method further includes receiving the logical units from a host and aligning the received logical units page by page, so that when a predetermined condition is satisfied where a received logical unit has a page end offset, storing the received logical unit and any preceding logical units to a page in the update block with appropriate page alignment, otherwise, temporarily storing any remaining received logical units to a partial page in the scratch pad block. The logical units in the scratch pad block are eventually transferred to the update block when the predetermined condition is satisfied.

In a preferred embodiment, the update data is received and parsed page by page for transferring to the first block (e.g., update block). Any remaining partial page of received data is transferred to the second block (e.g., scratch pad block) and will remain there until a full page of data becomes available for recording to the first block. When the received data is transferred to the second block, it is recorded page by page, albeit the recorded page is only partially filled with the received data. The spare, normally unused, space in the partial page is used to store an index for locating the data in the second and first blocks.

According to another preferred embodiment, a predictive pipelined operation is implemented in which, rather than waiting until the predetermined condition for recording to the update block is confirmed, the update block is set up to be written to as soon as the host write command indicates the predetermined condition is potentially satisfied by the data units intended to be written. In this way, the set up could have a jump start while waiting for the data units to come from the host. When the actual data units received eventually do satisfy the predetermined condition, programming of the page in the update block can take place immediately without have to wait for setup, thereby improving write performance. In the event that the host write was interrupted and the actual data units received no longer satisfy the predetermined condition, the setup for recording to the update block will be abandoned, and instead the data units will be recorded to the scratch pad block.

In another preferred embodiment, as data is being received and when there is initially uncertainty in recording the received data whether to the first or second storage, the received data is loaded to the data latches of the programming circuits for both first and second storage. In this way, the data will always be immediately available for programming either the first or second storage. In a special case, the first and second storages share the same set of data latches. For example, when first and second storages are in the same memory plane, they could be served by the same set of programming circuits with the same set of sense amplifiers and data latches. In that case, data will be loaded to a set of default data latches irrespective of whether first or second storage is to be programmed.

Additional features and advantages of the present invention will be understood from the following description of its preferred embodiments, which description should be taken in conjunction with the accompanying drawings.

BRIEF DESCRIPTION OF THE DRAWINGS

FIGS. 1A and 1B are block diagrams of a non-volatile memory and a host system, respectively, that operate together.

FIG. 2 illustrates a first example organization of the memory array of FIG. 1A.

FIG. 3 shows an example host data sector with overhead data as stored in the memory array of FIG. 1A.

FIG. 4 illustrates a second example organization of the memory array of FIG. 1A.

FIG. 5 illustrates a third example organization of the memory array of FIG. 1A.

FIG. 6 shows an extension of the third example organization of the memory array of FIG. 1A.

FIG. 7 is a circuit diagram of a group of memory cells of the array of FIG. 1A in one particular configuration.

FIG. 8 shows storage of sectors of data in a block of a memory array such as the memory array of FIG. 1A.

FIG. 9 shows an alternative storage of sectors of data in a block of a memory array such as the memory array of FIG. 1A.

FIG. 10A shows sectors of data of FIGS. 8 or 9 after copying to another block during a garbage collection operation.

FIG. 10B shows sectors of data of FIG. 10A after copying to another block during a second garbage collection operation.

FIG. 10C shows the block of FIG. 10B after more sectors of data are received.

FIG. 11A shows an alternative storage arrangement using two erase blocks, an active block and a scratch pad block, to store the sectors of data of FIGS. 10A and 10B.

FIG. 11B shows an alternative storage arrangement using two metablocks, an active block and a scratch pad block, to store sectors of data of FIGS. 10A and 10B.

FIG. 12A shows two blocks, an active block and a scratch pad block, used to store sectors of data so that the sectors of data may be updated while stored without triggering a garbage collection operation.

FIG. 12B shows an alternative storage system to that of FIG. 12A allowing all sectors of a page to be updated while stored without triggering a garbage collection.

FIG. 12C shows another example of updating data using scratch pad block 1250.

FIG. 13 shows four threshold voltage ranges used to store two bits of data in a multi-level cell.

FIG. 14 shows two blocks of multi-level cells, an active block and a scratch pad block, where the scratch pad block keeps a copy of a lower page of an active block.

FIG. 15 shows sectors of data from two files stored in a block and the subsequent storage of the sectors of data when the two files are updated requiring more than one block of space in the memory array.

FIG. 16 shows an alternative system of updating the sectors of data of FIG. 15 where a scratch pad block stores some sectors before they are copied to an active block.

FIG. 17 shows a scratch pad block storing sectors of unrelated data in the same page and the subsequent copying of this data to different locations.

FIG. 18 shows a scratch pad block storing sectors of unrelated data undergoing multiple updates.

FIG. 19 shows a scratch pad block identified by a marking sector.

FIG. 20 shows the scratch pad block of FIG. 19 storing a group of sectors and an index sector.

FIG. 21 shows the scratch pad block of FIG. 20 storing a second group of sectors and a second index sector that supersedes the first index sector.

FIG. 22 shows the scratch pad block of FIG. 21 storing a third group of sectors and a third index sector that supersedes the second index sector.

FIG. 23 shows the scratch pad block of FIG. 22 with a fourth index sector that supersedes the third index sector when a group is copied to another block.

FIG. 24 illustrates an example of sectors in a logical group being updated and stored in an update block having single-sector pages in a conventional manner.

FIG. 34A illustrates a preferred data structure of the scratch pad block index (SPBI).

FIG. 34B illustrates example values in the Scratch Pad Block Index for the host write #1 shown in FIG. 33A.

DESCRIPTION OF EXEMPLARY EMBODIMENTS

Memory Architectures and Their Operation

Figure 25:
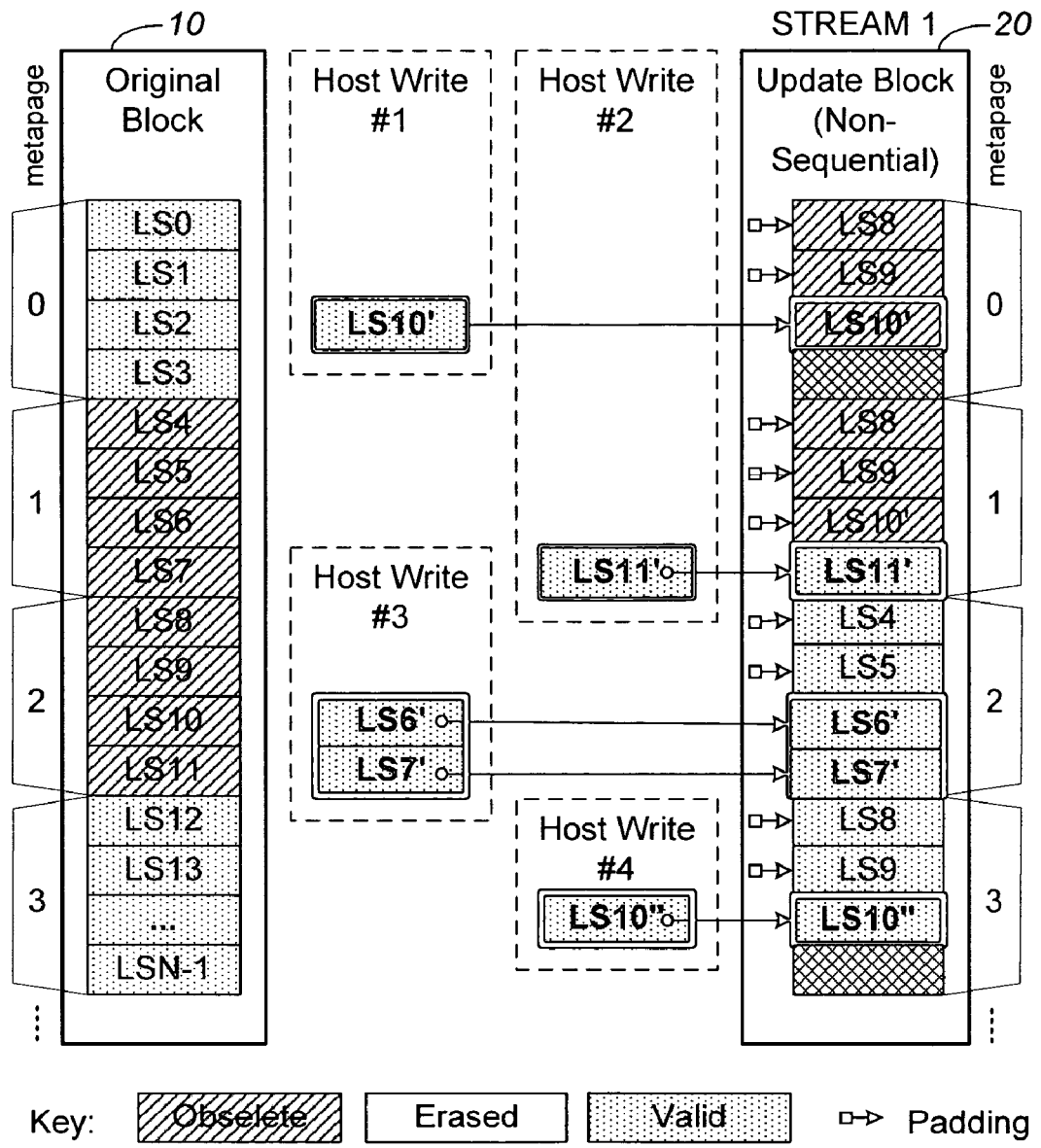
FIG. 25 illustrates the same sequence of writes shown in FIG. 24 as applied to a memory where the pages are multi-sector and possibly once-writable.

Referring initially to FIG. 1A, a flash memory includes a memory cell array and a controller. In the example shown, two integrated circuit devices (chips) 11 and 13 include an array 15 of memory cells and various logic circuits 17. The logic circuits 17 interface with a controller 19 on a separate chip through data, command and status circuits, and also provide addressing, data transfer and sensing, and other support to the array 13. A number of memory array chips can be from one to many, depending upon the storage capacity provided. The controller and part or the entire array can alternatively be combined onto a single integrated circuit chip but this is currently not an economical alternative.

A typical controller 19 includes a microprocessor 21, a read-only-memory (ROM) 23 primarily to store firmware and a buffer memory (RAM) 25 primarily for the temporary storage of user data either being written to or read from the memory chips 11 and 13. Circuits 27 interface with the memory array chip(s) and circuits 29 interface with a host though connections 31. The integrity of data is in this example determined by calculating an ECC with circuits 33 dedicated to calculating the code. As user data is being transferred from the host to the flash memory array for storage, the circuit calculates an ECC from the data and the code is stored in the memory. When that user data are later read from the memory, they are again passed through the circuit 33 which calculates the ECC by the same algorithm and compares that code with the one calculated and stored with the data. If they compare, the integrity of the data is confirmed. If they differ, depending upon the specific ECC algorithm utilized, those bits in error, up to a number supported by the algorithm, can be identified and corrected.

The connections 31 of the memory of FIG. 1A mate with connections 31' of a host system, an example of which is given in FIG. 1B. Data transfers between the host and the memory of FIG. 1A are through interface circuits 35. A typical host also includes a microprocessor 37, a ROM 39 for storing firmware code and RAM 41. Other circuits and subsystems 43 often include a high capacity magnetic data storage disk drive, interface circuits for a keyboard, a monitor and the like, depending upon the particular host system. Some examples of such hosts include desktop computers, laptop computers, handheld computers, palmtop computers, personal digital assistants (PDAs), MP3 and other audio players, digital cameras, video cameras, electronic game machines, wireless and wired telephony devices, answering machines, voice recorders, network routers and others.

The memory of FIG. 1A may be implemented as a small enclosed card containing the controller and all its memory array circuit devices in a form that is removably connectable with the host of FIG. 1B. That is, mating connections 31 and 31' allow a card to be disconnected and moved to another host, or replaced by connecting another card to the host. Alternatively, the memory array devices may be enclosed in a separate card that is electrically and mechanically connectable with a card containing the controller and connections 31. As a further alternative, the memory of FIG. 1A may be embedded within the host of FIG. 1B, wherein the connections 31 and 31' are permanently made. In this case, the memory is usually contained within an enclosure of the host along with other components.

FIG. 2 illustrates a portion of a memory array wherein memory cells are grouped into erase blocks, the cells in each erase block being erasable together as part of a single erase operation, usually simultaneously. An erase block is the minimum unit of erase in this type of memory.

The size of the individual memory cell erase blocks of FIG. 2 can vary but one commercially practiced form includes a single sector of data in an individual erase block. The contents of such a data sector are illustrated in FIG. 3. User data 51 are typically 512 bytes. In addition to the user data 51 are overhead data that includes an ECC 53 calculated from the user data, parameters 55 relating to the sector data and/or the erase block in which the sector is programmed and an ECC 57 calculated from the parameters 55 and any other overhead data that might be included.

One or more flags may also be included in the parameters 55 that indicate status or states. Indications of voltage levels to be used for programming and/or erasing the erase block can also be stored within the parameters 55, these voltages being updated as the number of cycles experienced by the erase block and other factors change. Other examples of the parameters 55 include an identification of any defective cells within the erase block, the logical address of the erase block that is mapped into this physical erase block and the address of any substitute erase block in case the primary erase block is defective. The particular combination of parameters 55 that are used in any memory system will vary in accordance with the design. Also, some or all of the overhead data can be stored in erase blocks dedicated to such a function, rather than in the erase block containing the user data or to which the overhead data pertains.

Different from the single data sector erase block of FIG. 2 is a multi-sector erase block of FIG. 4. An example erase block 59, still the minimum unit of erase, contains four pages 0-3, each of which is the minimum unit of programming. One or more host sectors of data are stored in each page, usually along with overhead data including at least the ECC calculated from the sector's data and may be in the form of the data sector of FIG. 3.

Re-writing the data of an entire block usually involves programming the new data into a block of an erase block pool, the original block then being erased and placed in the erase pool. When data of less than all the pages of a block are updated, the updated data are typically stored in a page of a block from the erased block pool and data in the remaining unchanged pages are copied from the original block into the new block. The original block is then erased. Variations of this large block management technique include writing the updated data into a page of another block without moving data from the original block or erasing it. This results in multiple pages having the same logical address. The most recent page of data is identified by some convenient technique such as the time of programming that is recorded as a field in sector or page overhead data.

A further multi-sector block arrangement is illustrated in FIG. 5. Here, the total memory cell array is physically divided into two or more planes, four planes 0-3 being illustrated. Each plane is a sub-array of memory cells that has its own data registers, sense amplifiers, addressing decoders and the like in order to be able to operate largely independently of the other planes. All the planes may be provided on a single integrated circuit device or on multiple devices, an example being to form each plane from one or more distinct integrated circuit devices. Each block in the example system of FIG. 5 contains 16 pages P0-P15, each page having a capacity of one, two or more host data sectors and some overhead data.

Yet another memory cell arrangement is illustrated in FIG. 6. Each plane contains a large number of erase blocks of cells. In order to increase the degree of parallelism of operation, erase blocks within different planes are logically linked to form metablocks. One such metablock is illustrated in FIG. 6 as being formed of erase block 3 of plane 0, erase block 1 of plane 1, erase block 1 of plane 2 and erase block 2 of plane 3. Each metablock is logically addressable and the memory controller assigns and keeps track of the erase blocks that form the individual metablocks. The host system preferably interfaces with the memory system in units of data equal to the capacity of the individual metablocks. Such a logical data block 61 of FIG. 6, for example, is identified by a logical block addresses (LBA) that is mapped by the controller into the physical block numbers (PBNs) of the blocks that make up the metablock. All erase blocks of the metablock are erased together, and pages from each erase block are preferably programmed and read simultaneously. A metablock may be considered the unit of erase in a system in which erase blocks are linked in this way. In some memory arrays having metablock architecture, pages may only be programmed in parallel with other pages of the metablock. In these memory arrays, a metapage is a minimum unit of programming of a metablock that consists of a page from each plane of the metablock.

There are many different memory array architectures, configurations and specific cell structures that may be employed to implement the memories described above with respect to FIGS. 2-6. One erase block of a memory array of the NAND type is shown in FIG. 7. A large number of column oriented strings of series connected memory cells are connected between a common source 65 of a voltage $V_{SS}$ and one of bit lines BL0-BLN that are in turn connected with circuits 67 containing address decoders, drivers, read sense amplifiers and the like. Specifically, one such string contains charge storage transistors 70, 71 . . . 72 and 74 connected in series between select transistors 77 and 79 at opposite ends of the strings. In this example, each string contains 16 storage transistors but other numbers are possible. Word lines WL0-WL15 extend across one storage transistor of each string and are connected to circuits 81 that contain address decoders and voltage source drivers of the word lines. Voltages on lines 83 and 84 control connection of all the strings in the erase block together to either the voltage source 65 and/or the bit lines BL0-BLN through their select transistors. Data and addresses come from the memory controller.

Each row of charge storage transistors (memory cells) of the erase block may form a page that is programmed and read together. An appropriate voltage is applied to the word line (WL) of such a page for programming or reading its data while voltages applied to the remaining word lines are selected to render their respective storage transistors conductive. In the course of programming or reading one row (page) of storage transistors, previously stored charge levels on unselected rows can be disturbed because of voltages applied across all the strings and to their word lines. This may prevent programming of cells of a particular row after other cells in the row have been programmed. Multiple state flash memories are particularly sensitive to disturbance. The increased number of logic states results in narrow threshold voltage ranges for individual states so that small changes in charge level may produce a change in logic state. As data storage density is increased by using increased numbers of logic states in a cell, sensitivity to disturbance increases. Thus, it may not be possible to program data to cells in a row after other cells in that row are programmed without corrupting the data in the programmed cells. Thus, disturbance from subsequent programming of adjacent cells may define the page size. If cells in a row may not be programmed subsequent to programming other cells in the same row, then the row defines the minimum unit of programming. Thus, a row of cells may contain one page of data. In such a memory array, if a group of cells in a row is programmed, the row is considered programmed even where some cells in the row contain no data. It is not efficient to have empty cells that cannot be subsequently programmed in the memory array.

Empty cells in a programmed page may result from small numbers of sectors being received by the memory system at a time. For example, a single sector may be sent by a host to a memory system. The sector is stored in a page of the flash memory array. The sector prevents subsequent writing to that page. In a memory system in which a page holds multiple sectors, this may be inefficient. For example, where a page comprises four sectors of data, a portion of the memory array that could hold three sectors of data is left empty when a single sector is written to the page. As page sizes increase, the wasted space from such partially filled pages increases. Metapages may contain large numbers of sectors so storage may be particularly inefficient in memory arrays that use metablocks. The problem is similar where two or more sectors are received but the number of sectors received is less than the number of sectors in a page. Such partial pages may be stored in the scratch pad block until a full page of data is received.

Subsequent to writing partially filled pages of data, consolidation of stored data may be performed to combine data from partially filled pages into filled pages. This may be done as part of periodically performed garbage collection. Such consolidation of data copies data from the partially filled pages to full pages that are in a different erase block. The erase blocks that hold the partially filled pages are then marked as obsolete so that they may be erased and reused. Such an operation may take system resources that could be used for other functions.

Example of Single Sector Writes to Memory

FIG. 8 shows an erase block, designated active block 800 of a memory array in a memory system in which a page is comprised of four sectors of data. Pages 0-5 are shown each extending in the horizontal direction. Each page may contain four sectors of data designated as sector 0, sector 1, sector 2 and sector 3. A host sends single sectors of data to the memory system, which are stored in active block 800. Sector X is received and stored as sector 0 of page 0. This prevents subsequent programming of page 0. Thus, sectors 1, 2 and 3 of page 0 are not programmed and remain empty (erased). After page 0 is programmed, sector X+1 is received. Sector X+1 is stored as sector 0 of page 1. Sectors 1, 2 and 3 of page 1 remain empty. After sector X+1 is programmed, sector X+2 is received. Sector X+2 is stored as sector 0 of page 2. Sectors 1, 2 and 3 of page 2 remain empty. After sector X+2 is programmed, sector X+3 is received. Sector X+3 is stored as sector 0 of page 3. Sectors 1, 2 and 3 of page 3 remain empty.

FIG. 9 shows an alternative way of storing sectors in an erase block, designated active block 900. Here, instead of storing just one sector per page, previously stored sectors are copied to a new page in the same erase block where they are stored with a more recently received sector. Sector X is stored as sector 0 of page 0 as before. Then, sector X+1 is received and stored as sector 1 of page 1 with sector X copied from page 0 to sector 0 of page 1. Thus, both sector X and sector X+1 are stored in page 1. Subsequently, sector X+2 is received and stored as sector 2 of page 2. Sector X is stored as sector 0 of page 2 and sector X+1 is stored as sector 1 of page 2. Thus, sectors X, X+1 and X+2 are stored together in page 2. Subsequently, sector X+3 is received and stored as sector 3 of page 3. Sector X is stored as sector 0, sector X+1 is stored as sector 1 and sector X+2 is stored as sector 2 of page 3. Thus, four sectors of data are stored in page 3 so that page 3 is fully populated with data.

Subsequent to the storage of sectors shown in FIGS. 8 or in FIG. 9, data may be consolidated. Sectors X, X+1, X+2 and X+3 of either FIG. 8 or FIG. 9 may be copied to a single page of a new erase block. This may be done as part of garbage collection at a time when it is convenient. FIG. 10A shows sectors X, X+1, X+2 and X+3 stored in page 0 of designated active block 1000. Page 0 of erase block 1000 is filled with data. When page 0 of active block 1100 is programmed with sectors X, X+1, X+2 and X+3, sectors X, X+1, X+2 and X+3 may be erased from the erase block from which they were copied. Active blocks 800, 900 may be erased and made available for storage of new data when their contents are consolidated during garbage collection.

Subsequent to programming of page 0, sector X+4 is received and is stored as sector 0 of page 1 of active block 1000. Then, sectors X+5, X+6 and X+7 are individually received and stored in pages 2, 3 and 4 respectively. Consolidation of sectors may be needed again to consolidate sectors X+4, X+5, X+6 and X+7 to a single page. Such consolidation of sectors takes time during which host data may not be written. After the second consolidation of data to another erase block, erase block 1000 from which they are copied is marked as obsolete and may subsequently be erased.

FIG. 10B shows an active block 1010 after the second garbage collection operation relocates data from the previous active block 1000. Sectors X+4 to X+7 are consolidated into a single page (page 1) of active block 1010. Subsequently, more sectors may be received and may be stored in active block 1010. If such sectors are received in the form of single sectors, a single sector may be stored in a page as before.

FIG. 10C shows active block 1010 with additional sectors X+8 to X+11 stored in pages 2-5. Another garbage collection operation may be needed to consolidate sectors X+8 to X+11 at this point. Thus, in order to efficiently store sectors that are received from a host as single sectors, this method uses multiple garbage collection operations that require transferring data from one erase block to another erase block and erasing the first erase block. In larger erase blocks, the number of garbage collection operations is larger. In memory systems that use metablocks, a group of erase blocks may be linked so that they are erased together and programmed together. Data may be programmed in metapages containing many sectors. Therefore, storing single sectors becomes very inefficient because of the amount of garbage collection necessary.

FIG. 11A shows an alternative method of storing data. FIG. 11A shows two erase blocks of a memory array. Active block 1110 is an erase block in which data may be programmed for long-term storage. Scratch pad block 1120 is an erase block in which data may be programmed for short-term storage. When small numbers of sectors are received, they are first stored in scratch pad block 1120. Sectors continue to be stored in scratch pad block 1120 until enough sectors are received to fill a page of data. These sectors are then copied to a page of active block 1110.

Sector X is received and programmed as sector 0 of page 0 in scratch pad block 1120 as before. Subsequently, sector X+1 is received and stored as sector 1 of page 1 of scratch pad block 1120 with sector X copied to sector 0 of page 1. Subsequently, sector X+2 is received and stored as sector 2 of page 2 of scratch pad block 1120 with sectors X and X+1 stored as sector 0 and sector 1 of page 2 respectively. Subsequent to storing sector X+2 in scratch pad block 1120, sector X+3 is received. At this point, sectors X, X+1, X+2 and X+3 are written to page 0 of active block 1110. These four sectors form a full page of data. Thus, sectors X, X+1, X+2 and X+3 are efficiently stored in page 0 of active block 1110. Subsequently, sectors X+4, X+5, X+6 and X+7 are individually received. Sectors X+4, X+5 and X+6 are stored in pages 3, 4 and 5 of scratch pad block 1120 and are copied to sectors 0, 1 and 2 of page 1 of active block 1110 when sector X+7 is received. Sector X+7 is programmed directly to sector 3 of page 1 of active block 1110. At this point, scratch pad block 1120 has no available pages for storing data and may be designated as being ready for erase (obsolete). A new erase block may be designated as a scratch pad block for the next sector, or group of sectors, to be received. While this example shows single sectors being received, this method may also be used for groups of sectors where the group of sectors has fewer sectors than the number of sectors in a page. Also, while the above examples show writing data from a scratch pad block to an active block with maximum parallelism, such writing may be done with less than maximum parallelism and still provide an efficiency benefit. Thus, sectors are written to the scratch pad block with one degree of parallelism and subsequently written to another block with a higher degree of parallelism so that the data is more densely packed and requires less frequent garbage collection.

A scratch pad block may also be used in memory arrays that use metablocks. For example FIG. 11B shows two metablocks, active block 1130 and scratch pad block 1140. Both active block 1130 and scratch pad block 1140 have four planes, indicated as planes 0-3. Each plane is one sector wide, so four sectors are stored in a metapage of block 1130 or 1140. Both blocks have 6 metapages, indicated as metapage 0-5. The technique for efficiently storing data is the same as that described above with respect to erase blocks. Sectors are accumulated in scratch pad block 1140 until a full metapage of data is available at which time a full metapage is programmed to active block 1130. For example, when sector X+3 is received, a full metapage (sectors X, X+1, X+2 and X+3) is programmed to metapage 0 of active block 1130. A metapage may have a large number of sectors because metablocks may have many planes and planes may be several pages wide. The technique described above is particularly valuable for such large metapages because of the large amount of space in the memory array that would otherwise be wasted. As shown with respect to FIGS. 11A and 11B, aspects of this invention described with respect to examples using erase block architecture may also be applied to metablock architecture and vice versa. The term "block" may indicate either an erase block or a metablock depending on the configuration of the memory array. In either case, a block is the unit of erase used in that configuration. Similarly, the term "page" may refer to either a page within a single erase block or a metapage of a metablock. In either case, a page is the unit of programming for the configuration.

Where a group of sectors is received that has more than the number of sectors in a page, sectors may be programmed directly to the active block of the memory array without first being stored in the scratch pad block. Thus, full pages of data may be programmed directly to the active block with a high degree of parallelism, while partial pages of data are programmed to the scratch pad block with a lower degree of parallelism until they may be written as part of a full-page program to the active block. A controller may determine the destination for a particular sector or group of sectors. Where writing a group of sectors to the active block would include both partial-page and full-page writes, the full-pages may be written to the active block and the partial page may be written to the scratch pad block.

FIG. 12A shows a further example where sectors from a host are updated while they are stored in a scratch pad block. A first sector $X_0$ is received and stored in page 0 of scratch pad block 1250. A page in this example stores four sectors of data. A replacement for $X_0$, shown as $X_1$, is then received. The sectors in this example are numbered according to their logical address, with a subscript to indicate whether the sector is an update and if so, which version. Thus, sector $X_1$ is a sector with logical address X and is the first updated version of this sector. This is a sector of data that has the same logical address as $X_0$ but may contain different data reflecting some updated information. Sector $X_1$ is written to page 1 of scratch pad block 1250. The controller keeps track of which sectors are current and which are obsolete. In scratch pad block 1250, the most recently written copy of a sector with a particular logical address is the current version. Any other version is obsolete. Thus $X_0$ becomes obsolete when $X_1$ is programmed. Subsequent to receiving sector $X_1$, sector $(X+1)_0$ is received. This is a sector that is logically sequential to sector $X_1$. Both sectors $X_1$ and $(X+1)_0$ are written to page 2. Subsequently, sector $(X+1)_0$ is replaced by $(X+1)_1$. This is an updated version of sector $(X+1)_0$ that replaces sector $(X+1)_0$. Sector $(X+1)_1$ is written to page 3 along with sector $X_1$. Subsequently, sector $(X+2)_0$ is received and written to page 4. Sector $(X+2)_0$ is subsequently replaced by sector $(X+2)_1$ and written to page 5 along with sectors $X_1$ and $(X+1)_1$. Subsequently, sector $(X+3)_0$ is received. Thus, a page of data (sectors $X_1$, $(X+1)_1$, $(X+2)_1$ and $(X+3)_0$) are available. Sectors $X_1$, $(X+1)_1$, $(X+2)_1$ and $(X+3)_0$ are written to a block designated as active block 1252. Sectors $X_1$, $(X+1)_1$, $(X+2)_1$ and $(X+3)_0$ are written to active block 1252 with parallelism of a full page write. This is the maximum possible parallelism in this case. Thus, even though sectors $X_1$, $(X+1)_1$, $(X+2)_1$ and $(X+3)_0$ were written to the scratch pad block 1250 with a low degree of parallelism, they are subsequently written to active block 1252 with a high degree of parallelism. This means that sectors $X_1$, $(X+1)_1$, $(X+2)_1$ and $(X+3)_0$ are more efficiently stored in the active block. More efficient storage may result in garbage collection being necessary less frequently, thus improving performance.

An alternative example is provided in FIG. 12B. This example is similar to that shown in FIG. 12A but here sector $(X+3)_0$ is stored in scratch pad block 1250 prior to being copied to active block 1252. This allows sector $(X+3)_0$ to be updated before it is written to active block 1252. Sector $(X+3)_0$ is shown being updated by being replaced by sector $(X+3)_1$. The complete page of data (sectors $X_1$, $(X+1)_1$, $(X+2)_1$ and $(X+3)_1$) may be held in scratch pad block 1250, ready to be updated, until some triggering event. In this case, sector $(X+4)_0$ is received, providing a triggering event. Sectors $X_1$, $(X+1)_1$, $(X+2)_1$ and $(X+3)_1$ are written to active block 1252 at this point with maximum parallelism. Sector $(X+4)_0$ is written to the next available page (page 8) in scratch pad block 1250.

FIG. 12C shows another example of updating data using scratch pad block 1250. Sectors of data $X_0$ to $(X+15)_0$ are stored in an original block 1254. A host sends sector $(X+6)_1$, which is an updated sector with the same logical address as sector $(X+6)_0$. Thus, sector $(X+6)_1$ is to replace $(X+6)_0$. In order to replace sector $(X+6)_0$, page 1 of original block 1254 (containing sectors $(X+4)_0$ to $(X+7)_0$) is combined with sector $(X+6)_1$ and the combination is written to page 0 of scratch pad block 1250. Combining these sectors may take place in a Random Access Memory such as controller ram 25 or may be done in memory registers that are connected to the memory array. The updated page data may be kept in scratch pad block 1250 without writing it to an active block for some time. Where a subsequent updated sector $(X+5)_1$ is received from a host, the data may be updated in scratch pad block 1250 by writing sector $(X+5)_1$ along with copied sectors $(X+4)_0$, $(X+6)_1$, and $(X+7)_0$ to another page of scratch pad block 1250 (in this case, page 1). Multiple updates of a page of data in scratch pad block 1250 may be performed in this way. An update is carried out by replacing the updated sector or sectors of data and copying of unchanged sectors of data in a new page of scratch pad block 1250. The copied sectors are copied within the same plane so that copying may be efficiently performed. Subsequently, the updated page of data may be copied to active block 1252 in the memory array. Non-sequential updates may be performed in this way without requiring a chaotic update block. For example, updated sectors $(X+6)_1$ and $(X+5)_1$ are received non-sequentially in the above example, but active block 1252 is sequential. Multiple pages of data may be held and updated at the same time in a scratch pad block in this way. A page may be copied to an active block when the page is no longer expected to be updated.

Example of Multi-Level Cell Programming

Certain kinds of memories may store more than one bit of data in each cell of the memory array by dividing the threshold voltage range of a floating gate memory cell into more than two levels. FIG. 13 shows an example of how such multi-level cell (MLC) memories may be programmed to provide multiple threshold voltages that signify different logical states. Four different threshold voltages are shown, labeled A, B, C and D. Multiple cells are programmed to each voltage. FIG. 13 represents the distribution of cell states with the number of cells represented on the vertical axis. Each threshold voltage A, B, C and D represents a different logical state. The four states represent two bits of data, one bit from a lower page of data and one bit from an upper page of data as indicated. In some examples, the lower page may be programmed first. After programming of the lower page, the cell is in state A or B. Subsequently, the upper page may be programmed so that the cell either stays in states A or B (for upper bit=1) or is modified to states C or D (for upper bit=0). Because these four states each have relatively narrow voltage windows, MLC memories are particularly vulnerable to corruption of data from relatively small changes in threshold voltages. In some examples, it may be advantageous to program both lower and upper pages simultaneously. This may help to reduce corruption of data in a cell caused by programming of adjacent cells, such as may occur during programming of upper page data.

FIG. 14 shows an example of how a scratch pad block 1460 may be used to reduce corruption of data in MLC memories. FIG. 14 shows both active block 1462 and scratch pad block 1460 as blocks of MLC memory. Pages of both blocks are numbered and shown as either "upper" or "lower" depending on which threshold voltage states are used to store the bits of data of the page. In this example, the memory first receives sectors X to X+3 and stores these sectors in lower page 0 of scratch pad block 1460. Subsequently, the memory receives sectors X+4 to X+7. At this time, both the lower page (sectors X to X+3) and the upper page (X+4 to X+7) are written simultaneously to active block 1462. This may avoid corruption of lower page 0 of active block 1462 during programming of upper page 0 of active block 1462. Typically, the time necessary to program the upper and lower pages together is the same as the time necessary to program the upper page alone so that this system does not carry a time penalty. Subsequent to programming of lower page 0 and upper page 0 of active block 1462 with sectors X to X+7, sectors X+8 to X+11 are received and are programmed to upper page 0 of scratch pad block 1460. When sectors X+12 to X+15 are received, sectors X+8 to X+11 and sectors X+12 to X+15 are programmed in parallel to upper page 1 and lower page 1 of the active block. This system is continued for subsequent sectors of data as shown. Thus, a page of data is written to scratch pad block 1460 and subsequently this page is written together with an additional page to active block 1462 as upper and lower pages of the same group of memory cells. Programming to scratch pad block 1460 occurs with the parallelism of a page, while programming to active block 1462 takes place with double the parallelism of a page.

In an alternative embodiment, the upper and lower pages may be written to an active block at different times but a copy of the lower page is kept in a scratch pad block in case the lower page in the active block becomes corrupted during programming of the upper page. In FIG. 14, sectors X to X+3 may be received and programmed to both the lower page 0 of active block 1462 and to lower page 0 of scratch pad block 1460 at the same time. Subsequently, sectors X+4 to X+7 are received and are programmed to upper page 0 of active block 1462. Sectors X+4 to X+7 are not saved in scratch pad block 1460. If there is any problem during the programming of X+4 to X+7 to upper page 0 of active block 1462 (such as loss of power), the data in lower page 0 of active block 1462 could be corrupted. That is, the threshold voltage of the cells being programmed could be modified so that they are no longer in a state representing data of the lower page but have not been fully programmed to a state representing data of the upper page. For example, a cell that is being programmed from state A in FIG. 13 to state D could be in state B or C at a time when programming stops. If data is corrupted in this manner the upper page of data that is being written may be recovered from the location from which it is being copied. However, in many cases, no other copy of the lower page exists. Here, a copy of the lower page is kept in scratch pad block 1460 until the programming of the upper page is completed. Thus, an uncorrupted copy of the lower page exists and may be used to recover the data of the lower page.

Examples of Multiple Files

Data from more than one host data file may be stored in a single block. The break between files may occur within a page so that part of a page contains data from one file and part of a page contains data from another file. FIG. 15 shows an example where page 0 to page i−1 of original block 1570 contain data from a first file (file 1) and page i+1 to page n−1 contain data from a second file (file 2). Page i contains sectors (i*4) and (i*4)+1 from file 1 and sectors (i*4)+2 and (i*4)+3 from file 2. The sectors of file 2 are shaded to illustrate that sectors from two files are present.

FIG. 15 shows file 2 being updated to a new block 1572. The first page (page 0) of new block 1572 is written with the contents of page i of original block 1570. Thus, page 0 of new block 1572 contains sectors from both file 2 and file 1. Sectors (i*4) and (i*4)+1 from file 1 are not updated at this point but may be copied in order to program a full page of data. The remainder of updated file 2 is programmed to pages 1 to i−I of new block 1572. Subsequently, file 1 is updated. Sector 0 to sector (i*4)−1 are stored in page i to page n-1. However, sectors (i*4) and (i*4)+1 are also part of file 1 and must be updated. Because new block 1572 is full at this point, the updated sectors (i*4) and (i*4)+1 are programmed to another block. Subsequently, sectors (i*4) and (i*4)+1 and the sectors in new block 1572 may be consolidated to a single block as part of a garbage collection operation. However, this takes time and system resources and is generally undesirable.

FIG. 16 shows an alternative technique for updating sectors of original block 1570 of FIG. 15 that contains sectors from two different files. This technique uses a scratch pad block 1674 to store updated sectors until such time as they may be written as part of a full updated page with the maximum parallelism of the system. When file 2 is updated, updated sectors (i*4)+2 and (i*4)+3 are written to scratch pad block 1674. Here, they are written to page 0 of scratch pad block 1674 and no data is written to the rest of the page so that a low degree of parallelism is used. The remaining sectors of file 2 (sectors (i*4)+4 to N-1) are copied to pages 0 to n-i of a new block 1676. These sectors are all written in full-page writes using the maximum parallelism. Subsequently, file 1 is updated. Sectors 0 to (i*4)−1 are programmed with maximum parallelism into pages n-i+1 to n-2. Sectors (i*4) and (i*4)+1 of file 1 are then written in parallel with copying of sectors (i*4)+2 and (i*4)+3 to page n-1 of new block 1676. Thus, an updated copy of all the sectors that were previously held in original block 1570 are now held in new block 1676 and no obsolete data is held in new block 1676. There is generally no need to garbage collect a block such as new block 1676. Each page of new block 1676 is programmed with maximum parallelism to achieve maximum density of data in the block. Sectors (i*4)+2 and (i*4)+3 in scratch pad block 1674 may be marked as obsolete at this point. However, scratch pad block 1674 may be used for further operations without requiring a garbage collection operation because the scratch pad block routinely contains both current and obsolete data.

Example of Storing Non-Sequential Sectors of Data

In some of the previous examples, sectors of data are written to the scratch pad block with a degree of parallelism that is less than that of writing a complete page. In such examples, the remaining space in the page of the scratch pad block that is being written may remain empty because it is not possible to program it later without disturbing already-stored data. In some cases, it is possible to use this otherwise empty space and otherwise unused programming bandwidth to store unrelated data in the same page. For example, where a memory system receives host data in single sectors or groups of sectors less than a page, these sectors of host data may be stored in the scratch pad block in pages that also hold unrelated data such as unrelated host data or sectors of control data. Similarly, sectors from the beginning of a file that are being stored in a scratch pad block for later storage as part of a fill page may have additional sectors stored in the same scratch pad block page that are not logically related.

FIG. 17 shows an example where sectors X, X+1 and X+2 are stored in a scratch pad block 1780 as in previous examples. However, here the remaining space in the pages of the scratch pad block holding sectors X, X+1 and X+2 are used to store other data. Sectors Y, Y+1 and Y+2 are stored with sector X in page 0. Sectors Y, Y+1 and Y+2 may be logically unrelated to sectors X, X+1 and X+2. They may be from another host data file or from another cluster of sectors within the same file. Sectors Y, Y+1 and Y+2 may be non-sequential with sectors X, X+1 and X+2 and may be separated in logical address space. Similarly, sectors Z and Z+1 are stored in page 1 with sectors X and X+1. Sectors Z and Z+1 may be logically unrelated to both sectors X, X+1 and X+2 and sectors Y, Y+1 and Y+2. Sectors X, X+1, X+2 and X+3 are subsequently written to a page of another block when sector X+3 is received. Sectors Y, Y+1, Y+2 and Y+3 are written to a page of another block when sector Y+3 is received. Thus, unrelated data may be stored in the same page of the scratch pad block to more efficiently use the available resources.

FIG. 18 shows another example of unrelated data stored in a scratch pad block 1890. Here, sectors X, X+1 and X+2 are stored and updated as before. However, here sector Y is also stored and updated in parallel. Updated sectors are denoted by a subscript indicating what version is stored. For example, sector $X_0$ is the original version of sector X, while $X_1$ is the first updated version of sector X. Sector Y may be a sector of host data or a sector of control data that is frequently updated. In some systems, control data such as FAT information is updated as host data is stored. Where small amounts of host data are received it may be advantageous to update the control data in scratch pad block 1890. This may avoid updating a control structure where only a single sector of control data is updated. At some later time, the control data structures may be updated using control data from the scratch pad block.

Scratch Pad Block Management

A scratch pad block may be a designated block in the memory array. A fixed physical location may be chosen as the scratch pad block. However, this may result in uneven wear of the memory array. Alternatively, the designated block may be changed from time to time so that as the scratch pad block becomes filled with obsolete data, another erase block is chosen as the scratch pad block. In this case, data structures used by the memory controller may identify the location of the scratch pad block or the designated scratch pad block may be marked so that if the controller scans the erase blocks of the memory array it may determine which erase block is the scratch pad block. A scratch pad block may be marked using a sector to identify it as a scratch pad block. For example, FIG. 19 shows marking sector 2110 as the first sector of scratch pad block 2100. When the card is powered on, the erase blocks of the memory array (or a portion of the memory array) may be scanned to determine the location of a scratch pad block or scratch pad blocks. In the example of FIG. 19, the first sector of each erase block is read to see if it is a marking sector indicating a scratch pad block.

Data may be written to a scratch pad block as a data group. A data group is a logically sequential group of sectors received from a host. When a data group is stored in the scratch pad block, an index sector is also written that provides information about the data group stored. The locations of the sectors of the data group may be stored in an index sector. A scratch pad block such as scratch pad block 2100 of FIG. 19 may be used to store multiple data groups. FIG. 20 shows scratch pad 2100 storing one data group. Data group 1 consists of two sectors 2220, 2221. These sectors, marking sector 2110 and an index sector 2230 are stored in scratch pad 2100. Index sector 2230 stores information about group 1.

FIG. 21 shows scratch pad block 2100 of FIG. 20 after data group 2 consisting of two sectors 2340, 2341 is programmed. Index sector 2350 is a new index sector that stores information about group 1 and group 2. Thus, index sector 2230 is obsolete because index sector 2350 contains a complete record of the data groups of scratch pad block 2100 including group 1.

FIG. 22 shows scratch pad block 2100 of FIG. 21 after programming of data group 3 consisting of sectors 2460, 2461 and 2462. Index sector 2470 is a new index sector that stores information about data groups 1, 2 and 3. Index sector 2470 contains a complete record of the data of scratch pad block 2100 and thus makes index sector 2350 obsolete.

FIG. 23 shows scratch pad block 2100 of FIG. 22 after data group 1 and data group 2 are read from scratch pad block 2100 and are written as a single page in another block of the memory array. Index sector 2560 stores information about data group 3. Data group 1 and data group 2 in scratch pad 2100 are obsolete and do not require indexing because they are stored elsewhere. Thus, index sector 2560 contains a complete record of all current data in scratch pad block 2100.

When a host requests a sector or sectors of data from the memory array, a controller may first check if the requested sectors are in the scratch pad block. If the sectors are not present in the scratch pad block, the sectors may be sought in the regular manner. Thus, the scratch pad does not require changes to the regular media management used to keep track of the locations of sectors of data in the memory array.

Multi-Stream Updating and Indexing

FIG. 24 illustrates an example of sectors in a logical group being updated by storing the updates in an update block having single-sector pages in a conventional manner. The data is packaged into logical sectors and stored in metablocks (also simply referred to as "blocks") where all logical sectors of a metablock are erasable together. The data is recorded into a block page by page, where all logical sectors within each page are programmable together. The example shows a single-sector page with each sector typically of size about 512 byte. At some instance, an 'original' block 10 is formed with an entire logical group of sectors stored in it according to a predetermined order, such as ordered in ascending logical sector numbers. Such as block is regarded as an intact block having intact all sectors of the logical group preferably in sequential order.

Thereafter, when a host sends updates as latest versions of some of these logical sectors of the logical group, the updated sectors are written to an update block 20 dedicated to the logical group. If the update data turns out to be in the predetermined order, it could be recorded in the update block sequentially. The update block is regarded to be a sequential update block with the potential of becoming an intact block. On the other hand, when update sectors are not in sequential order, the update block is regarded as non-sequential, or "chaotic". In this case, any latest version of sectors will eventually be copied elsewhere to form a new intact block.

In host write #1, updated logical sector LS10' is sent to the memory and recorded in page 0 of the update block 20. In host write #2, updated logical sector LS11' is sent to the memory and recorded in the next available location, page 1, in the update block 20. In host write #3, updated logical sectors LS6' and LS7' are recorded in pages 2 and 3 respectively. Finally, in host write #4, updated logical sector L10" is sent to the memory and recorded in page 4 of the update block. The updating of the logical group is said to form a stream, e.g., STREAM 1, with the update data streaming to the update block from the host. In general, if there are multiple versions of a logical sector distributed among the original block and the update block, only the most recently written version will be the valid one that renders all previous versions obsolete. For example, FIG. 24 shows LS10" recorded in page 4 of the update block, being the most recently written version, and therefore is the current valid sector for the data of logical sector number 10. The previous versions, LS10 in the original block 10 and LS10' in the update block 20 are obsolete.

Eventually, the update block will be closed out and the valid sectors (latest version of logical sectors) between the update block and the original block will be consolidated in the predetermined order to form a new original block. The obsolete original block and update block will be recycled.

FIG. 25 illustrates the same sequence of writes shown in FIG. 24 as applied to a memory where the pages are multi-sector and possibly once-writable. The example page structure differs from that shown in FIG. 24 in that each page now contains four sectors instead of one and, in some embodiment, can only be written once after an erase. In keeping with existing terminology, a memory device-imposed minimum unit of programming will be referred to as a 'physical page' whereas a system-imposed minimum unit of programming will be referred to as a 'metapage', which may be constituted from multiple physical pages. For expediency, 'metapage' and 'page' will be used interchangeable unless otherwise stipulated.

As before, each logical sector is originally stored sequentially in ascending logical number order in an original block 10. If the block has a four-sector page structure, then the block will be further partitioned into pages and each logical sector preferably have a definite page offset in each page. For example, page P0 has logical sectors LS0-LS3 stored in it. Thus LS0 is stored in the first of the four slots of the page and LS1 is stored in the second slots, etc. In the four-sector page example, the page offset for a given sector LSn will be given by MOD [(n+1), 4] if the first logical sector of the block is numbered as LS0.

Each time a host writes to a memory, it issues a write command to write a number of data units, typically logical sectors, followed by transmission of the logical sectors themselves. To prevent loss of data, the protocol between the host and the memory is such that the next host write will not commence until after the current write data has been successfully written to memory.

As explained earlier, in a memory architecture with multi-sector pages, it is preferable to implement sector alignment in a page as this avoid the need for re-alignment during garbage collection. Thus, the sectors received from each host write, when aligned, do not necessary fill an integral number of pages in an update block. This could result in a partially filled page being programmed. The partially filled page could have gaps before or after the host data. These gaps can also be pre-padded or post-padded with existing logical sectors in order to preserve the sequential order as much as possible. It is generally preferably not to post-pad the partial page in case the next host write is the next logical sector. However, in the case of a memory architecture with once-writable pages, there is no option of rewriting the unfilled portion of a partial page once it has been written.

In the examples the number of valid pages in one of the update streams (SPB) has been optionally limited to one. This is enough to illustrate the principle, but it should be noted, that more than one page can be stored in SPB, where more information (older Write-pointers for example) need to be analysed in order to find the latest written sectors.

For example in FIG. 25, in host write #1, updated sectors LS10' is stored in the third offset of the page P0 of the update block 20. Optionally, for completeness the first two slots can be padded with valid data such as LS8 and LS9 from the original block 10. However, this still leaves the fourth slot unfilled when the page P0 is saved at the end of the host write #1. The partial page can be optionally post-padded with the latest version of LS11. Since the page is once-writable, the unfilled fourth slot will be closed to further programming.

In host write #2, the command is to write the received updated sector LS11' which turns out to be in sequential order from the last sector LS10'. Ideally, this should be recorded in the next slot after LS10' in P0. However, P0 is closed to further writes and therefore, LS11' is stored in the next empty page P1 at the last slot, which is its proper page offset. The first three slots of P1 are padded with LS8, LS9 and LS10', which are valid versions of logical sectors that sequentially precede LS11'.

In host write #3, the command is to write LS6' and LS7'. These are written to P2, which is the next empty page in the update block, at the third and fourth slots respectively. The first and second slots are padding with valid data such as LS4 and LS5.

Finally, in host write #4, the command is to write LS10" and this is stored in P3, slot 3, while slots 1 and 2 are padded with LS8 and LS9 respectively and slot 4 is left empty.

It can be seen that the update block is used inefficiently with much padding and dead spaces while trying to maintain sector alignment within each once-programmable page. An undesirable feature is that even if the host writes sequentially (sector 10, then 11 in two separate write commands) the update block stops being sequential, and cannot become intact, as it has some obsolete data.

In order to avoid the above-mentioned problems and to minimize inefficient storage in the update block 20 due to partially filled pages, as well as excessive padding, it has been described earlier to use an additional scratch pad block 30. The scratch pad block (SPB) 30 serves as a temporary buffer and staging area for incoming data so that a full page of data could be staged before being written to an update block 20. In the four-sector page example above, the sectors are staged so that four sectors are written to completely fill a page in the update block. In the case when the host writes sequential data in separate writes, the SPB allows to buffer the partial page writes and keep the update block sequential. However, it also means that valid data may now distribute over the SPB in addition to the original and update blocks.

For expediency, the page size of the scratch pad block is the same as that of the update block, although in general they can be different. For example, the pages of the scratch pad block can have the size of a physical page if the memory system supports programming at the physical page level.

Scratch Pad Block and Update Block Index Management

U.S. patent application Ser. No. 10/917,725 filed Aug. 13, 2004 discloses a memory system with block management, which entire disclosure is hereby incorporated herein by reference. The block management provides an update block to be associated with each logical group of data under update. Disclosed are examples of various indexing schemes to locate valid data that may reside either on the original block or the update block. In particular, when the update block contains logical sectors in non-sequential order, it is considered to be a "chaotic update block" A chaotic update block index ("CBI") is used to keep track of the logical sectors recorded in the chaotic update block.

SPBI/CBI Indices Saved in a Scratch Pad Block

According to another aspect of the invention, when a scratch pad block is employed in addition to an update block, an associated scratch pad block index ("SPBI") is used to keep track of the update sectors recorded in the scratch pad block. This is in addition to an index (e.g., "CBI") used to keep track of the logical sectors recorded in the update block. Whenever user data is stored in a partial page of the scratch pad block, it means that at least the last slot of the page is unfilled. In one embodiment, the SPBI can be stored in the last slot of the partial page in the scratch pad block. In a preferred embodiment, the SPBI and the CBI can be packaged within a SPBI/CBI sector and stored at the last slot of a partial page in the scratch pad block which is unused anyway. Every time a new partial page is written, an updated SPBI/CBI sector is written at the end slot, rendering all previous versions obsolete.

Figure 26:
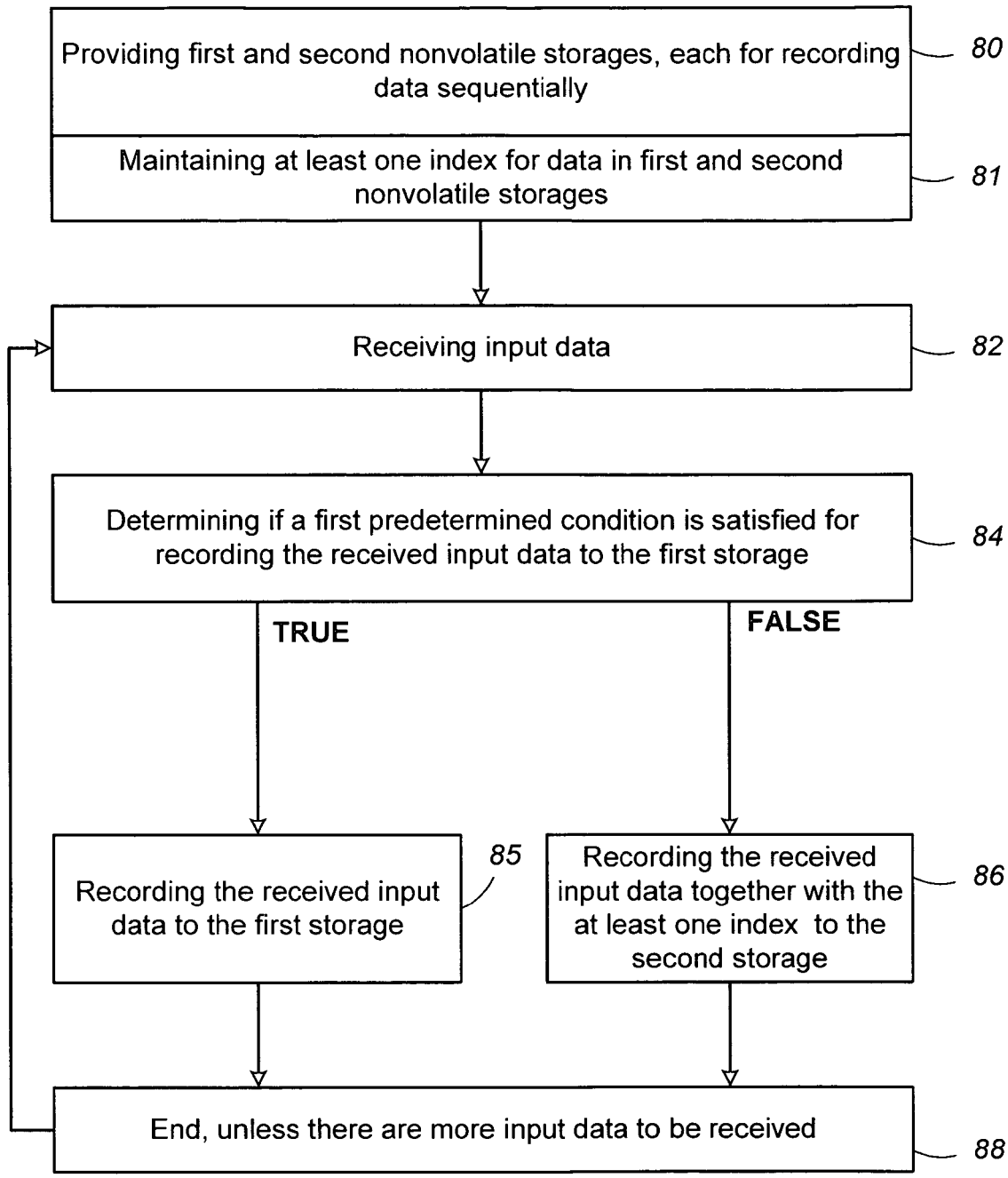
FIG. 26 is a flowchart illustrating a method of updating data by employing a first memory block in conjunction with a second memory block, with an index of the stored data saved in the second block, according to a general embodiment of the invention.

FIG. 26 is a flowchart illustrating a method of updating data by employing a first memory block in conjunction with a second memory block, with an index of the stored data saved in the second block, according to a general embodiment of the invention.

STEP 80: Providing first and second nonvolatile storages, each for sequentially recording data.

STEP 81: Maintaining at least one index of data that has been recorded in first and second nonvolatile storages.

STEP 82: Receiving input data.

STEP 84: Determining if a first predetermined condition is satisfied for recording the buffered input data to the first storage. If satisfied, proceeding to STEP 85, otherwise proceeding to STEP 86.

STEP 85: Recording the buffered input data to the first storage. Proceeding to STEP 88.

STEP 86: Recording the buffered input data together with the at least one index to the second storage. Proceeding to STEP 88.

STEP 88: Proceeding to STEP 72 if there are more input data to be processed, otherwise ending process.

Figure 27A:
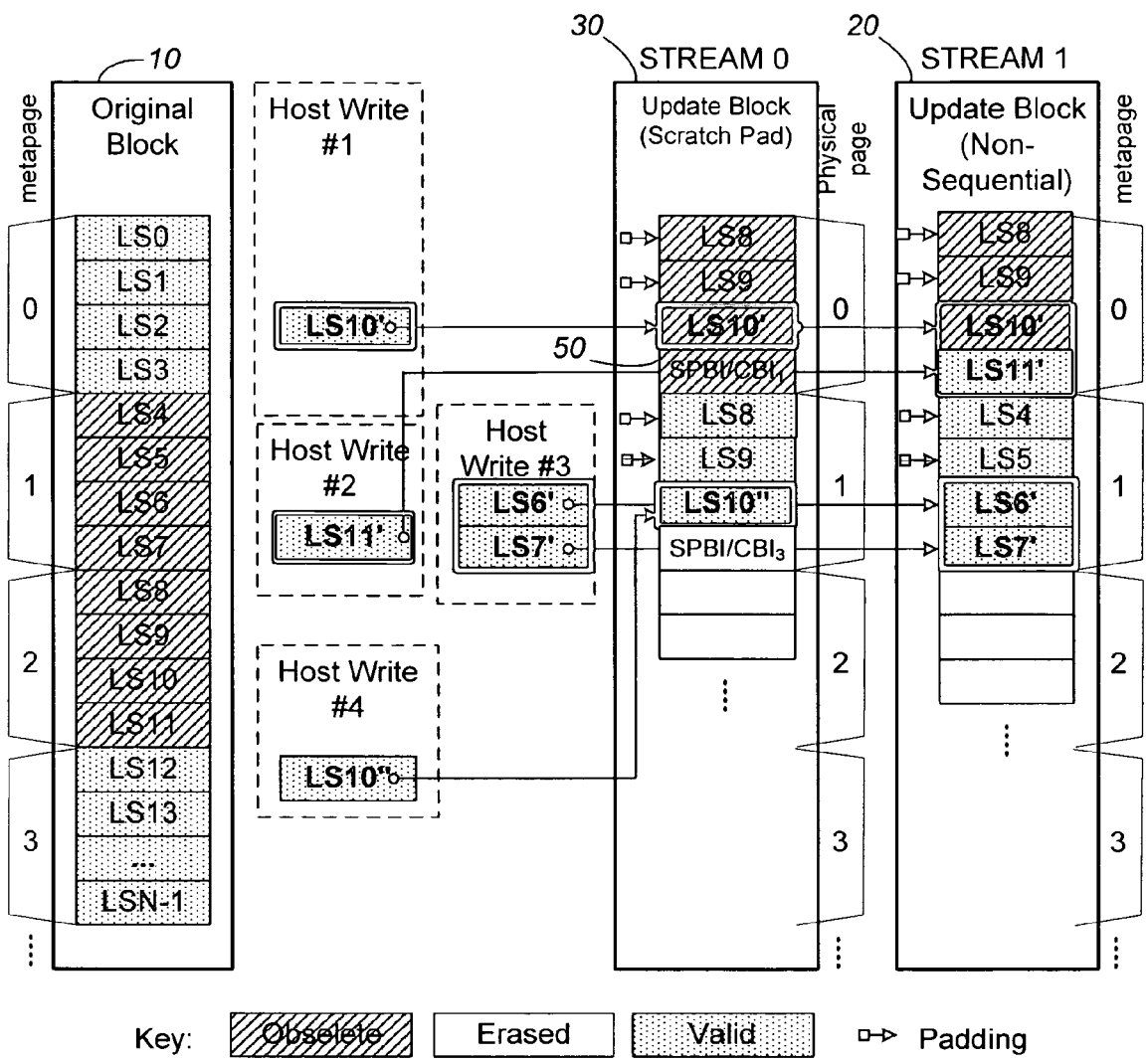
FIG. 27A illustrates a specific example of updating data and maintaining indices by employing an update block in conjunction with a scratch pad block, according to a preferred embodiment of the invention

FIG. 27A illustrates a specific example of updating data and maintaining indices by employing an update block in conjunction with a scratch pad block, according to a preferred embodiment of the invention. Each block is a metablock where all its memory locations are erasable together. The block is organized into pages where all memory locations within a page are programmable together. Furthermore, each page has a size that stores more than one sector and is once-writable each time the block has been erased.

A scratch pad block ("SPB") 30 is provided in addition to the update block ("UB") 20. If 'STREAM 1' is used to label the flow of data to the update block 20, the corresponding flow to the scratch pad block 30 will be labeled as 'STREAM 0'.

The same host writes example in FIG. 24 and FIG. 25 will be used to illustrate the advantage of the invention shown in FIG. 27A. In host write #1, the command is to write LS10'. Since LS10' should occupy slot 3, a full page could not be written to the update block 20. Instead, it is staged by being buffered in a new page of the SPB 30. Thus, LS10' is stored in slot 3 of the next available partial page PP0 of the SPB 30. At the same time, slots 1 and 2 are optionally padded with LS8 and LS9 respectively. Also, according to the feature of the invention, both the SPBI and the CBI are packaged within a sector, namely, an index sector SPBI/CBI$_1$ 50, and the index sector 50 is advantageously stored in the last, unused slot of the partial page PP0.

In host write #2, the command is to write LS11'. Since LS11' belongs to slot 4, which is at a page end, a full page pre-padded with sequential LS8, LS9 and LS10' from the SPB 30 can be written to the next available page P0 of the update block 20. In this case, the index sector for SPBI/CBI is not updated since it is not writing to a partial page in the SPB 30. Alignment, as well as pre-padding in SPB is preferred but optional.

In host write #3, the command is to write LS6' and LS7'. They belong to slots 3 and 4 respectively. Thus, another full page, P1 of the update block 20 is written when the preceding slots are padded with LS4 and LS5. Again, the index sector for SPBI/CBI is not updated since it is not writing to a partial page in the SPB 30.

In host write #4, the command is to write LS10''. Since LS10'' belong to slot 3, it will be written to the next partial page PP1 of the SPB 30. Similarly, the preceding slots 1 and 2 are padded with LS8 and LS9, while the last slot will also be stored with the latest update of the index sector, SPBI/CBI$_3$.

The scheme shown in FIG. 27A is a more efficient utilization of the update block as evident from comparing the usage of the update block 20 at the end of host write #4 with that of FIG. 25. For the same host writes, the scheme shown in FIG. 27A consumes less storage and requires less padding in the update block, albeit at the expense of the scratch pad block 30. At the same time, the indexing scheme takes advantage of the unused storage in the scratch pad block to store an index in nonvolatile memory.

One important feature and advantage of the invention is that sequential order of update sectors in the update block is maintained during a series of separate host writes of sequential logical sectors, unlike the example shown in FIG. 25. This will be evident from the example illustrated in FIG. 27B.

Figure 27B:
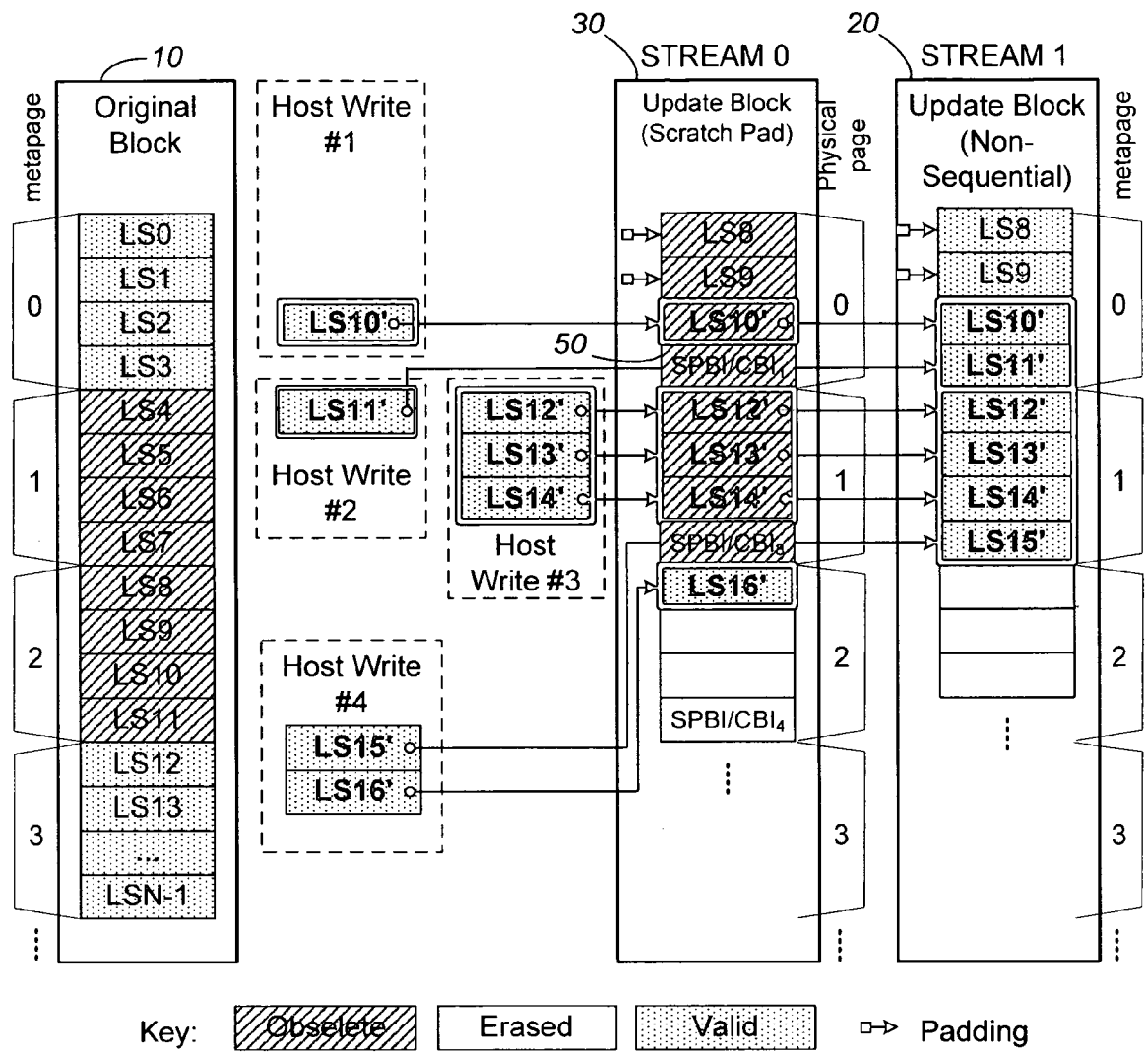
FIG. 27B illustrates another example of the sequential ordering of updating data being maintained by employing an update block in conjunction with a scratch pad block, according to a preferred embodiment of the invention.

FIG. 27B illustrates another example of the sequential ordering of updating data being maintained by employing an update block in conjunction with a scratch pad block, according to a preferred embodiment of the invention. In this example, logical sectors LS10'-LS16' are written in sequence but over a number separate host writes.

In host write #1, LS10' is written. Since it should occupy slot 3 of a page which is not a page-end slot, it is recorded in slot 3 of a scratch pad block 30. At the same time, an index SPBI/CBI1 is recorded in the page-end slot.

In host write #2, LS11' is written. Since it should occupy a page-end slot, it is recorded directly to the last slot of a new page in an update block 20. At the same time, the LS10' temporarily stored in the scratch pad block is copied over to slot 3, while slots 1 and 2 are pre-padded with LS8 and LS9 from the original or intact block 10.

In host write #3, LS12'-LS14' are written. Since none of them has an end-page offset, they are stored in slots 1-3 of a new page in the scratch pad block. At the same time, an updated index SPBI/CBI3 is recorded in the page-end slot.

In host write #4, LS15' and LS16' are written. Since LS15' falls in a page-end slot, it is written directly to the last slot of the next page in the update block. At the same time, slots 1-3 are respectively filled with LS12'-LS14' from the scratch pad block.

It will be seen that the sequential logical sectors LS10'-LS16' are recorded in the update block in a sequential manner even though they are written over several separate host writes.

In the preferred embodiment, one valid partial page (e.g., the last written partial page) is maintained per logical group in the scratch pad block. The invention is equally applicable to having more than one valid partial page maintained per logical group in the scratch pad block. In that case, the index information from more than one page need to be analyzed in order to locate the recorded sectors.

Sector alignment and padding within the page of a scratch pad block is preferable but optional. The alignment and padding will facilitate subsequent transfer to the update block.

Absolute sector alignment within a page of an update block will simplify indexing and copying in some memory architecture. The sectors in the page are also regarded as page-aligned even when all the sequential sectors in the page are cyclically shifted by some number of slots. In that case, a page tag indicating the location of the first logical sector in the page will provide the offset address.

The preferred embodiments shown have the two storages as two different erasable blocks. In general the invention is equally applicable to the two storages being two portions of the memory.

The invention is also equally applicable to two-state memories having each memory cells storing one bit of data and multi-state memories having each memory cells capable of storing more than one bit of data. For multi-state memories that support multi-page storage, the lower page is preferable used for storage operation of the scratch pad block. The partial page is preferably pre-padded if the first sector to write does not start from the slot 1 location of a multiple-slot page.

Page level indexing is used for chaotic blocks and sector-level indexing for the scratch pad block. All necessary indexing information for accessing all chaotic blocks and the scratch pad block, i.e., SPBI/CBI, is maintained in the controller SRAM for speedy access and processing. It is periodically written out to the scratch pad block whenever a new partial page is written.

Generally, partial meta-page relocated data is programmed together with incoming data to reduce the number of programming cycles. A scratch pad block (SPB) is compacted when it becomes full. The SPB compaction is the relocation of all valid data to a new block. As we have only one page with valid data per UB in SPB, we only need to copy those pages to new block. If there are multiple pages with valid data per update block (they might contain different or the same logical addresses; in the latter it is preferable to consolidate them).

Update Block Index Saved in Partial Page

According to yet another aspect of the invention, data stored in a memory block has its index stored in a portion of a partial page unoccupied by data. Thus, in a memory organized into memory units where a page of memory units is programmable together and a block of memory pages is erasable together, partially filled pages will exist when data units stored in the memory units are aligned in the page according to a predetermined order, and especially if the page is once-programmable after each erase. The index for the block is then stored in a partial page not filled with update data. The partial page may be in the current block or in another block.

Figure 28:
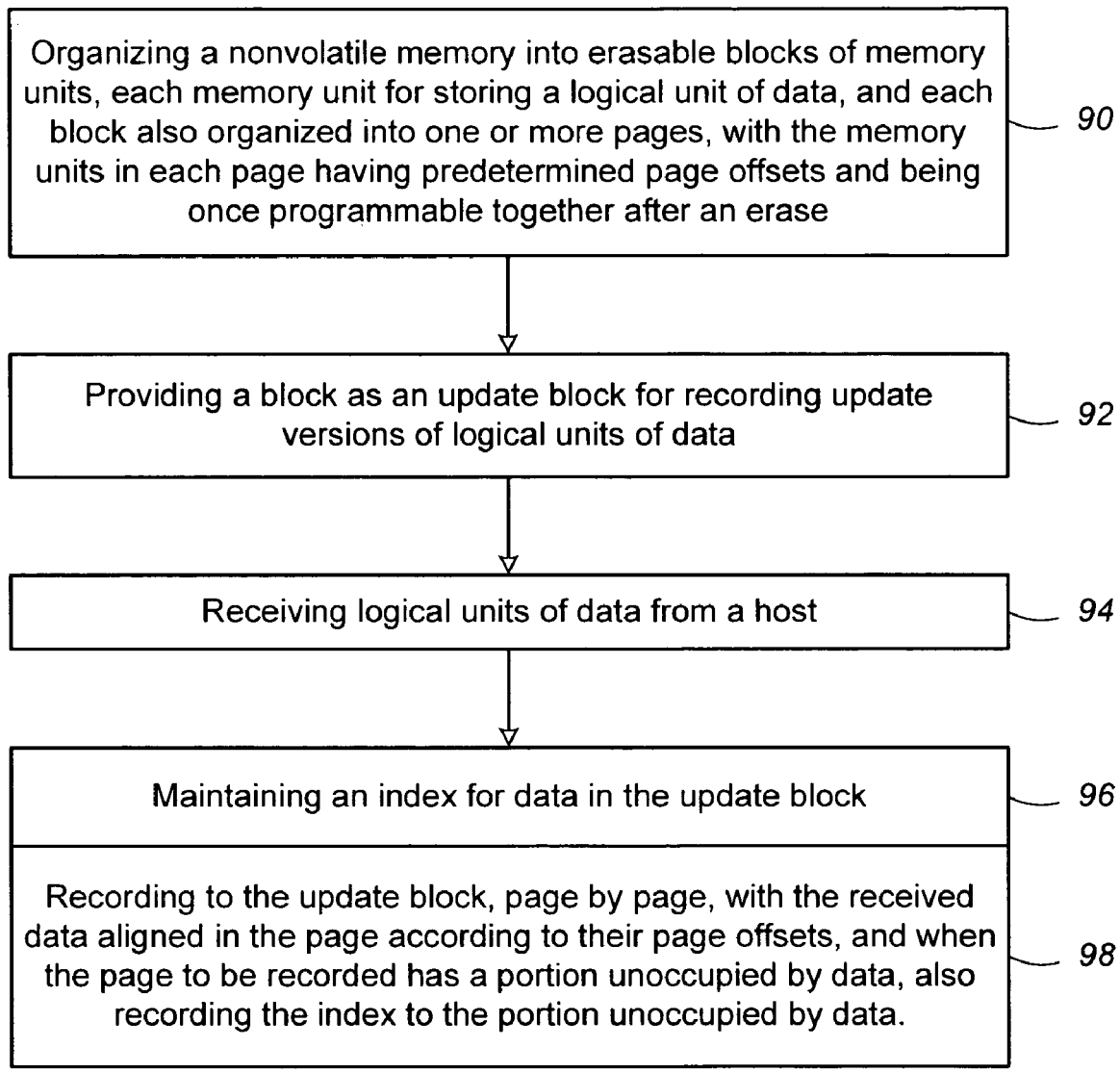
FIG. 28 illustrates a preferred scheme for saving an index of a memory block for storing update data in a partial page of the block.

FIG. 28 illustrates a preferred scheme for saving an index of a memory block for storing update data in a partial page of the block.

STEP 90: Organizing a nonvolatile memory into erasable blocks of memory units, each memory unit for storing a logical unit of data, and each block also organized into one or more pages, with the memory units in each page having predetermined page offsets and being once programmable together after an erase STEP 92: Providing a block as an update block for recording update versions of logical units of data.

STEP 94: Receiving logical units of data from a host.

STEP 96: Maintaining an index for data in the update block.

STEP 98: Recording to the update block, page by page, with the received data aligned in the page according to their page offsets, and when the page to be recorded has a portion unoccupied by data, also recording the index to the portion unoccupied by data.

Multi-Stream Tracking and Synchronization

Figure 29:
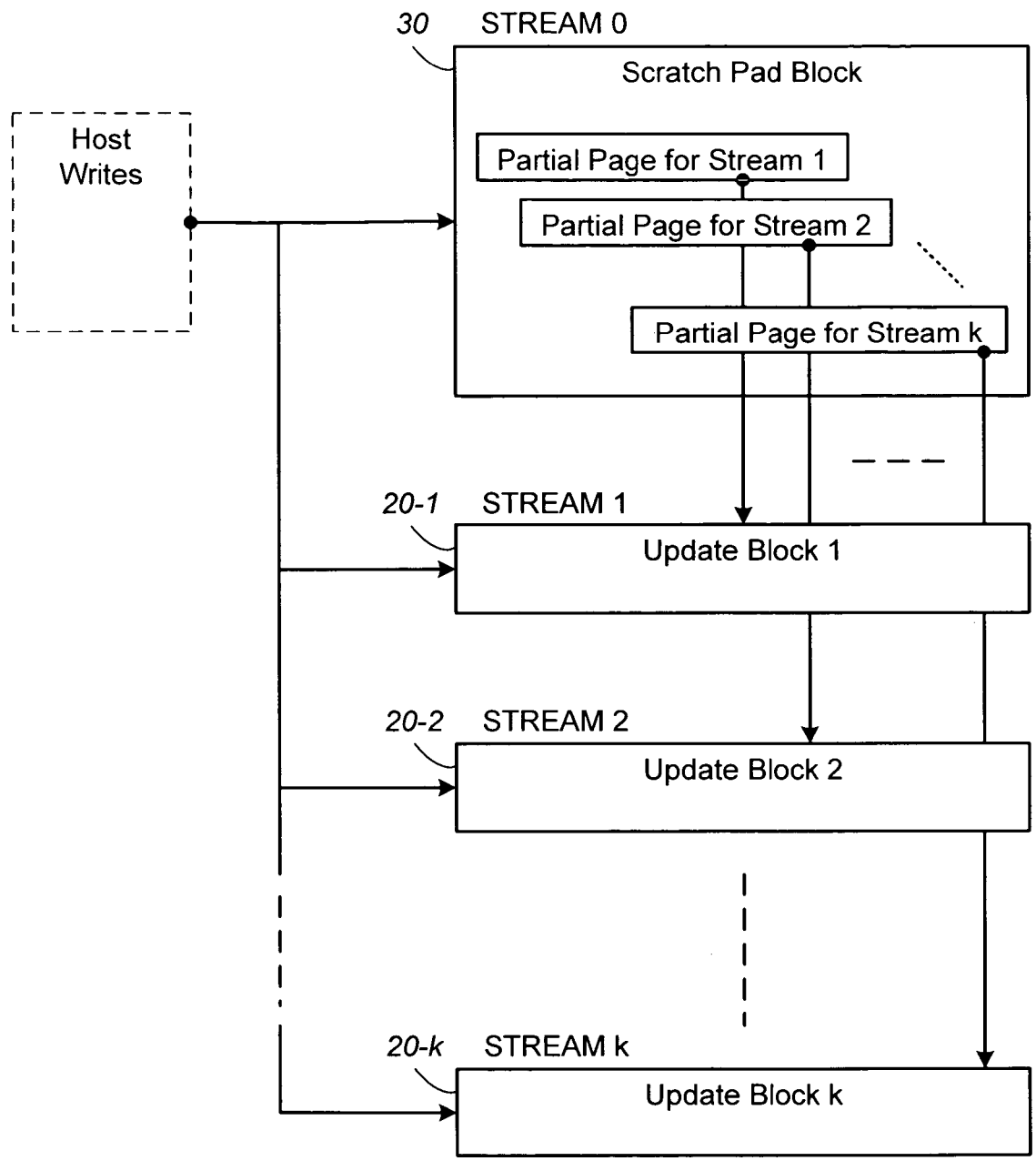
FIG. 29 illustrates schematically, a scratch pad block used in a multi-stream update in which several logical groups are concurrently undergoing updates.

FIG. 29 illustrates schematically, a scratch pad block used in a multi-stream update in which several logical groups are concurrently undergoing updates. For example, if there are k logical groups undergoing updating, there will be k update streams using k update blocks 20-1, . . . , 20-k. In order to avoid partial pages among the update blocks, a scratch pad block 30 is used in another stream (stream 0) to buffer data in k corresponding partial pages for the k update blocks. Thus, there will be k+1 blocks opened, and k partial pages to service the concurrent updating of k logical groups of logical units in k update blocks. The example shown is for the preferred embodiment where there is one valid page per update block in the scratch pad block.

With valid sectors distributed among the update and scratch pad blocks, a problem may arise in identifying the most recently written version of sectors in the case of power cycles as different copies of the same logical sectors can be found in both the update and scratch pad blocks. A memory scan on the update block after a power reset will establish the priority of multiple versions (if any) of a logical sector since the locations of the update block is filled in a definite order. Similarly scanning the scratch pad block, the last written version of a logical sector can be identified. However, if there is a latest version in the scratch pad block and a latest version in the update block, it is not readily determined which one is the very latest. For example, in FIG. 27A the sectors LS8-LS10 can be found in both streams. The same pattern of data, as on FIG. 27A, can be created by different command sequence—write LS8'-LS10'; write LS8"-LS10"; write LS8'''-LS11'''; write LS4'-LS7'. In this case the valid sectors will be located in the update block rather than the scratch pad block.

According to another aspect of the invention, a method is provided to write update data to a non-volatile memory with synchronization information that allows identifying the most recently written version of data that may exist on multiple memory blocks.

Figure 30:
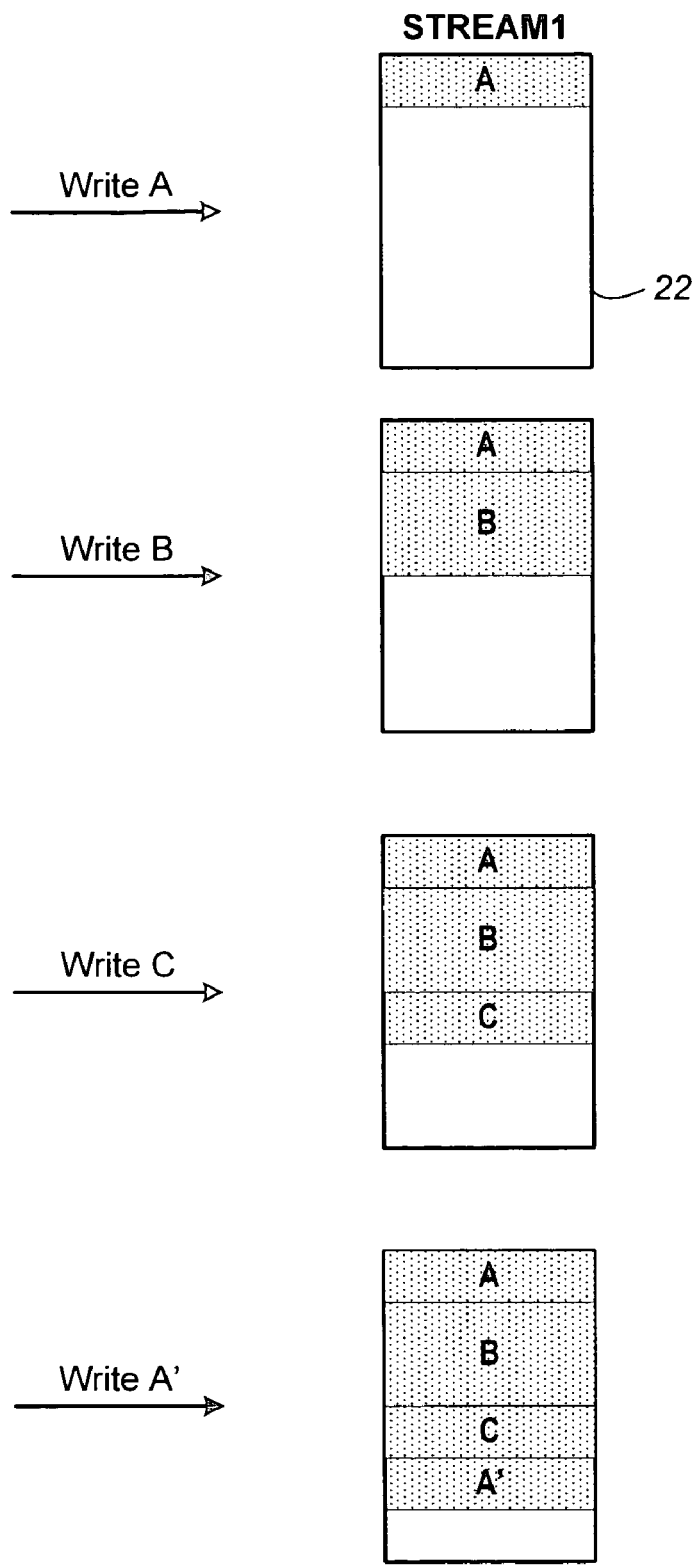
FIG. 30 illustrates a conventional case of writing a sequence of input data to a block.

FIG. 30 illustrates a conventional case of writing a sequence of input data to a block. The nonvolatile memory block 22 is organized such that it is filled in a definite order. It is shown schematically as filling from the top. Thus, successive write of segments of data "A", "B", "C" and "A'" are laid down in the block sequentially. In this way, if for example, "A'" is another version of "A", it can be determined from its recorded location in the block 22 that it is a later version that supersedes "A". The embodiments below are just special, though effective, cases of the broader idea of storing information about how full the streams were at the time of update of one definite stream.

Figure 31A:
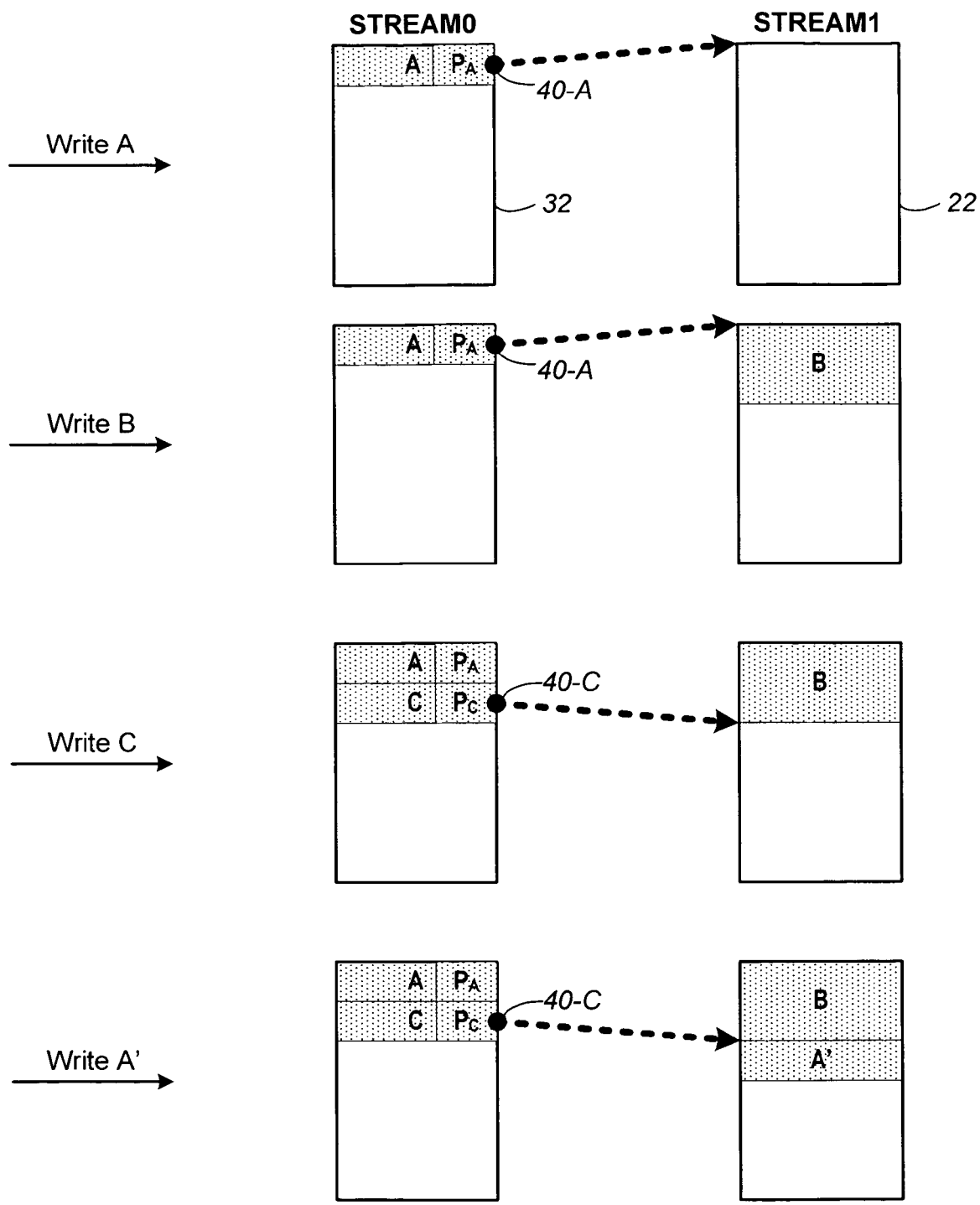
FIG. 31A illustrates a scheme of keeping track of the recording order or priority even when the different writes are interleaved over two blocks, according to a preferred embodiment of the invention.

FIG. 31A illustrates a scheme of keeping track of the recording order or priority even when the different writes are interleaved over two blocks, according to a preferred embodiment of the invention. Each write, such as data segments "A", "B", "C" and "A'" could either be recorded onto a first block (e.g., block 22) or a second block (e.g., block 32) depending on one or more predetermined conditions. In the example, "A" is recorded in a first write to the second block 32. This is followed by a second write where "B" is recorded to the first block 22, and a third write where "C" is recorded to the second block 32, and finally a fourth write where "A'" is recorded to the first block 22.

In the figure shown, STREAM 0 is the stream of data recording to the second block 32 and STREAM 1 is the stream of data recording to the first block 22. In the case of interleaved update of the same logical data in two or more streams, it is essential to keep track of the prioity of updates, which defines the locations of the most recently recorded data. In a preferred embodiment, this is accomplished by saving the prioity information at least every time a given stream is being recorded.

The priority information is being saved with the write data every time the latter in STREAM 0 is being recorded onto the block 32. In the preferred embodiment, the priority information is a write pointer 40 that points to the next empty location (i.e., the address of the next recording location) in the first block 22. The write pointer is saved along with the data that is being stored in STREAM 0.

Thus, in the write "A" operation, a pointer $P_A$ 40-A that points to the next empty location in block 22 is saved together with "A" in the block 32 in STREAM 0. In the write "B" operation, no pointer is saved since the write is to the block 22 in STREAM 1. In the write "C", a pointer $P_C$ 40-C is saved with "C" in the block 32 in STREAM 0. In the write "A'" to the block 22, no pointer is being saved in STREAM 1.

If at the end of write "A'", the memory is reset after a power interruption, any indices in the controller RAM will be lost and have to be rebuilt by scanning the memory. By scanning backwards, each of the blocks 22 and 32 will have located a last written version of data "A". The write pointer 40 can be used to determine the very latest version between the two blocks. For example, the pointer $P_C$ points to a location in the block 22 prior to the recording of "A'", hence "A'" is recorded after "C". Also, since "C" is recorded in the block 32 at a location after "A", it therefore can be concluded that "A'" is the later version of "A".

In another embodiment where there are more than one valid page in the SPB per UB, then in order to detect the most recently written data, more than one write pointer will have to be analyzed.

Figure 31B:
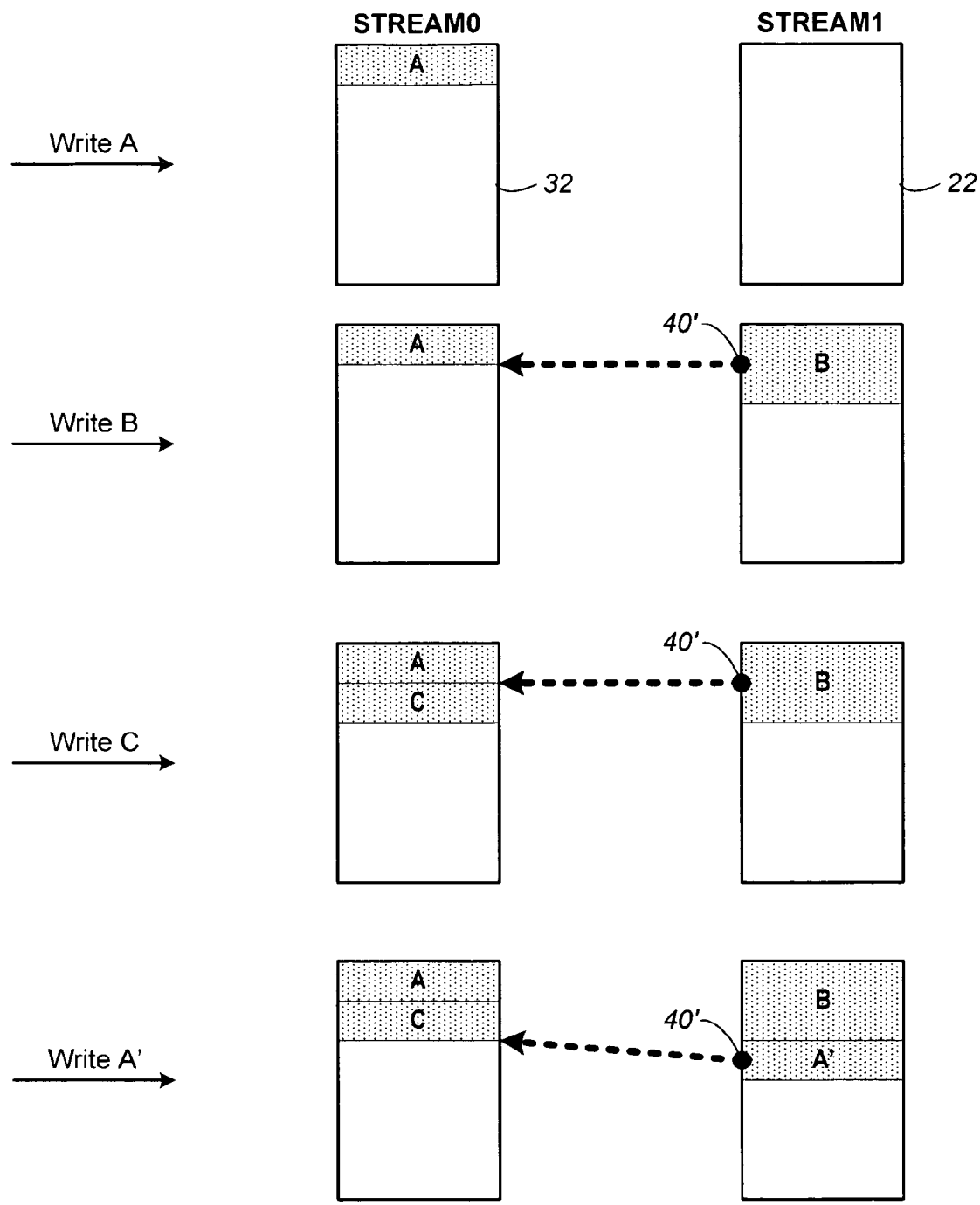
FIG. 31B illustrates another embodiment of keeping track of the recording order when the writes are recorded over two blocks.

FIG. 31B illustrates another embodiment of keeping track of the recording order when the writes are recorded over two blocks. This embodiment is similar to that shown in FIG. 31A except the write pointer points to the next empty location in the block 32 and is saved in the block 22. STREAM 0 is being recorded to a second block (e.g., block 32) while STREAM 1 is being recorded to a first block (e.g., block 22). Every time STREAM I is being recorded onto a first block, a second block write pointer 40', that gives the address of the next recording location in the second block 22, is being saved with it. In this example, the pointers $P'_B$ 40'-B is being recorded with "B". Similarly, the pointer $P'_{A'}$ 40'-A' is being recorded with "A'" in the first block 22 in STREAM 1.

Figure 32A:
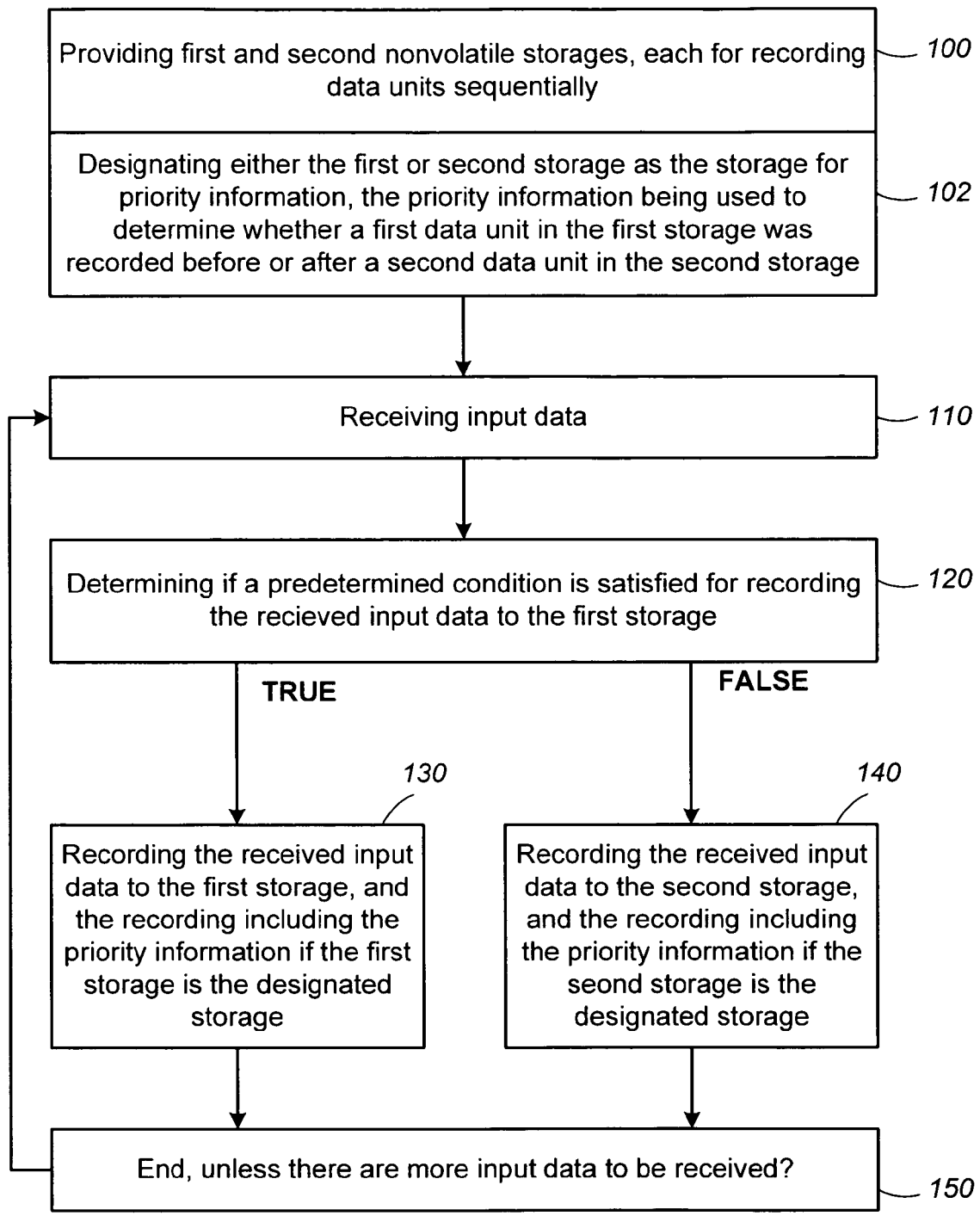
FIG. 32A is a flowchart illustrating a method of synchronizing the recording sequence between two data streams, according to a general embodiment of the invention.

FIG. 32A is a flowchart illustrating a method of synchronizing the recording sequence between two data streams, according to a general embodiment of the invention.

STEP 100: Providing first and second nonvolatile storages, each for sequentially recording data.

STEP 102: Designating either the first or second storage as the storage for priority information, the priority information being used to determine whether a first data unit in the first storage was recorded before or after a second data unit in the second storage.

STEP 110: Receiving the input data.

STEP 120: Determining if a predetermined condition is satisfied for recording the received input data to the first storage. If satisfied, proceeding to STEP 130', otherwise proceeding to STEP 140'.

STEP 130: Recording the received input data to the first storage. At the same time, if the first storage is the designated storage, additionally recording the priority information to the first storage. Proceeding to STEP 150.

STEP 140: Recording the received input data to the second storage. At the same time, if the second storage is the designated storage, additionally recording the priority information to the second storage. Proceeding to STEP 150.

STEP 150: Proceeding to STEP 110 if there is more input data to be processed, otherwise ending process.

In a preferred embodiment, the priority information is a writer pointer, which is an address of the location of where a next recording will take place in the non-desingated storage.

Figure 32B:
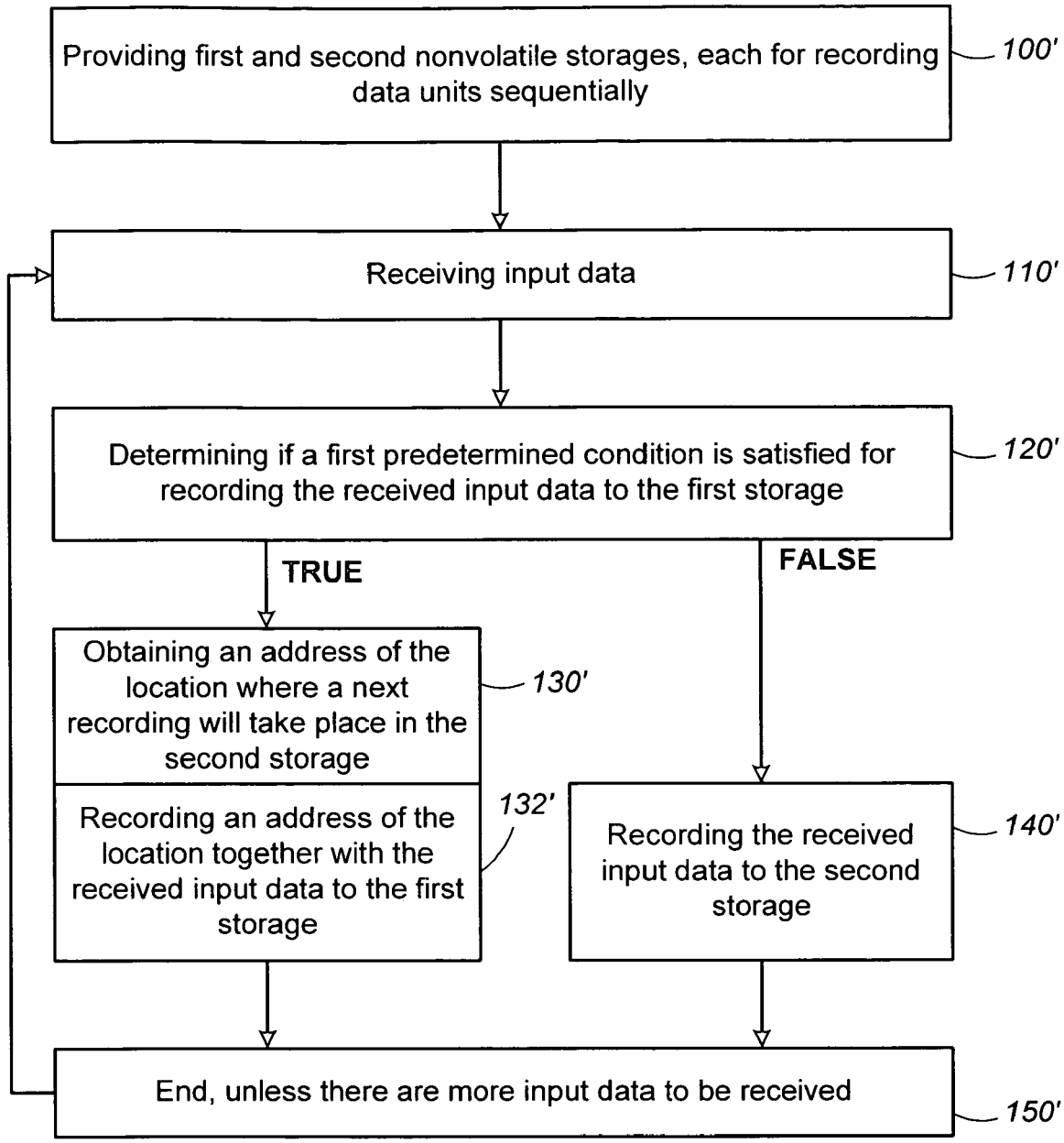
FIG. 32B is a flowchart illustrating a method of synchronizing the recording sequence between two data streams, according to an embodiment using a write pointer.

FIG. 32B is a flowchart illustrating a method of synchronizing the recording sequence between two data streams, according to an embodiment using a write pointer.

STEP 100': Providing first and second nonvolatile storages, each for sequentially recording data.

STEP 110': Receiving the input data.

STEP 120': Determining if a predetermined condition is satisfied for recording the received input data to the first storage. If satisfied, proceeding to STEP 130', otherwise proceeding to STEP 140'.

STEP 130': Obtaining an address of the location where a next recording will take place in the second storage.

STEP 132': Recording the address and the received input data to the first storage. Proceeding to STEP 150'.

STEP 140': Recording the received input data to the second storage. Proceeding to STEP 150'.

STEP 150': Proceeding to STEP 110 if there is more input data to be processed, otherwise ending process.

The invention is particular applicable to a nonvolatile memory that is organized into erasable blocks of memory units, each memory unit for storing a logical unit of data, and each block also organized into one or more pages. Furthermore, each page is once programmable after an erase with multiple logical units, each logical unit in a predetermined order with a given page offset. The method essentially provides two blocks (e.g., an update block and a scratch pad block) for storing or buffering update data of a group of logical units, and maintains synchronization information for helping to identify whether the most recently written version of a logical unit is located in the first or second block. With regard to FIG. 29, the embodiment shown in FIG. 31A is preferable if there are multiple streams, since it is more convenient to have all write pointers stored in one place in the SPB.

Update-Block Write Pointer Embodiment

Accordingly to a preferred embodiment, the synchronization information in the form of a write pointer is saved together with host data every time it is being buffered in a scratch pad block. The write pointer is an update-block write pointer that gives the address of the location for the next write in the update block at the time the write pointer is saved in the scratch pad block. In particular, it is saved in a portion of the scratch pad block not utilized for storing host data anyway. Preferably, the update-block write pointer is included in the index SPBI/CBI stored in a partial page of the scratch pad block. The update-block write pointer would allow determination of whether a given logical sector buffered in the scratch pad block has been rendered obsolete by subsequent writes to the update block.

If there is a power reset, and two versions of the logical sector in question are found among the two blocks, then the write pointer will allow resolution of which version is the very latest. For example, if the logical sector in the update block is recorded after the pointed location, it will supersede the version in the partial page in the SPB. On the other hand, if the logical sector is not found in the update block or was recorded at an earlier location, the conclusion will then be that the version buffered in the partial page of the scratch pad block is still valid.

Figure 33A:
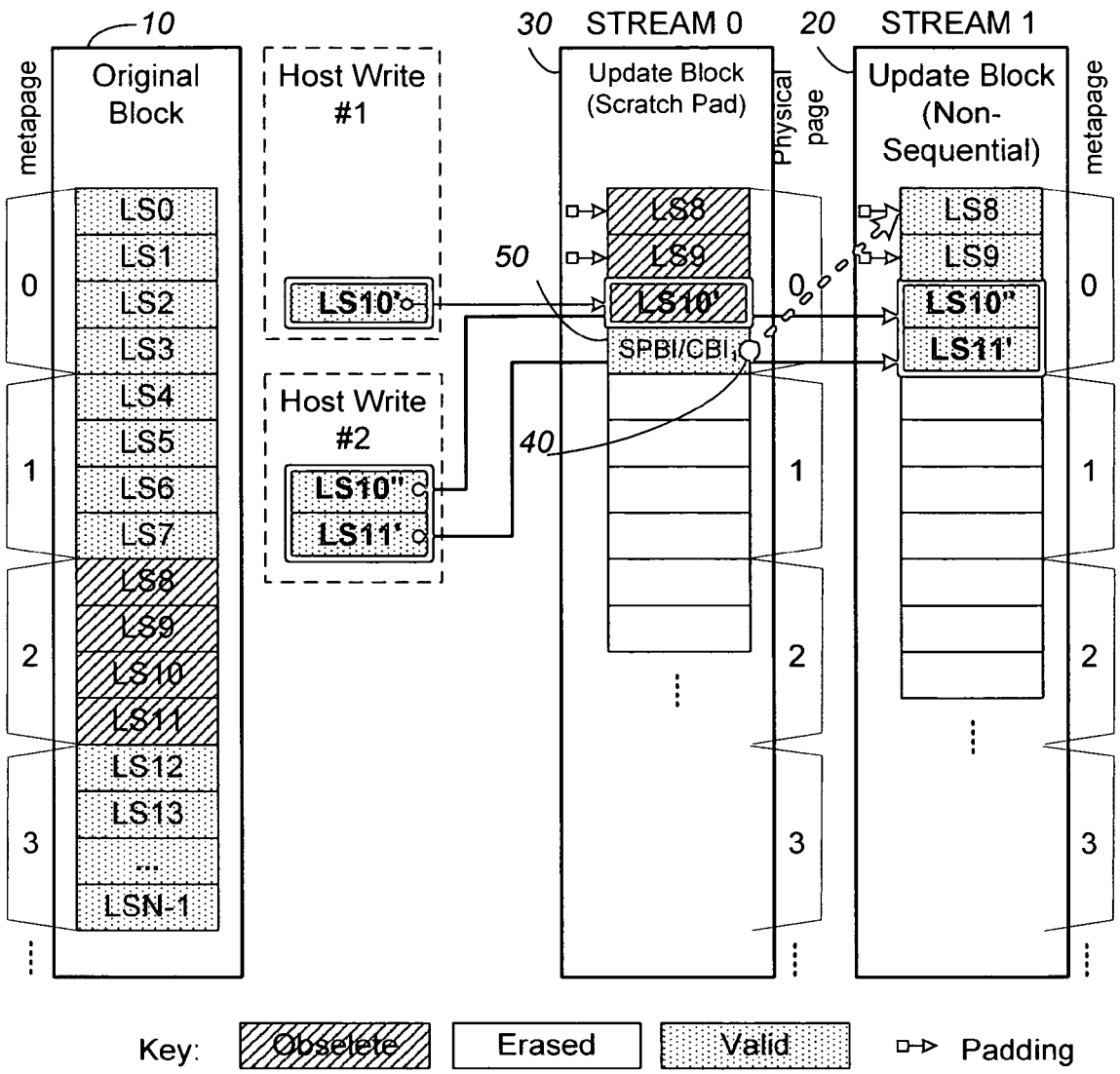
FIG. 33A shows the state of the scratch pad block and the update block after two host writes #1 and #2 according to a first sequence.

FIG. 33A shows the state of the scratch pad block and the update block after two host writes #1 and #2 according to a first sequence. The first sequence is for host write #1 to write LS10', and host write #2 to write LS10" and LS11'.

In host write #1, the command is to write LS10'. Since LS10' is not at a page boundary, it is recorded in a partial page PP0 in the scratch pad block 30 pre-padded with LS8 and LS9 and terminated with the current index SPBI/CBI$_1$. When the partial page PP0 is written, a write pointer 40 is included in the current index SPBI/CBI$_1$ 50, which is saved in the last slot. The write pointer 40 points to the first empty page P0 in the update block 20.

In host write #2, the command is to write LS10" and LS11. Since LS11' is at a page end, it is written directly to the last slot (slot 4) of P0 in the update block 20. At the same time, slot 3 is written with LS10' and slots 1 and 2 are padded with LS8 and LS9 respectively.

If the memory now suffers a power interruption with the loss of indexing information maintained in RAM, a backward scan of the physical memory will attempt to rebuild the indexing information. It will be seen that both the update block and the scratch pad block (SPB) will yield their latest versions of LS10, namely, LS10' and LS10". However, since LS10" is recorded after the write pointer recorded in PP0 of the SPB, it can be concluded that it is a later version than LS10'.

Figure 33B:
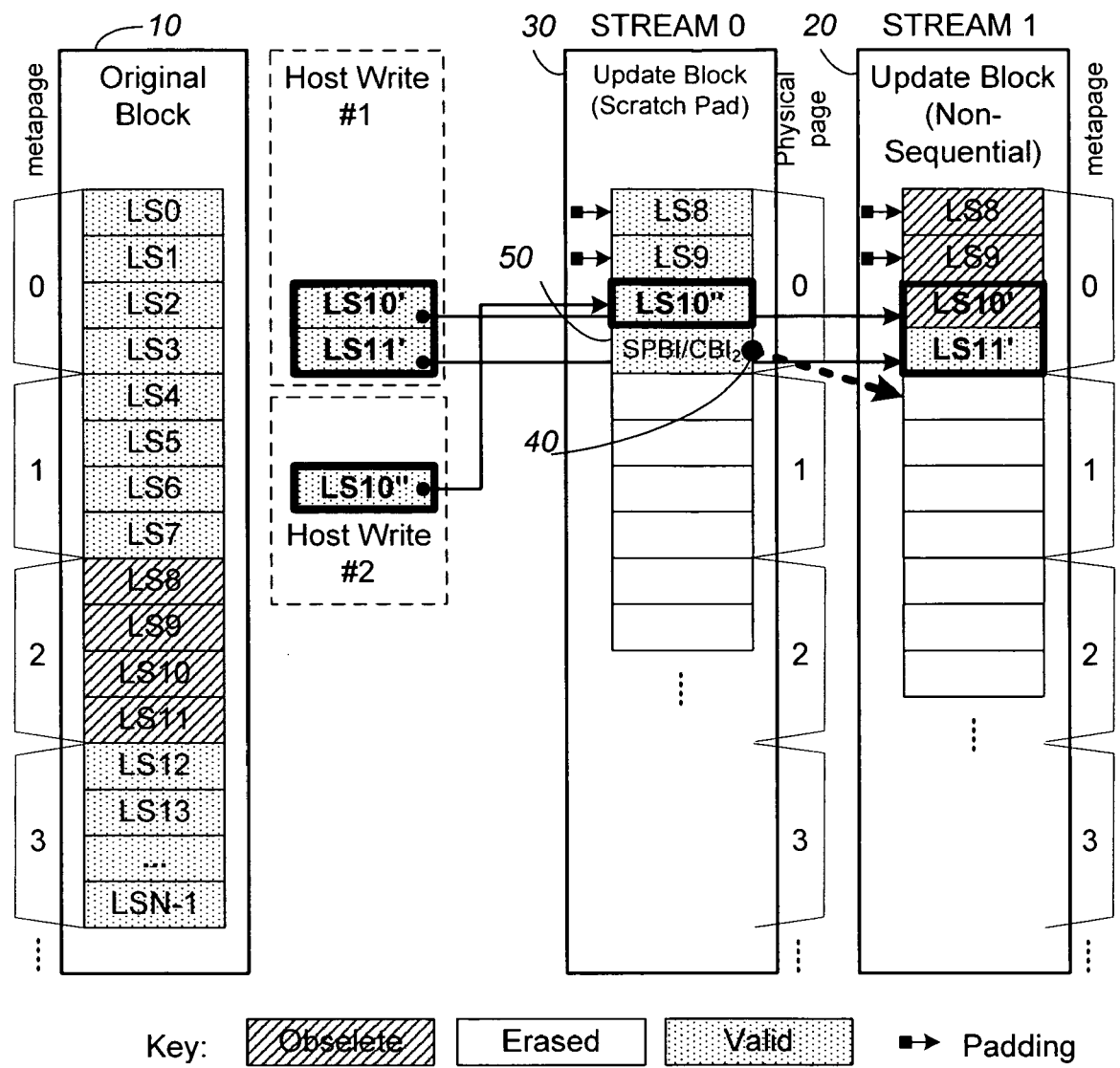
FIG. 33B shows the state of the scratch pad block and the update block after two host writes #1 and #2 according to a second sequence which is the reverse of the first sequence shown in FIG. 33A.

FIG. 33B shows the state of the scratch pad block and the update block after two host writes #1 and #2 according to a second sequence which is the reverse of the first sequence shown in FIG. 33A. The reverse sequence is for host write #1 to write LS10' and LS11', and host write #2 to write LS10".

In host write #1, the command is to write LS10' and LS11'. Since LS11' is at a page end, it is written directly to the last slot (slot 4) of P0 in the update block 20. At the same time, slot 3 is written with LS10' and slots 1 and 2 are padded with LS8 and LS9 respectively.

In host write #2 that follows host write #1, the command is to write LS10". Since LS10" is not at a page boundary, it is recorded in a partial page PP0 in the scratch pad block 30 pre-padded with LS8 and LS9 and terminated with the current index SPBI/CBI$_2$. When the partial page PP0 is written, a write pointer 40 is included in the current index SPBI/CBI$_2$ 50, which is saved in the last slot. The write pointer 40 points to the next empty page P1 in the update block 20.

In this case, after a power reset, the logical sector LS10' in the update block, for example, is found to be recorded before the pointed-to location of the update block 20. It can then be concluded that the latest version of LS10' in the update block 20 is superseded by another version LS10" that resides in the partial page of the scratch pad block 30.

FIG. 34A illustrates a preferred data structure of the scratch pad block index (SPBI). The SPBI information contains the following fields for each of k update blocks. This is a special case of SPB with one valid page per Logical Group/UB.

A Logical Group Number identifies the logical group undergoing update in a given stream. Preferably, the null value "FFFF" is stored for free update blocks, or update blocks with no valid scratch pad data.

A Page Starting Sector is the first logical sector of the partial page written to the scratch pad block.

A Sector Run Length is the number of valid sectors of the partial page written to a scratch pad page.

A Valid Page Number identifies the only valid (the only valid) partial page written in the scratch pad block. This will be the last written partial page in the scratch pad block. Alternatively, the addressing can be implemented with sector offset, which points to the first valid sector of the partial page for an update block. The sector offset is counted relative to the beginning of the block. In the preferred embodiment, only one physical page contains valid data for a given update block. FFFF is stored for sectors not written to the Scratch Pad Block.

An Update-Block Write Pointer 40 is the sector address of the first unwritten sector location of the corresponding Update Block when the Scratch Pad was last written. Any sectors written to the Update block from this sector position would supersede sectors written in the Scratch Pad Block.

FIG. 34B illustrates example values in the Scratch Pad Block Index for the host write #1 shown in FIG. 33A. In this example, the Logical Group Number is "1", which contains logical sectors LS0 to LSN-1. It is being updated in STREAM 1 with an accompanying update block and a scratch pad block. The partial page is PP0 and it starts with LS8 or "8" and has a run of "3" to end with LS10'. The valid partial page number is "0". Finally, the write pointer points to the next write location in the update block, which has a sector offset of "0".

It will be clear that if the updated index is only stored in the scratch pad block, and the scratch pad block does not get written whenever data is written directly to the update block, the index will become invalid under those circumstances.

Generally, the entire SPB index information as well as the CBI index information is maintained in data structure in controller SRAM at all times. Valid sectors in the SPB are accessed based on the sector-level index information. In the preferred embodiment, the SPBI/CBI indices are stored in non-volatile memory in the scratch pad block. In particular every time a partial page is written in the scratch pad block (SPB), the up-to-date SPBI/CBI is stored in the last sector of the partial page.

The SPB supports up to a predetermined number (e.g., 8) of update blocks. Partial page data in the SPB block is consolidated to the associated update block when the host writes the last sector of the page. Data may exist in more than one partial page in the SPB for a logical group at a given instance but only the data for the last written partial page is valid. Similarly, multiple copies of a SPBI/CBI sector can exist in the SPB but only the last written copy is valid. When sectors need to be written to the SPB and the SPB is full, the block is first copied to a new SPB block and the old SPB is erased, after which the sectors are written to the new SPB. SPB is also written when SPBI/CBI needs to be updated because a sequential update block becomes chaotic, or because an update block, previously containing scratch pad data, is closed.

In the preferred embodiment, the scratch pad block (SPB) write is one page at a time. The number of pages per stream/Logical.Group/Update Block is also limited to one, so only the latest SPBI is needed, as there is only one logical page which mayb be in question regarding where the valid copy is in the UB or SPB. Similarly, if the number of pages per UB in SPB is more than one, then the old SPBIs would need to be analyzed as well.

The embodiment described above stores an update-block write pointer as part of the SPBI/CBI sector in the latest partial page of the scratch pad block. Alternative embodiments are possible to identify the valid version of a logical sector from multiple versions that may exist among multiple blocks. Also it is possible to have either more than one page per stream in the scratch pad block, or if we have more than one update block or stream per logical group.

Scratch-Pad-Block Write Pointer Embodiment

According to another embodiment of the invention, synchronization information is maintained that would allow determination of whether a given logical sector buffered in the scratch pad block has been rendered obsolete by subsequent writes to the update block. This is accomplished by including a scratch-pad write pointer that gives the address of the location for the next write in the scratch pad block at the time the synchronization information is stored in a page of the update block.

Figure 35A:
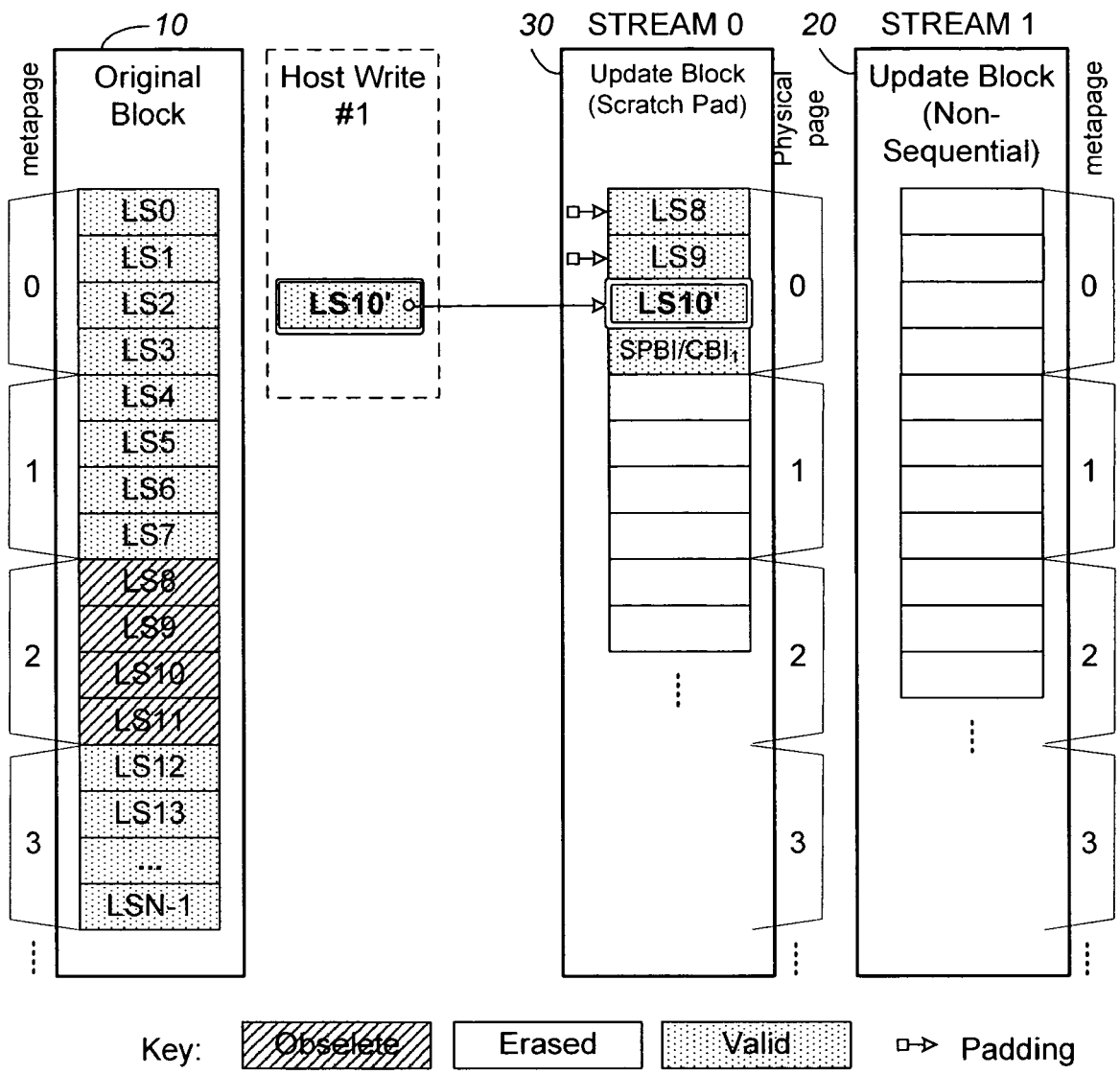
FIG. 35A and FIG. 35B shows the intermediate state of the scratch pad block and the update block relative to the scratch-pad write pointer respectively after the successive host writes of FIG. 33A and FIG. 33B.
Figure 35B:
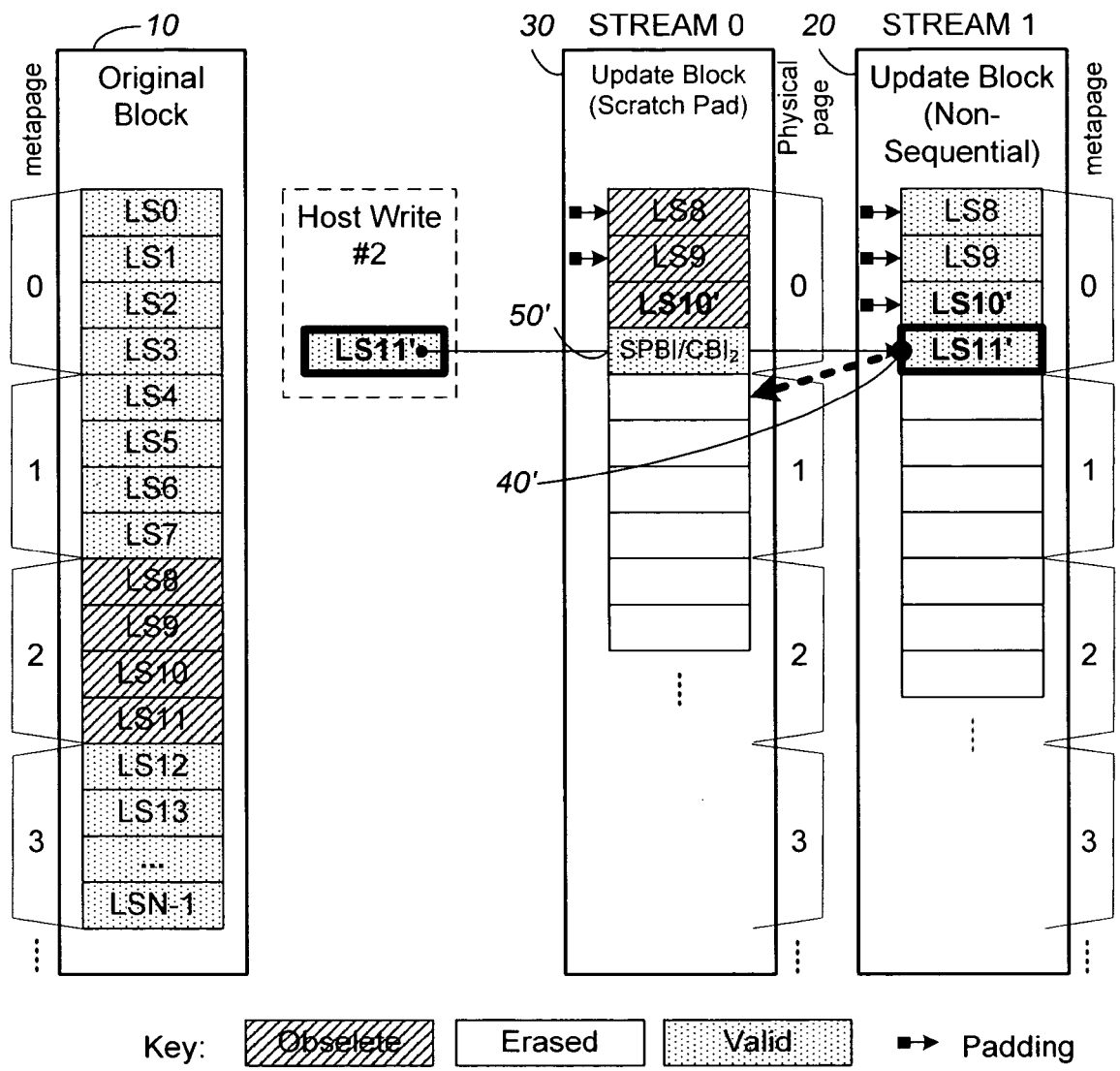

FIG. 35A and FIG. 35B shows the intermediate state of the scratch pad block and the update block relative to the scratch-pad write pointer respectively after the successive host writes of FIG. 33A and FIG. 33B.

FIG. 35A illustrates the state of the scratch pad block and the update block after host write #1. In host write #1, the logical sector LS10' belongs to slot 3 of the page and not at a page boundary and is therefore recorded in a partial page PP0 in the scratch pad block 30. It is optionally pre-padded with LS8 and LS9 and terminated with the current index SPBI/CBI$_1$. If the memory has since been restarted after a power shut down, the valid version of the logical sector LS10' will be correctly located by the last SPBI/CBI$_1$ index. This is true since nothing has been written to the update block 20.

FIG. 35B illustrates host write #2 that follows host write #1, where the command is to write LS11'. Since LS11' falls at a page boundary (slot 4), it is recorded in the fourth slot of a filled page P0, pre-padded with LS8, LS9 and LS10. Synchronization information is in the form of a SPB write pointer 40' that points to the next empty location in the SPB 30. Unlike the earlier embodiment, the SPB write pointer 40' is not included in the SPBI/CBI index in the SPB 30. Instead, it is stored in a header portion of a sector in the page currently being recorded to in the update block 20. If the memory has since been restarted after a power shutdown, the valid version of the logical sector LS10' will be correctly located in the update block 20 since the version of LS10 in the SPB is recorded before the location pointed to by the SPB write pointer 40'.

Figure 36:
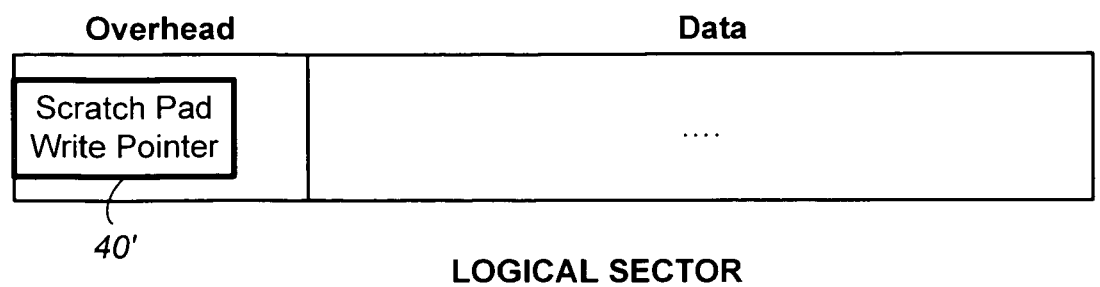
FIG. 36 illustrates the scratch-pad write pointer being stored in an overhead portion of a sector being recorded to the update block.

FIG. 36 illustrates the scratch-pad write pointer being stored in an overhead portion of a sector being recorded to the update block. The scratch-pad write pointer 40' is saved in at least one of the sectors in the page currently being recorded to the update block. In the preferred embodiment, it is saved in an overhead portion of at least one of the sectors in the page being written.

Time Stamp Embodiment

In yet another embodiment, the synchronization information can be encoded as time stamps for data sectors written to multiple streams so that the latest version can be correctly found.

Figure 37:
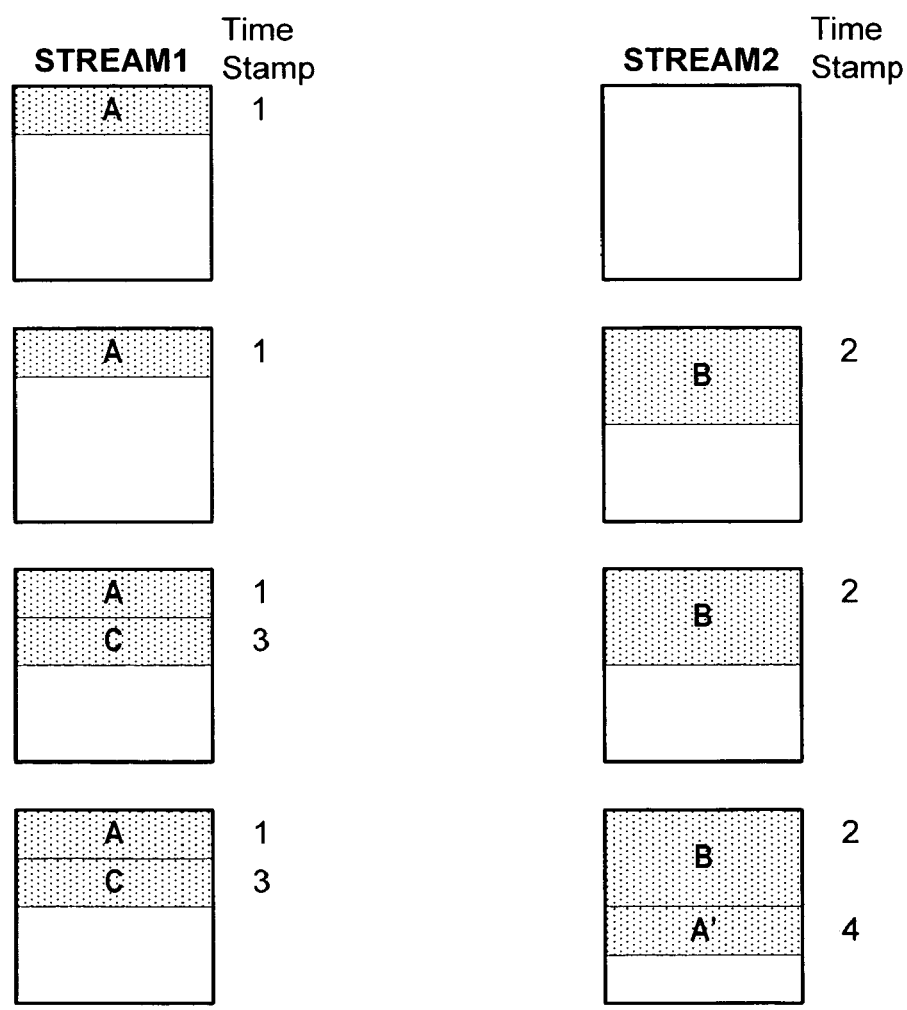
FIG. 37 illustrates the use of time stamps to keep track of the recording sequence between two update streams.

FIG. 37 illustrates the use of time stamps to keep track of the recording sequence between two update streams. As before, each segment of the update data can be recorded in either a first block (STREAM 1) or a second block (STREAM 2). The example shows that at time T1, "A" is recorded in the first block, at T2, "B" is recorded in the second block, at T3, "C" is recorded in the first block, and T4, "A'" is recorded in the second block.

At least one time stamp for every new data update portion is stored. Thus, "A" with have the time stamp TS1, "B" with TS2, "C" with TS3 and "A'" with TS4. Thus, for example, "A'" is a later version of "A" since its has a later time stamp. In the preferred embodiment, the time stamp information is stored in an overhead portion of at least one of the sectors in the page being written.

Multi-Stream Updating of Blocks Having Multi-Sector Pages

According to another aspect of the invention, a method of updating a nonvolatile memory includes using a first block (update block) for recording update data and a second block (scratch pad block) for temporary saving some of the update data before recording to the update block. The nonvolatile memory is organized into erasable blocks of memory units, each memory units for storing a logical unit of data, and each block also organized into one or more pages, with each page capable of storing multiple logical units having definite page offsets, and being once programmable together after an erase. The method further includes receiving the logical units from a host and aligning the received logical units page by page, so that when a predetermined condition is satisfied where a received logical unit has a page end offset, storing the received logical unit and any preceding logical units to a page in the update block with appropriate page alignment, otherwise, temporarily storing any remaining received logical units to a partial page in the scratch pad block. The logical units in the scratch pad block are eventually transferred to the update block when the predetermined condition is satisfied.

In a preferred embodiment, the update data is received and parsed page by page for transferring to the first block (e.g., update block). Any remaining partial page of buffered data is transferred to the second block (e.g., scratch pad block) and will remain there until a full page of data becomes available for recording to the first block. When the buffered data is transferred to the second block, it is recorded page by page, albeit the recorded page is only partially filled with the received data. The spare, normally unused, space in the partial page is used to store an index for locating the data in the second and first blocks.

Figure 38:
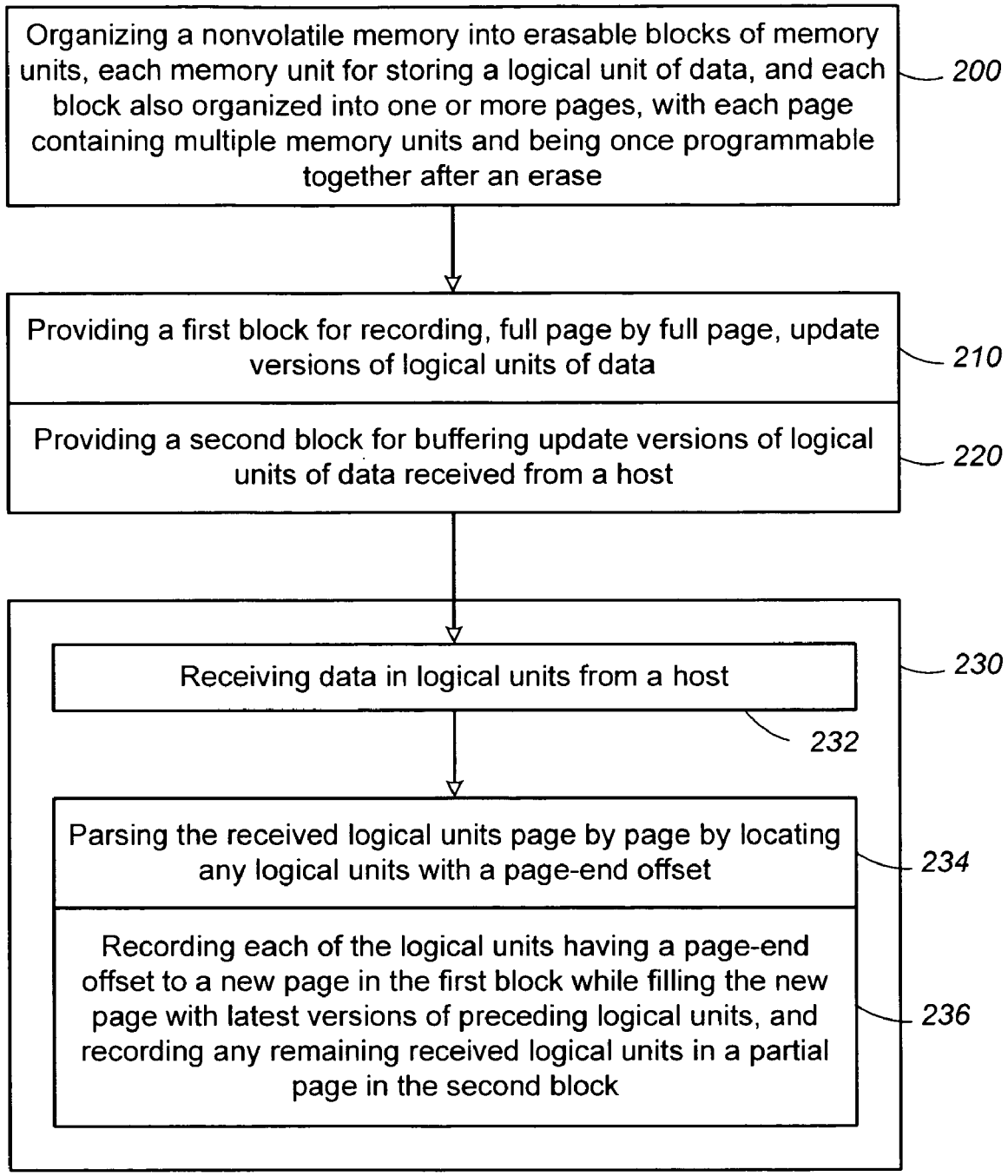
FIG. 38 is a flowchart illustrating a method of recording and indexing update data to two memory blocks concurrently, each memory block having multiple-sector pages, according to a general embodiment of the invention.

FIG. 38 is a flowchart illustrating a method of recording and indexing update data to two memory blocks concurrently, each memory block having multiple-sector pages, according to a general embodiment of the invention.

STEP 200: Organizing a nonvolatile memory into erasable blocks of memory units, each memory unit for storing a logical unit of data, and each block also organized into one or more pages, with each page containing multiple memory units and being once programmable together after an erase.

STEP 210: Providing a first block for recording full page by full page update versions of logical units of data.

STEP 220: Providing a second block for buffering update versions of logical units of data received from a host.

STEP 232: Receiving data in logical units from a host

Figure 39:
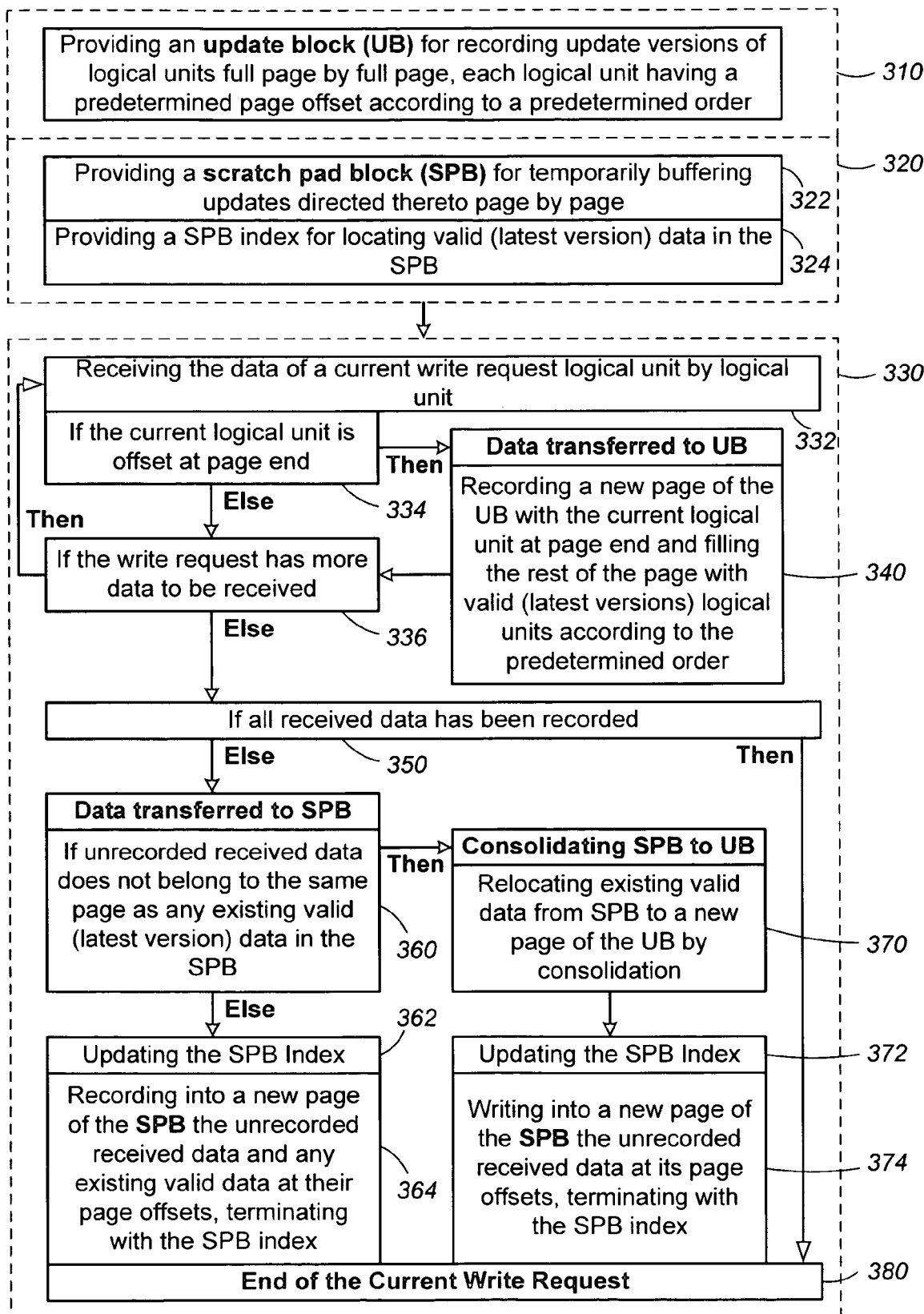
FIG. 39 is a flowchart illustrating a more specific implementation of the method of FIG. 37 employing a scratch pad block and an update block.

STEP 234: Parsing the received logical units page by page by locating any logical units with a page-end offset;

STEP 236: Recording each of the logical units having a page-end offset to a new page in the first block while filling the new page with latest versions of preceding logical units, and recording any remaining received logical units in a partial page in the second block FIG. 39 is a flowchart illustrating a more specific implementation of the method of FIG. 37 employing a scratch pad block and an update block.

STEP 310: Providing an update block (UB) for recording update versions of logical units, full page by full page, each logical unit having a predetermined page offset according to a predetermined order.

STEP 322: Providing a scratch pad block (SPB) for temporarily buffering updates directed thereto page by page.

STEP 324: Providing a SPBI index for locating valid (latest version) data in the SPB.

STEP 332: Receiving the data of a current write request logical unit by logical unit.

STEP 334: If the current logical unit is offset at page end, then proceed to STEP 340, otherwise proceed to STEP 336.

STEP 336: If the write request has more data to be received, then proceed to STEP 332, otherwise proceed to STEP 350.

STEP 340: Recording a new page of the UB with the current logical unit at page end and filling the rest of the page with valid (latest versions) logical units according to the predetermined order. Proceed to STEP 336.

STEP 350: If all received data has been recorded, then proceed to STEP 180, otherwise proceed to STEP 360.

STEP 360: If unrecorded received data does not belong to the same page as any existing valid (latest version) data in the SPB, then proceed to STEP 370, otherwise proceed to STEP 362.

STEP 362: Updating the SPB Index.

STEP 364: Recording into a new page of the SPB the unrecorded received data and any existing valid data at their page offsets, terminating with the SPB index. Proceed to STEP 380.

STEP 370: Relocating existing valid data from current page of SPB to a new page of the UB by consolidation.

STEP 372: Updating the SPB Index.

STEP 374: Writing into a new page of the SPB the unrecorded received data at its page offsets, terminating with the SPB index.

STEP 380: End of the Current Write Request.

The SPB supports up to a predetermined number (e.g., 8) of update blocks. Partial page data in the SPB block is consolidated to the associated update block when the host writes the last sector of the page. Data may exist in more than one partial page in the SPB for a logical group at a given instance but in the preferred embodiment only the data for the last written partial page is valid. Similarly, multiple copies of a SPBI/CBI sector can exist in the SPB but only the last written copy is valid. By the same consideration, only the last write pointer is needed if the number of valid pages per UB in SPB is limited to one. When sectors need to be written to the SPB and the SPB is full, the block is first copied to a new SPB block and the old SPB is erased, after which the sectors are written to the new SPB. SPB is also written when SPBI/CBI needs to be updated because a sequential update block becomes chaotic, or because an update block, previously containing scratch pad data, is closed.

In general, as noted before, more than one SPB partial pages for each update block can be used to store valid data. In this way, the partial page need not be consolidated to make way for a new one if the next host writes sector outside of the page.

The multi-stream updating scheme allows a more efficient utilization of the update block. This is especially true for block with multi-sector pages that are once-writable. The scheme consumes less storage and requires less padding in the update block. More importantly, sequential order of update sectors in the update block is maintained during a series of separate host writes of sequential logical sectors.

Multi-stream Update with Predictive Pipelined Operation

In the multi-stream updating scheme described above, every time there is a host write, decision will have to be made as to recording the received host data either to the update block or the scratch pad block. The data units from the host could be monitored one by one as they are received until one with an end-page offset is received. At that point, the predetermined condition is confirmed for writing a full page, albeit with possible pre-padding.

In order to write to the update block, the page to be written need to be set up for programming. This involves addressing the page and then loading the data for the page to the data latches.

According to a preferred embodiment, a predictive pipelined operation is implemented in which, rather than waiting until the predetermined condition for recording to the update block is confirmed, the update block is set up to be written to as soon as the host write command indicates the predetermined condition is potentially satisfied by the data units intended to be written. In this way, the set up could have a jump start while waiting for the data units to come from the host. When the actual data units received eventually do satisfy the predetermined condition, programming of the page in the update block can take place immediately without have to wait for setup, thereby improving write performance. In the event that the host write was interrupted and the actual data units received no longer satisfy the predetermined condition, the setup for recording to the update block will be abandoned, and instead the data units will be recorded to the scratch pad block.

Figure 40A:
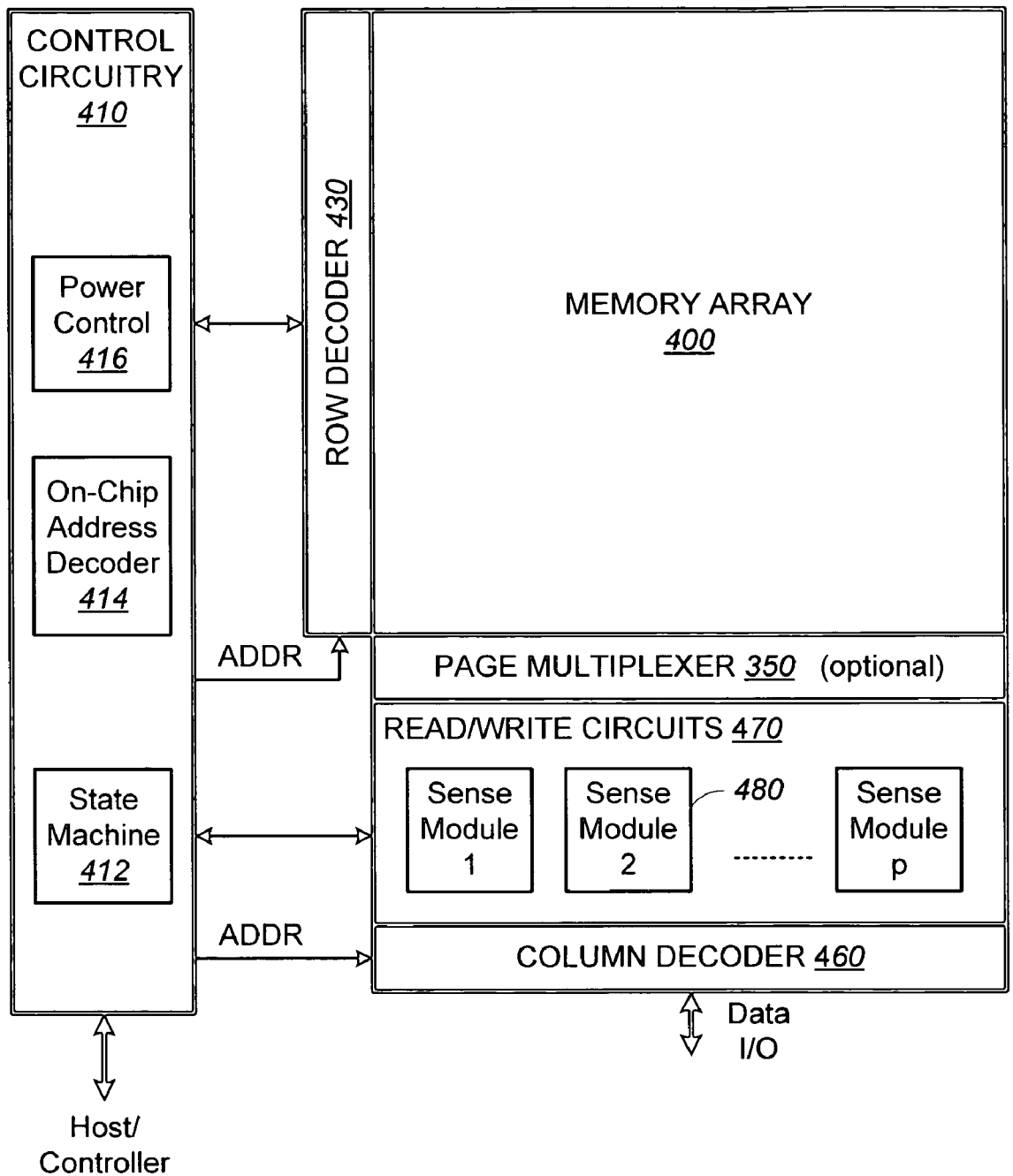
FIG. 40A illustrates schematically a memory device having a bank of read/write circuits, which provides the context in which the present invention is implemented.

FIG. 40A illustrates schematically a memory device having a bank of read/write circuits, which provides the context in which the present invention is implemented. The memory device includes a two-dimensional array of memory cells 400, control circuitry 410, and read/write circuits 470. The memory array 400 is addressable by word lines via a row decoder 430 and by bit lines via a column decoder 460. The read/write circuits 470 is implemented as a bank of sense modules 480 (not shown) and allows a group (also referred to as a "page") of memory cells to be read or programmed in parallel. An entire bank of p sense modules 480 operating in parallel allows a page of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Thus, in a preferred embodiment, a page is constituted from a contiguous row of memory cells. In another embodiment, where a row of memory cells are partitioned into multiple pages, a page multiplexer 350 is provided to multiplex the read/write circuits 470 to the individual pages.

The control circuitry 410 cooperates with the read/write circuits 470 to perform memory operations on the memory array 400. The control circuitry 410 includes a state machine 412, an on-chip address decoder 414 and a power control module 416. The state machine 412 provides chip level control of memory operations. The on-chip address decoder 414 provides an address interface between that used by the host or a memory controller to the hardware address used by the decoders 330 and 370. The power control module 416 controls the power and voltages supplied to the word lines and bit lines during memory operations.

Figure 40B:
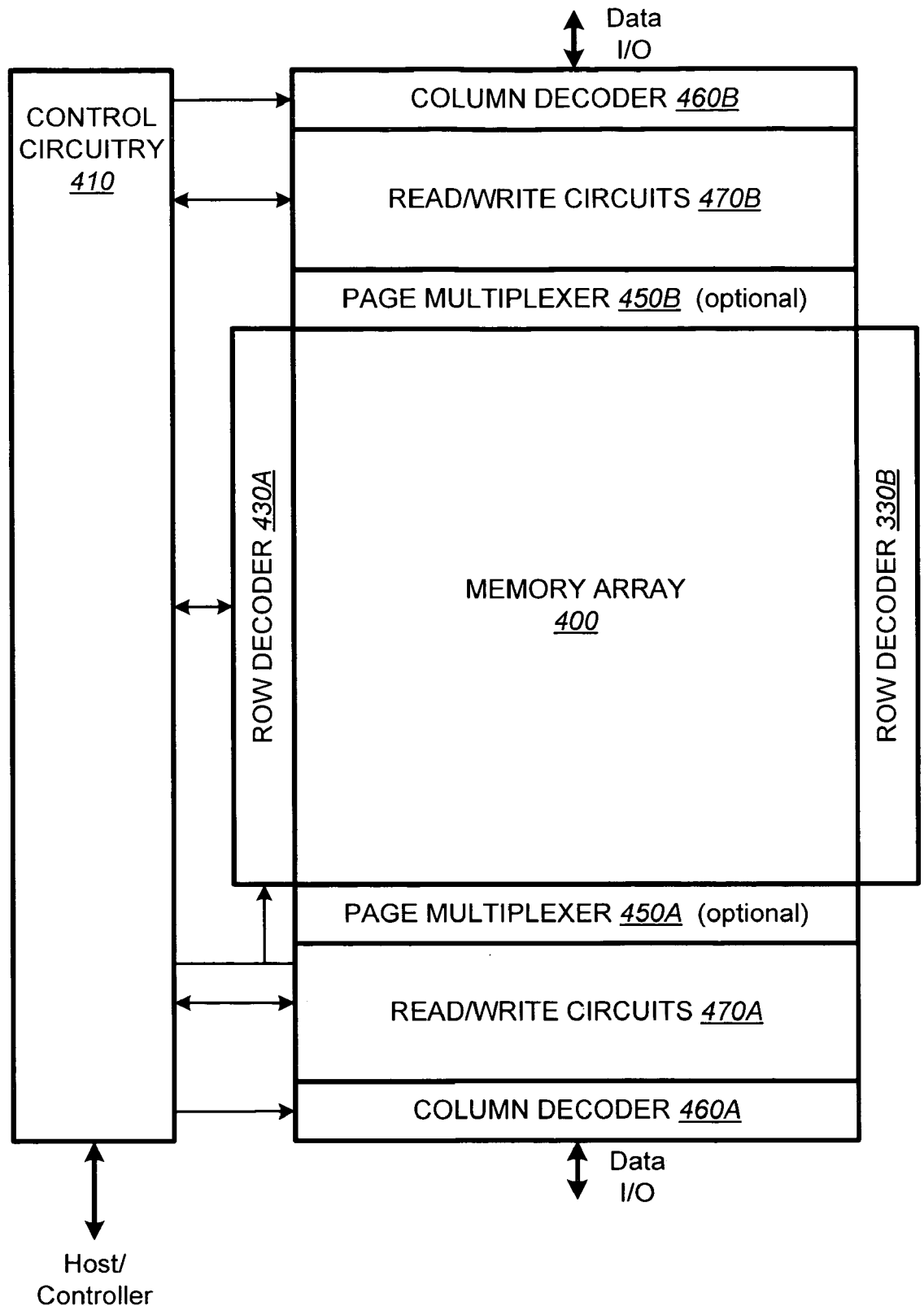
FIG. 40B illustrates a preferred arrangement of the memory device shown in FIG. 40A.

FIG. 40B illustrates a preferred arrangement of the memory device shown in FIG. 40A. Access to the memory array 400 by the various peripheral circuits is implemented in a symmetric fashion, on opposite sides of the array so that access lines and circuitry on each side are reduced in half. Thus, the row decoder is split into row decoders 430A and 430B and the column decoder into column decoders 460A and 460B. In the embodiment where a row of memory cells are partitioned into multiple blocks, the page multiplexer 450 is split into page multiplexers 450A and 450B. Similarly, the read/write circuits are split into read/write circuits 470A connecting to bit lines from the bottom and read/write circuits 470B connecting to bit lines from the top of the array 400. In this way, the density of the read/write modules, and therefore that of the bank of sense modules 480, is essentially reduced by one half. Data directed to the read/write modules located at the top of the array will be transferred via the I/O at the top. Similarly, data directed to the read/write modules located at the bottom of the array will be transferred via the I/O at the bottom.

Figure 41:
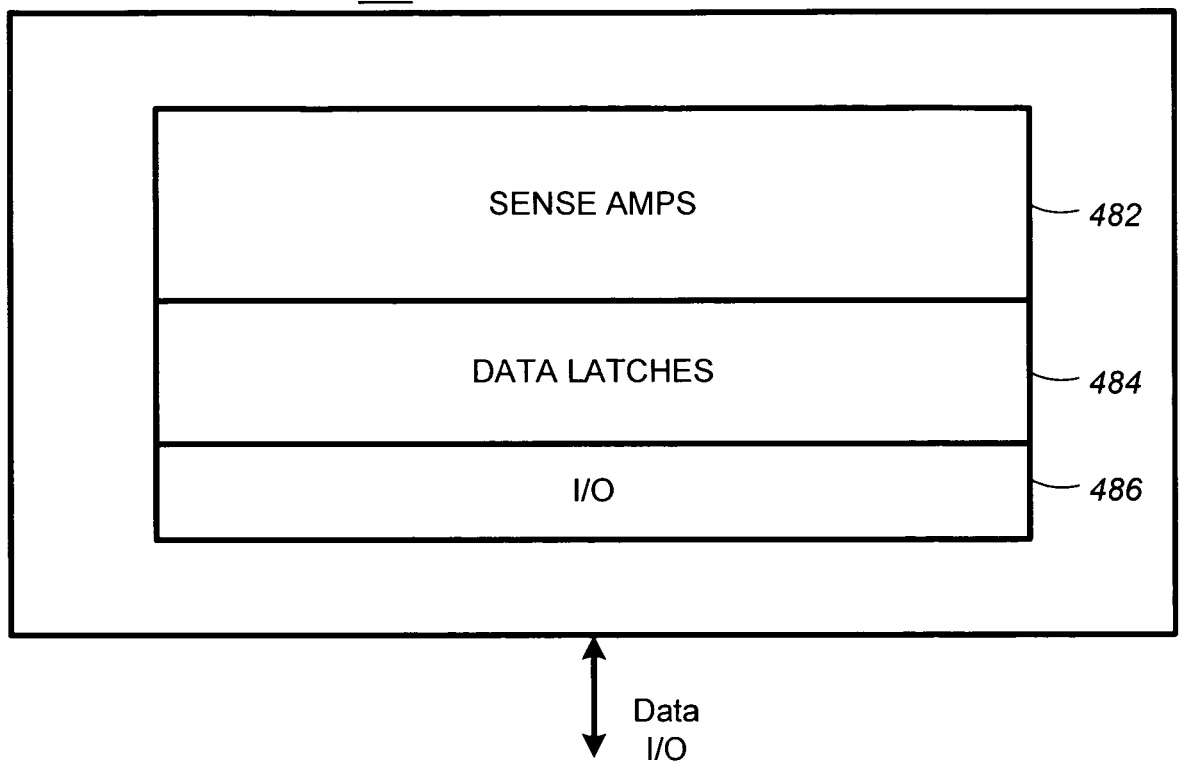
FIG. 41 illustrates in more detail the sense module shown in FIG. 40A.

FIG. 41 illustrates in more detail the sense module shown in FIG. 40A. Each sense module 480 essentially includes a sense amplifier 482 for sensing a conduction state of a memory cell, a set of data latches 484 for storing sensed data or data to be programmed, and an I/O circuit 486 for communicating with the external. A preferred sense amplifier is disclosed in United States Patent Publication No. 2004-0109357-A1, the entire disclosure of which is hereby incorporated herein by reference.

During a program operation, first, the selected word lines and bit lines are addressed. This is followed by transferring the data to be program via an I/O port to the respective data latches. Then bit lines are precharged before programming commences with the application of programming voltages to the word lines. The steps preceding the actual application of the programming voltage can be regarded as program setup. When the page size is substantial, so will the time needed to transfer the program data into the data latches.

During a host write, the host first sends a host write command indicating to the memory device the range of data units it intends to write. This is then followed by transmission of data units in the range, data unit by data unit until the end of the range is reached. Depending on protocol, it is possible that the transmission may be interrupted unexpectedly and the remaining data units be sent in a new write command.

To improve write performance, it would be desirable to have a pipeline operation where the program setup process can take place while data units are still being received. However, in a multi-stream scheme where data units could be recorded to any of the multiple storages depending on whether certain data units are received, the addressing to record to a given storage would not be certain until those certain data units are actually received without interruptions.

To overcome this problem, a predictive pipelining scheme is employed. If those certain data units that cause a recording to a given storage are found within the range indicated by the host write command, the given storage will immediately be set up for programming. When those certain data units are actually received, the given storage will be in a position to program the data units without the delay due to program setup. On the other hand, if those certain data units fail to materialize due to interruptions, the program set for the given storage will be abandoned, and instead another storage will be selected for set up and subsequent programming.

Figure 42:
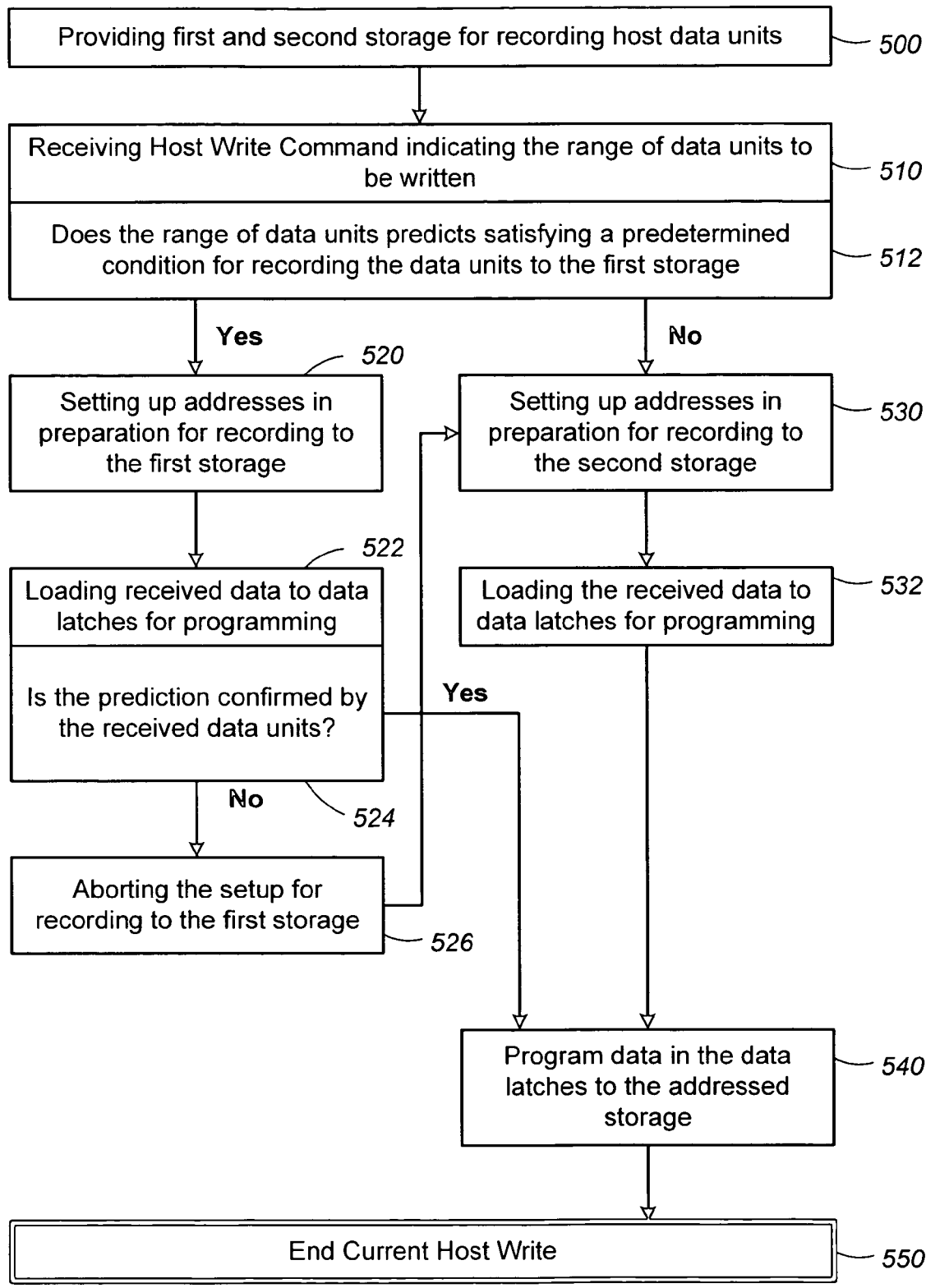
FIG. 42 is a flow diagram illustrating a multi-stream update employing a predictive pipelining scheme, according to a preferred embodiment.

FIG. 42 is a flow diagram illustrating a multi-stream update employing a predictive pipelining scheme, according to a preferred embodiment.

STEP 500: Providing first and second storage for recording host data units. For example, the first storage is an update block which is an erasable block dedicated to storing update data, and the second storage is a scratch pad block which is another erasable block for temporarily buffering update data in transit to the update block.

STEP 510: Receiving Host Write Command indicating the range of data units to be written.

STEP 512: If the range of data units contains ones that satisfies a predetermined condition for recording the data units to the first storage, proceeding to STEP 520, otherwise proceeding to STEP 530. For example, the erasable block is organized into pages, each page capable of storing multiple data units that are programmable together. The data units are stored in a page in a logically sequential order so that each data unit has a predetermined page offset. The predetermined condition for recording to the update block is when a full page can be recorded. A sufficient condition is when a data unit with an end-page offset exists, where a full page is formed by pre-padding any preceding data unit in the page if necessary. If the predetermined condition is not satisfied, the host data will be recorded to the scratch pad block.

STEP 520: Setting up addresses in preparation for recording to the first storage. For example, if the range includes a data unit with an end-page offset, a full page will be assumed to be recorded to the update block. In which case, a new page in the update block will be addressed for recording.

STEP 522: Loading the data latches with received data in preparation for recording to the first storage. As soon as data units are received from the host, they will be loaded to the data latches for programming a new page.

STEP 524: If the data units that satisfied the predetermined condition are actually received, proceeding to STEP 540, otherwise proceeding to STEP 526. For example, when the data unit with an end-page offset is actually received from the host, the predicted full page can definitely be formed.

STEP 526: Aborting the setup to record to the first storage. Proceeding to STEP 530. For example, if the expected data unit with an end-page offset never arrives due to interruptions, the prediction for a full page to be recorded to the update block is no longer true. In that case, the program setup for the update block will have to be abandoned. Instead, the scratch pad block will now be set up for programming.

STEP 530: Setting up addresses in preparation for recording to the second storage. For example, when the predetermined condition for record a full page to the update block is not satisfied, the host data will be recorded to the scratch pad block. In which case, a new page in the scratch pad block will be addressed for recording.

STEP 532: Loading the data latches with received data in preparation for recording to the second storage. As soon as data units are received from the host, they will be loaded to the data latches for programming a new page.

STEP 540: Program the data in the data latches to the addressed storage. For example, when the predicted recording to the update block or to the scratch pad block is confirmed by the data units received, the setup block can be programmed without delay.

STEP 550: Ending Current Host Write.

Depending on memory architecture, the STEP 520 and 530 may be in different order, such as the addresses may be selected after the loading of the data latches in STEP 522 or STEP 532.

In another preferred embodiment, as data is being received and when there is initially uncertainty in recording the received data whether to the first or second storage, the received data is loaded to the data latches of the programming circuits for both first and second storage. In this way, the data will always be immediately available for programming either the first or second storage. In a special case, the first and second storages share the same set of data latches. For example, when first and second storages are in the same memory plane, they could be served by the same set -of programming circuits with the same set of sense amplifiers and data latches. In that case, data will be loaded to a set of default data latches irrespective of whether first or second storage is to be programmed.

In the case where the first and second storages are served by different sets of data latches, as for example in the cases of being in different memory pages of the same plane or in different memory planes, the data could be loaded to both sets of data latches.

Figure 43:
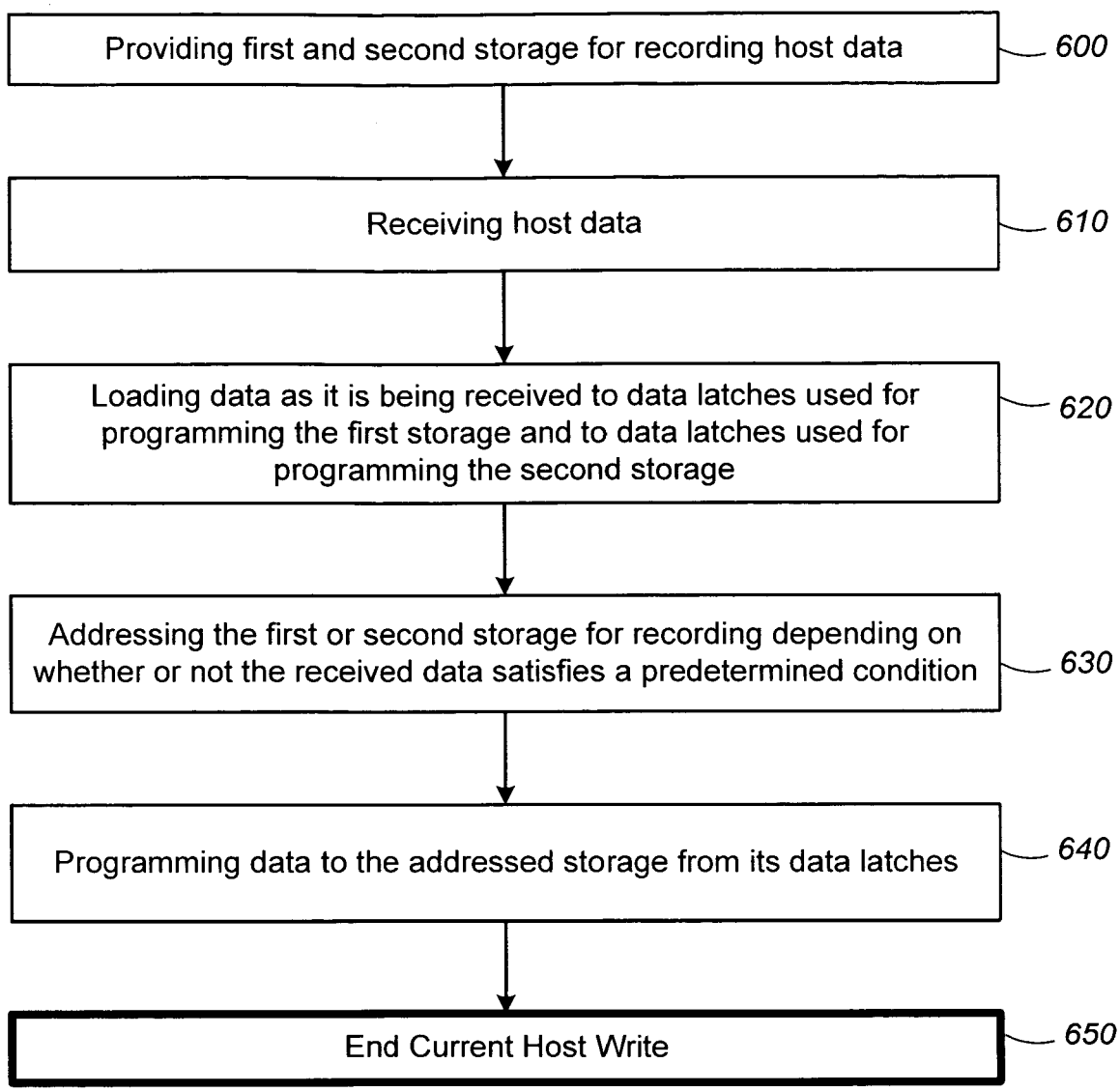
FIG. 43 is a flow diagram illustrating a multi-stream update in which the program data is loaded before the correct destination address is sent, according to another embodiment.

FIG. 43 is a flow diagram illustrating a multi-stream update in which the program data is loaded before the correct destination address is sent, according to another embodiment.

STEP 600: Providing first and second storage for recording host data units.

STEP 610: Receiving host data.

STEP 620: Loading data as it is being received to data latches used for programming the first storage and to data latches used for programming the second storage.

STEP 630: Addressing the first or the second storage for recording depending on whether or not the received data satisfies a predetermined condition.

STEP 640: Programming data to the addressed storage from its data latches.

STEP 650: End Current Host Write.

Although the invention has been described with respect to various exemplary embodiments, it will be understood that the invention is entitled to protection within the full scope of the appended claims.

It is claimed:

1. A method of recording data units from a host comprising:
   providing first and second nonvolatile storages;
   receiving a host write command that indicates the data units to be written;
   setting up either the first or second storage for recording depending on whether or not a predetermined condition is satisfied based on the data units to be written;
   sending the data units to the storage being set up as the data units are received from the host; and
   recording the data units to the set up storage when the predetermined condition is confirmed based on the data units received, otherwise setting up the second storage if not already set up, and recording the data units received to the second storage.

2. A method as in claim 1, wherein said setting up includes addressing the selected storage.

3. A method as in claim 1, wherein said sending the data units to the storage includes sending the data units to a set of data latches for programming the selected storage.

4. A method as in claim 1, further comprising:
   organizing the data into data units having a predetermined order; and
   organizing the first and second nonvolatile storages into pages, each page for programming together multiple data units having predetermined page offsets; and
   wherein:
   said predetermined condition is when one of the data units has a page-end offset; and
   said recording the data to the first storage includes recording to a page of the first storage said page-end data unit and any preceding data units in the page.

5. A method as in claim 4, wherein each of the first and second storages is for storing a block of memory units that are erasable together.

6. A method as in claim 4, wherein:
   said data from the host is update data for a group of data units;
   said first storage is for storing said update data; and
   said second storage is for buffering said update data before being transferred to the first storage.

7. A method as in claim 4, further comprising:
   organizing the data into data units having a predetermined order; and
   organizing the first and second nonvolatile storages into pages, each page for programming together multiple data units having predetermined page offsets.

8. A method as in claim 7, wherein each page is once-programmable after an erase.

9. A method as in claim 7, wherein:
   said recording data to the second storage includes recording to a page thereof at least one index of the data stored in the second storage.

10. A method as in claim 9, wherein said at least one index of the data stored in the second storage is recorded to a location of said page having a page-end offset.

11. A method as in claim 7, wherein:
    said recording data to the second storage includes recording to a page thereof at least one index of the data stored in the first and second storages.

12. A method as in claim 11, wherein said at least one index of the data stored in the first and second storages is recorded to a location of said page having a page-end offset.

13. A method as in claim 7, wherein:
    said recording data to the second storage includes recording to a page thereof a pointer pointing to the next recording location of the first storage.

14. A method as in claim 13, wherein said pointer is recorded to a location of a page having said page-end offset.

15. A method as in any one of claims 1-14, wherein the first and second nonvolatile storages are constituted from memory cells that individually store one bit of data.

16. A method as in any one of claims 1-14, wherein said first and second nonvolatile storages are constituted from memory cells that individually store more than one bit of data.

17. A nonvolatile memory comprising:
    a memory organized into a plurality of blocks, each block being a plurality of memory units that are erasable together, each memory unit for storing a logical unit of data;
    a controller for controlling operations of said blocks;
    first and second blocks, each for recording data from a host;
    a buffer for receiving the data from the host; and said controller setting up either the first or second storage for recording depending on whether or not a predetermined condition is satisfied based on the data units to be written; and sending the data units to the storage being set up as the data units are received from the host; and recording the data units to the set up storage when the predetermined condition is confirmed based on the data units received, otherwise setting up the second storage if not already set up, and recording the data units received to the second storage.

18. A nonvolatile memory as in claim 17, wherein said nonvolatile memory is in the form of a removable memory card.

19. A nonvolatile memory as in claim 17, wherein:
said data from the host is update data for a group of data units;
said first block is for storing said update data; and
said second block is for buffering said update data before being transferred to the first block.

20. A nonvolatile memory as in claim 17, wherein:
the data is organized into data units having a predetermined order; and
said first and second blocks are organized into pages, each page for programming together multiple data units having predetermined page offsets.

21. A nonvolatile memory as in claim 20, wherein each page is once-programmable after an erase.

22. A nonvolatile memory as in claim 17, wherein:
said predetermined condition is when one of the received data units has a page-end offset; and
said controller controlling recording the data to said first block includes recording to a page of said first block said page-end data unit and any preceding data units in the page.

23. A nonvolatile memory as in claim 17, wherein:
said controller controlling recording the data to said second storage includes recording to a page thereof at least one index of the data stored in the second storage.

24. A nonvolatile memory as in claim 23, wherein said at least one index of the data stored in the second storage is recorded to a location of said page having a page-end offset.

25. A nonvolatile memory as in claim 17, wherein:
said controller controlling recording the data to said second storage includes recording to a page thereof at least one index of the data stored in the first and second storages.

26. A nonvolatile memory as in claim 25, wherein said at least one index of the data stored in the first and second storages is recorded to a location of said page having a page-end offset.

27. A nonvolatile memory as in claim 17, wherein:
said controller controlling recording the data to said second storage includes recording to a page thereof a pointer pointing to the next recording location of the first storage.

28. A nonvolatile memory as in claim 27, wherein said pointer is recorded to a location of a page having said page-end offset.

29. A nonvolatile memory comprising:
a memory organized into a plurality of blocks, each block being a plurality of memory units that are erasable together, each memory unit for storing a logical unit of data;
a controller for controlling operations of said blocks;
first and second blocks, each for sequentially recording data from a host;
a buffer for receiving the data from the host; and means for controlling either recording of the data to said first block when a predetermined condition is satisfied, or recording of the data to said second block when the predetermined condition is not satisfied.

30. A nonvolatile memory as in any one of claims 17-29, wherein the first and second nonvolatile storages are constituted from memory cells that individually store one bit of data.

31. A nonvolatile memory as in any one of claims 17-29, wherein said first and second nonvolatile storages are constituted from memory cells that individually store more than one bit of data.

32. A method of recording data from a host comprising:
providing first and second nonvolatile storages;
receiving the data from the host;
loading the data as it is being received to a set of data latches for programming the first storage and to a set of data latches for programming the second storage;
addressing either the first or second storage depending on whether or not a predetermined condition is satisfied based on the data received; and
recording the data to the addressed storage from its set of data latches.

33. A method as in claim 32, wherein said set of data latches for programming the first storage is identical to that for programming the second storage.

34. A method as in claim 32, further comprising:
organizing the data into data units having a predetermined order; and
organizing the first and second nonvolatile storages into pages, each page for programming together multiple data units having predetermined page offsets; and wherein:
said predetermined condition is when one of the data units has a page-end offset; and
said recording the data to the first storage includes recording to a page of the first storage said page-end data unit and any preceding data units in the page.

35. A method as in claim 34, wherein each of the first and second storages is for storing a block of memory units that are erasable together.

36. A method as in claim 34, wherein:
said data from the host is update data for a group of data units;
said first storage is for storing said update data; and
said second storage is for buffering said update data before being transferred to the first storage.

37. A method as in claim 34, further comprising:
organizing the data into data units having a predetermined order; and
organizing the first and second nonvolatile storages into pages, each page for programming together multiple data units having predetermined page offsets.

38. A method as in claim 37, wherein each page is once-programmable after an erase.

39. A method as in claim 37, wherein:
said recording data to the second storage includes recording to a page thereof at least one index of the data stored in the second storage.

40. A method as in claim 39, wherein said at least one index of the data stored in the second storage is recorded to a location of said page having a page-end offset.

41. A method as in claim 37, wherein:
said recording data to the second storage includes recording to a page thereof at least one index of the data stored in the first and second storages.

42. A method as in claim 41, wherein said at least one index of the data stored in the first and second storages is recorded to a location of said page having a page-end offset.

43. A method as in claim 37, wherein:
said recording data to the second storage includes recording to a page thereof a pointer pointing to the next recording location of the first storage.

44. A method as in claim 43, wherein said pointer is recorded to a location of a page having said page-end offset.

45. A method as in any one of claims 32-44, wherein the first and second nonvolatile storages are constituted from memory cells that individually store one bit of data.

46. A method as in any one of claims 32-44, wherein said first and second nonvolatile storages are constituted from memory cells that individually store more than one bit of data.

47. A nonvolatile memory comprising:
a memory organized into a plurality of blocks, each block being a plurality of memory units that are erasable together, each memory unit for storing a logical unit of data;
a controller for controlling operations of said blocks;
first and second blocks, each for recording data from a host;
a buffer for receiving the data from the host; and
said controller controlling loading the data as it is being received to a set of data latches for programming the first storage and to a set of data latches for programming the second storage;
addressing either the first or second storage depending on whether or not a predetermined condition is satisfied based on the data received; and
programming the data to the addressed storage from its set of data latches.

48. A nonvolatile memory as in claim 47, wherein said nonvolatile memory is in the form of a removable memory card.

49. A nonvolatile memory as in claim 47, wherein:
said data from the host is update data for a group of data units;
said first block is for storing said update data; and
said second block is for buffering said update data before being transferred to the first block.

50. A nonvolatile memory as in claim 47, wherein:
the data is organized into data units having a predetermined order; and
said first and second blocks are organized into pages, each page for programming together multiple data units having predetermined page offsets.

51. A nonvolatile memory as in claim 49, wherein each page is once-programmable after an erase.

52. A nonvolatile memory as in claim 47, wherein:
said predetermined condition is when one of the received data units has a page-end offset; and
said controller controlling recording the data to said first block includes recording to a page of said first block said page-end data unit and any preceding data units in the page.

53. A nonvolatile memory as in claim 47, wherein:
said controller controlling recording the data to said second storage includes recording to a page thereof at least one index of the data stored in the second storage.

54. A nonvolatile memory as in claim 52, wherein said at least one index of the data stored in the second storage is recorded to a location of said page having a page-end offset.

55. A nonvolatile memory as in claim 47, wherein:
said controller controlling recording the data to said second storage includes recording to a page thereof at least one index of the data stored in the first and second storages.

56. A nonvolatile memory as in claim 54, wherein said at least one index of the data stored in the first and second storages is recorded to a location of said page having a page-end offset.

57. A nonvolatile memory as in claim 47, wherein:
said controller controlling recording the data to said second storage includes recording to a page thereof a pointer pointing to the next recording location of the first storage.

58. A nonvolatile memory as in claim 56, wherein said pointer is recorded to a location of a page having said page-end offset.

59. A nonvolatile memory comprising:
a memory organized into a plurality of blocks, each block being a plurality of memory units that are erasable together, each memory unit for storing a logical unit of data;
first and second blocks, each for sequentially recording data from a host;
a buffer for receiving the data from the host; and
means for loading the data as it is being received to a set of data latches for programming the first storage and to a set of data latches for programming the second storage;
means for addressing either the first or second storage depending on whether or not a predetermined condition is satisfied based on the data received; and
means for recording the data to the addressed storage from its set of data latches.

60. A nonvolatile memory as in any one of claims 47-59, wherein the first and second nonvolatile storages are constituted from memory cells that individually store one bit of data.

61. A nonvolatile memory as in any one of claims 47-59, wherein said first and second nonvolatile storages are constituted from memory cells that individually store more than one bit of data.

* * * * *